United States Patent
Yun et al.

(10) Patent No.: US 11,189,632 B2
(45) Date of Patent: Nov. 30, 2021

(54) INTEGRATED CIRCUIT DEVICES AND METHODS OF MANUFACTURING THE SAME

(71) Applicant: Samsung Electronics Co., Ltd., Suwon-si (KR)

(72) Inventors: Jang-Gn Yun, Hwaseong-si (KR); Jae-Duk Lee, Seongnam-si (KR); Jai-Hyuk Song, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/675,273

(22) Filed: Nov. 6, 2019

(65) Prior Publication Data
US 2020/0273501 A1 Aug. 27, 2020

(30) Foreign Application Priority Data
Feb. 22, 2019 (KR) .......................... 10-2019-0021288

(51) Int. Cl.
*H01L 27/11582* (2017.01)
*G11C 5/06* (2006.01)
(Continued)

(52) U.S. Cl.
CPC ........ *H01L 27/11582* (2013.01); *G11C 5/063* (2013.01); *H01L 23/5226* (2013.01);
(Continued)

(58) Field of Classification Search
CPC ........... H01L 27/0688; H01L 27/11273; H01L 27/1128; H01L 27/11521; H01L 27/11551;
(Continued)

(56) References Cited

U.S. PATENT DOCUMENTS 8,748,966 B2   6/2014   Whang et al.
9,263,596 B2   2/2016   Yoo
(Continued)

FOREIGN PATENT DOCUMENTS

JP   2011023586   2/2011

OTHER PUBLICATIONS

Yokoyama et al. "Low-temperature selective deposition of silicon on silicon nitride by time-modulated disilane flow and formation of silicon narrow wires" Applied Physics Letters, 79(4): 494-496 (2001).

*Primary Examiner* — Eduardo A Rodela
(74) *Attorney, Agent, or Firm* — Myers Bigel, P.A.

(57) ABSTRACT

Integrated circuit devices may include a plurality of word line structures and a plurality of insulating films that are stacked alternately. Sides of the plurality of word line structures and the plurality of insulating films define a side of a channel hole extending through the plurality of word line structures and the plurality of insulating films. The devices may also include a blocking dielectric film on the side of the channel hole, and a plurality of charge storage films on the blocking dielectric film and on the sides of the plurality of word line structures, respectively. Each of the plurality of charge storage films may include a first charge storage film and a second charge storage film sequentially (Continued)

stacked on a respective one of the sides of the plurality of word line structures. A surface of the second charge storage film may include a recess in a middle portion thereof.

20 Claims, 95 Drawing Sheets

(51) Int. Cl.
*H01L 27/11524* (2017.01)
*H01L 23/522* (2006.01)
*H01L 27/1157* (2017.01)
*H01L 27/11556* (2017.01)
*H01L 27/11568* (2017.01)

(52) U.S. Cl.
CPC .... *H01L 27/1157* (2013.01); *H01L 27/11524* (2013.01); *H01L 27/11556* (2013.01); *H01L 27/11568* (2013.01)

(58) Field of Classification Search
CPC ......... H01L 27/11553; H01L 27/11556; H01L 27/11563; H01L 27/11568; H01L 27/11578; H01L 27/1158; H01L 27/11582; H01L 27/11524; H01L 23/5226; H01L 27/1157; H01L 29/40117; H01L 29/40114; H01L 27/11573; H01L 27/11575; G11C 5/063; G11C 7/02
See application file for complete search history.

(56) References Cited

U.S. PATENT DOCUMENTS

| | | | |
|---|---|---|---|
| 9,362,303 B2 | 6/2016 | Lee et al. | |
| 9,589,980 B2 | 3/2017 | Hyun et al. | |
| 9,793,282 B2 | 10/2017 | Dennison et al. | |
| 9,865,616 B2 | 1/2018 | Shimizu et al. | |
| 9,978,767 B2 | 5/2018 | Yamashita | |
| 10,256,252 B1* | 4/2019 | Kanazawa | H01L 21/02164 |
| 10,700,078 B1* | 6/2020 | Cui | H01L 27/11575 |
| 10,700,090 B1* | 6/2020 | Cui | H01L 27/1157 |
| 2012/0077320 A1* | 3/2012 | Shim | H01L 27/11582 |
| | | | 438/269 |
| 2013/0307053 A1* | 11/2013 | Polishchuk | H01L 29/0649 |
| | | | 257/325 |
| 2015/0011063 A1 | 1/2015 | Hull et al. | |
| 2017/0243879 A1* | 8/2017 | Yu | H01L 27/1157 |
| 2017/0243945 A1 | 8/2017 | Sekine et al. | |
| 2018/0006041 A1 | 1/2018 | Xu et al. | |
| 2018/0006050 A1 | 1/2018 | Watanabe et al. | |
| 2018/0033799 A1 | 2/2018 | Kanamori et al. | |
| 2018/0090450 A1 | 3/2018 | Ito et al. | |
| 2019/0198509 A1* | 6/2019 | Kim | H01L 29/513 |
| 2020/0098785 A1* | 3/2020 | Kariya | H01L 27/11575 |

* cited by examiner

INTEGRATED CIRCUIT DEVICES AND METHODS OF MANUFACTURING THE SAME

CROSS-REFERENCE TO RELATED APPLICATION

This application claims the benefit of Korean Patent Application No. 10-2019-0021288, filed on Feb. 22, 2019, in the Korean Intellectual Property Office, the disclosure of which is incorporated herein in its entirety by reference.

BACKGROUND

The inventive concept relates to an integrated circuit device and a method of manufacturing the same, and more particularly, to an integrated circuit device including a non-volatile vertical memory device, and a method of manufacturing the same.

As the capacity and integration of integrated circuit devices increase, a vertical memory device has been proposed in which memory capacity is increased by stacking a plurality of memory cells on a substrate in a vertical direction. When a cell stacking density in the vertical direction is increased in the vertical memory device, the vertical height of each memory cell and the interval between memory cells that are adjacent to each other in the vertical direction decrease. Accordingly, a sufficient amount of charges may not be stored in the memory cell or interference may be generated between adjacent memory cells, and thus, the reliability of integrated circuit devices may deteriorate.

SUMMARY

The inventive concept provides an integrated circuit device capable of storing a sufficient amount of charges in each memory cell and having a structure capable of reducing interference between adjacent memory cells and improving reliability, even when the vertical height of each memory cell and the interval between memory cells adjacent to each other in a vertical direction are relatively small in a highly scaled vertical memory device, and a method of manufacturing the same.

According to an aspect of the inventive concept, there is provided an integrated circuit device including a plurality of word line structures extending on a substrate in a horizontal direction that is parallel to a main surface of the substrate and overlapping with each other in a vertical direction that is perpendicular to the main surface of the substrate and a plurality of insulating films stacked alternately with the plurality of word line structures in the vertical direction and extending in the horizontal direction, wherein sides of the plurality of word line structures and sides of the plurality of insulating films define a side of a channel hole that extends through the plurality of word line structures and the plurality of insulating films, a blocking dielectric film extending on the side of the channel hole, and a plurality of charge storage films spaced apart from each other on the blocking dielectric film in the channel hole, and on the sides of the plurality of word line structures, respectively, each of the plurality of charge storage films including a first charge storage film and a second charge storage film sequentially stacked on a respective one of the sides of the plurality of word line structures. The second charge storage film include a first surface facing the blocking dielectric film and a second surface opposite the first surface, and the second surface of the second charge storage film include a recess in a middle portion thereof in the vertical direction.

According to another aspect of the inventive concept, there is provided an integrated circuit device including a plurality of word line structures extending on a substrate in a horizontal direction that is parallel to a main surface of the substrate and overlapping with each other in a vertical direction that is perpendicular to the main surface, a plurality of insulating films stacked alternately with the plurality of word line structures in the vertical direction and extending in the horizontal direction, wherein sides of the plurality of word line structures and sides of the plurality of insulating films define a side of a channel hole that extends through the plurality of word line structures and the plurality of insulating films, a channel film extending in the vertical direction in the channel hole, a blocking dielectric film in the channel hole and extending on the sides of the plurality of word line structures and the sides of the plurality of insulating films in the channel hole, the blocking dielectric film including a surface facing the channel film, and the surface including a plurality of grooves on the sides of the plurality of word line structures, respectively, and a plurality of charge storage films, wherein at least a portion of each of the plurality of charge storage films is in a respective one of the plurality of grooves of the blocking dielectric film.

According to another aspect of the inventive concept, there is provided an integrated circuit device including a plurality of word line structures extending on a substrate in a horizontal direction that is parallel to a main surface of the substrate and overlapping with each other in a vertical direction that is perpendicular to the main surface, a plurality of insulating films stacked alternately with the plurality of word line structures in the vertical direction and extending in the horizontal direction, wherein sides of the plurality of word line structures and sides of the plurality of insulating films define a side of a channel hole that extends through the plurality of word line structures and the plurality of insulating films, a channel film extending in the vertical direction in the channel hole, a blocking dielectric film extending on the sides of the plurality of word line structures and the sides of the plurality of insulating films in the channel hole, at least one charge storage film on the blocking dielectric film in the channel hole, and a tunneling dielectric film extending on the blocking dielectric film and the at least one charge storage film in the channel hole, and a channel film extending on the tunneling dielectric film. The side of each of the plurality of insulating films facing the channel film protrudes toward the channel film beyond the side of each of the plurality of word line structures, a surface of the blocking dielectric film facing the channel film include a plurality of grooves on the sides of the plurality of word line structures, respectively, and at least a portion of the at least one charge storage film is in one of the plurality of grooves of the blocking dielectric film.

According to another aspect of the inventive concept, there is provided a method of manufacturing an integrated circuit device, which includes forming, on a substrate, a structure including a plurality of first films and a plurality of second films alternately stacked with the plurality of first films, forming a channel hole that extends through the structure, forming, in the channel hole, a plurality of indented spaces by removing portions of the plurality of second films through the channel hole, forming a blocking dielectric film on the plurality of first films and the plurality of second films in the channel hole, the blocking dielectric film including a plurality of grooves on the plurality of indented spaces, respectively, and forming at least one charge storage film including a first charge storage film in one of the plurality of grooves and a second charge storage film on the first charge storage film.

According to another aspect of the inventive concept, there is provided a method of manufacturing an integrated circuit device, which includes forming, on a substrate, a structure including a plurality of first films and a plurality of second films alternately stacked with the plurality of first films, forming a channel hole that extends through the structure, forming, in the channel hole, a plurality of indented spaces by removing portions of the plurality of second films through the channel hole, forming a blocking dielectric film including a plurality of first grooves on the plurality of indented spaces, respectively, in the channel hole, forming a preliminary charge storage film on the blocking dielectric film in the channel hole, the preliminary charge storage film including a plurality of second grooves on the plurality of first grooves, respectively, forming a plurality of mask pattern layers, each of the plurality of mask pattern layers including a first mask pattern in a respective one of the plurality of second grooves and a second mask pattern on the first mask pattern, and forming at least one charge storage film by etching the preliminary charge storage film using the plurality of mask pattern layers as an etch mask.

According to another aspect of the inventive concept, there is provided a method of manufacturing an integrated circuit device, which includes forming, on a substrate, a structure including a plurality of first films and a plurality of second films alternately stacked with the plurality of first films, forming a channel hole that extends through the structure, forming, in the channel hole, a plurality of indented spaces by removing portions of the plurality of first films through the channel hole, forming, in the channel hole, a blocking dielectric film including a plurality of first grooves that are on the plurality of indented spaces, respectively, a preliminary charge storage film including a plurality of second grooves that are on the plurality of first grooves, respectively, and a first cover sacrificial layer including a plurality of third grooves that are on the plurality of second grooves, respectively, a plurality of first cover layers in the plurality of third grooves, respectively, and a second cover layer on the first cover sacrificial layer, exposing portions of the first cover sacrificial layer by removing the plurality of first cover layers, forming a third cover layer including a first recess space that exposes one of the plurality of second grooves by removing one of the portions of the first cover sacrificial layer, and forming at least one charge storage film by removing a portion of the preliminary charge storage film through the first recess space.

According to another aspect of the inventive concept, there is provided a method of manufacturing an integrated circuit device, which includes forming, on a substrate, a structure including a plurality of insulating films and a plurality of sacrificial films alternately stacked with the plurality of insulating films, forming a channel hole that extends through the structure, removing portions of the plurality of insulating films through the channel hole to form sides of the plurality of insulating films recessed relative to sides the plurality of sacrificial films, forming a blocking dielectric film on the sides of the plurality of insulating films and the sides of the plurality of sacrificial films and a preliminary charge storage film on the blocking dielectric film in the channel hole, forming a first cover sacrificial layer on the preliminary charge storage film in the channel hole, the first cover sacrificial layer including a plurality of grooves on the sides of the plurality of insulating films, respectively, forming a plurality of first cover layers that expose portions of the preliminary charge storage film by removing portions of the first cover sacrificial layer adjacent to the plurality of grooves, and forming at least one charge trap film by removing at least one of the portions of the preliminary charge storage film using the plurality of first cover layers as an etch mask.

According to another aspect of the inventive concept, there is provided a method of manufacturing an integrated circuit device, which includes forming, on a substrate, a structure including a plurality of insulating films and a plurality of sacrificial films alternately stacked with the plurality of insulating films, forming a channel hole that extends through the structure, the channel hole exposing sides of the plurality of insulating films and sides of the plurality of insulating films, removing portions of the plurality of insulating films through the channel hole, forming a blocking dielectric film on the sides of the plurality of insulating films and the sides of the plurality of sacrificial films in the channel hole, forming a preliminary charge storage film on the blocking dielectric film in the channel hole, forming a first cover layer on the preliminary charge storage film and a second cover layer on the first cover layer in the channel hole, the first cover layer including a recess on the side of one of the plurality of insulating films, forming at least one charge storage film by removing a portion of the preliminary charge storage film, through the recess, and replacing the plurality of sacrificial films with a plurality of word line structures.

According to another aspect of the inventive concept, there is provided a method of manufacturing an integrated circuit device, which includes forming, on a substrate, a structure including a plurality of first films and a plurality of second films alternately stacked with the plurality of first films, forming a channel hole that extends through the structure, forming, in the channel hole, a plurality of indented spaces by removing portions of the plurality of first films through the channel hole, and forming a blocking dielectric film on the plurality of first films and the plurality of second films in the channel hole, and forming a charge storage film on the blocking dielectric film. A round portion is formed at a corner of each of the plurality of second films exposed in the channel hole.

According to another aspect of the inventive concept, there is provided an integrated circuit device including a structure including a plurality of first films and a plurality of second films that are alternately stacked on a substrate, wherein sides of the plurality of first films and sides of the plurality of second films define a side of a channel hole that extends through the plurality of first films and the plurality of second films and extends to the substrate, and a blocking dielectric film on the plurality of first films and the plurality of second films, a tunneling dielectric film on the blocking dielectric film, and a charge storage layer between the blocking dielectric film and the tunneling dielectric film. The plurality of second films protrude toward the blocking dielectric film beyond the sides of the plurality of first films, and a corner of each of the plurality of second films covered by the blocking dielectric film has a round shape.

BRIEF DESCRIPTION OF THE DRAWINGS

Embodiments of the inventive concept will be more clearly understood from the following detailed description taken in conjunction with the accompanying drawings in which:

FIG. 21 is a cross-sectional view of the integrated circuit device at a position corresponding to the line X1-X1' of FIG. 2;

DETAILED DESCRIPTION

Figure 1:
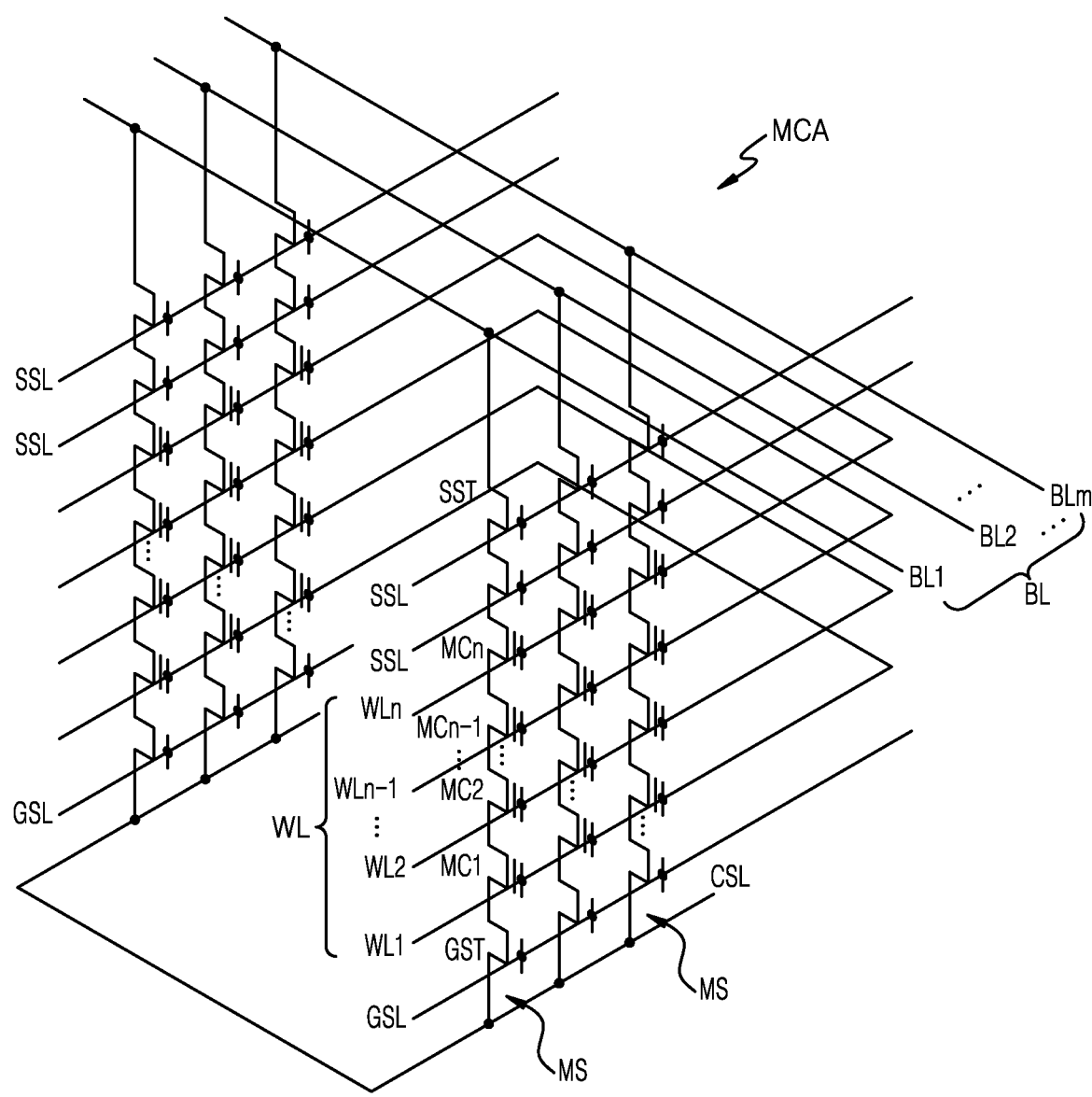
FIG. 1 is an equivalent circuit diagram of a memory cell array of an integrated circuit device according to some embodiments of the present inventive concept.

FIG. 1 is an equivalent circuit diagram of a memory cell array of an integrated circuit device according to some embodiments of the present inventive concept. Specifically, FIG. 1 is an equivalent circuit diagram of a vertical NAND flash memory device having a vertical channel structure.

Referring to FIG. 1, a memory cell array MCA may include a plurality of memory cell strings MS. The memory cell array MCA may include a plurality of bit lines BL (BL1, BL2, . . . , and BLm), a plurality of word lines WL (WL1, WL2, WLn-1, and WLn), at least one string selection line SSL, at least one ground selection line GSL, and a common source line CSL. The memory cell strings MS may be formed between the bit lines BL (BL1, BL2, and BLm) and the common source line CSL.

Each of the memory cell strings MS may include a string selection transistor SST, a ground selection transistor GST, and a plurality of memory cell transistors MC1, MC2, . . . , MCn-1, and MCn. A drain region of the string selection transistor SST may be connected to the bit lines BL (BL1, BL2, . . . , and BLm), and a source region of the ground selection transistor GST may be connected to the common source line CSL. The common source line CSL may be a region to which a plurality of source regions of multiple ground selection transistors GST are commonly connected.

The string selection transistor SST may be connected to the string selection line SSL, and the ground selection transistor GST may be connected to the ground selection line GSL. The memory cell transistors MC1, MC2, . . . , MCn-1, and MCn may be connected to the word lines WL (WL1, WL2, . . . , WLn-1, and WLn), respectively.

Figure 2:
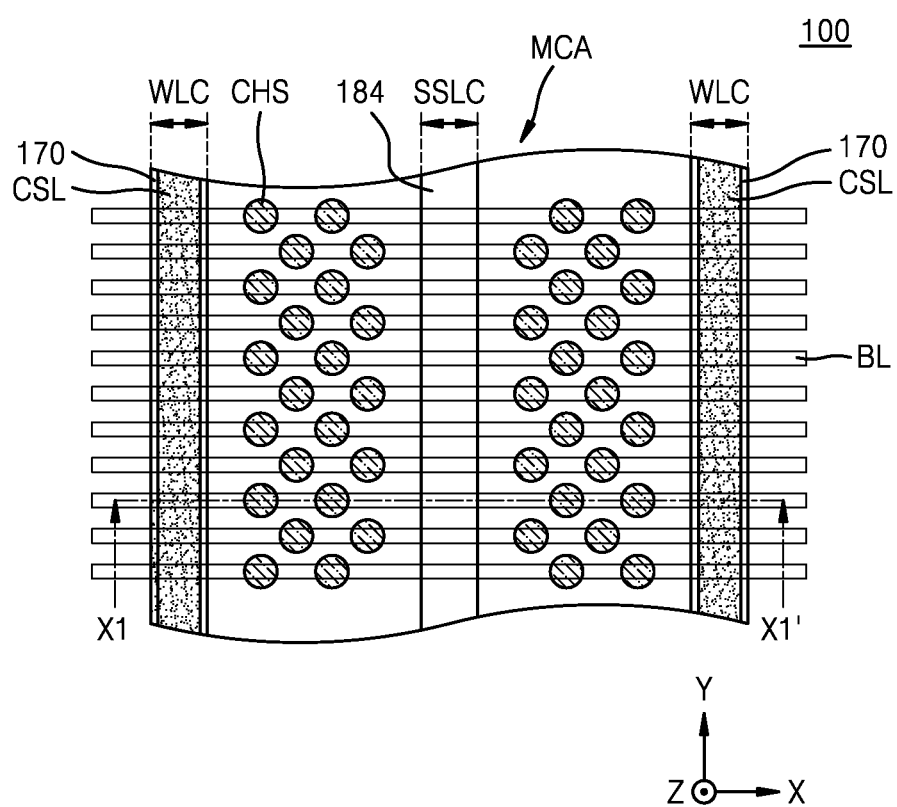
FIG. 2 is a plan view of main constituent elements of an integrated circuit device according to some embodiments of the present inventive concept.
Figure 3:
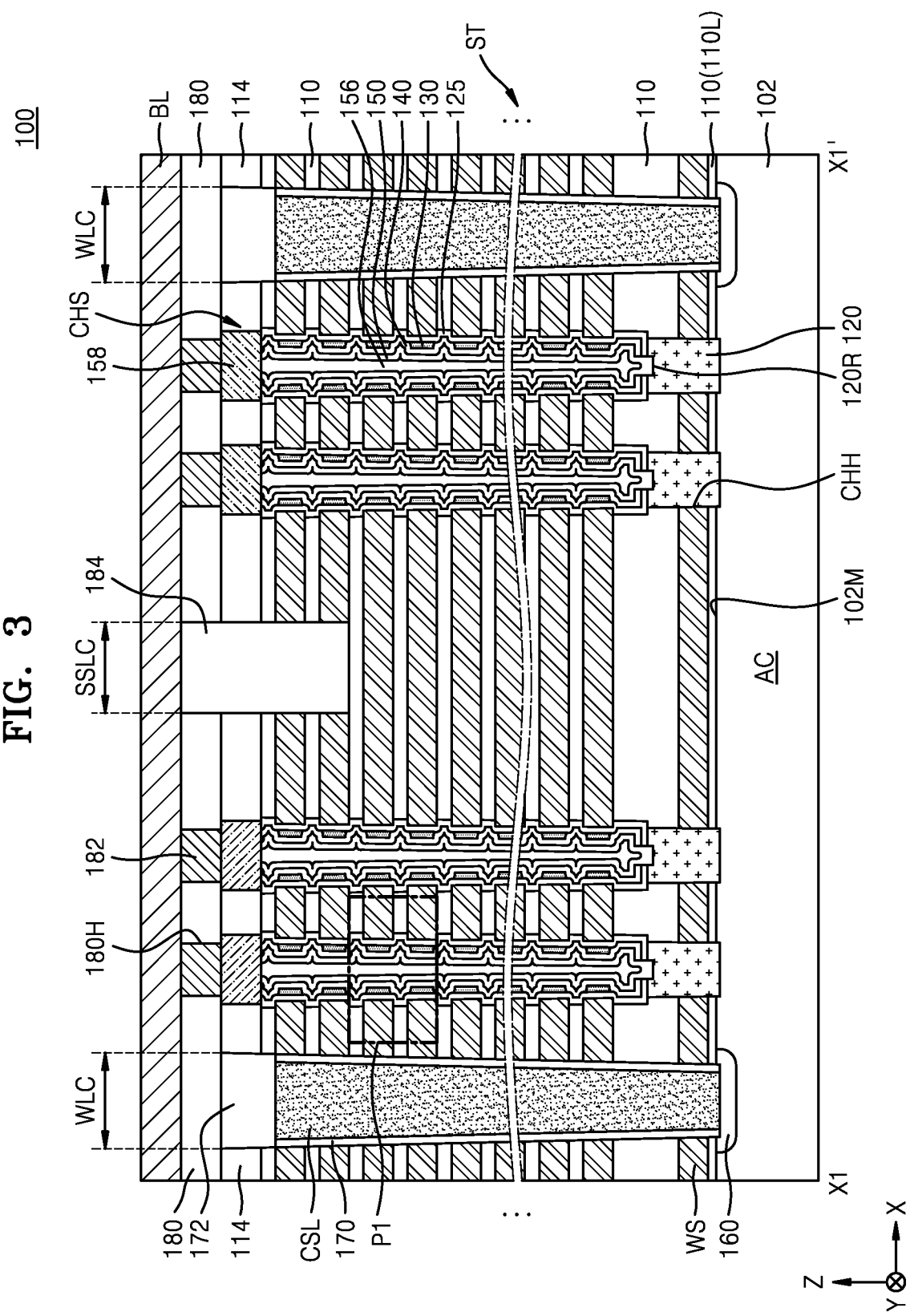
FIG. 3 is a cross-sectional view taken along line X1-X1' of FIG. 2.

FIG. 2 is a plan view of main constituent elements of an integrated circuit device 100 according to some embodiments of the present inventive concept. FIG. 3 is a cross-sectional view taken along line X1-X1' of FIG. 2. FIGS. 4A to 4G are enlarged cross-sectional views of an area P1 indicated by a dash-dot line in FIG. 3.

Referring to FIGS. 2 and 3, the integrated circuit device 100 may include a substrate 102 having an active area AC. The memory cell array MCA may be formed above the active area AC of the substrate 102. The memory cell array MCA may have a circuit configuration as described with reference to FIG. 1.

The substrate 102 may have a main surface 102M extending in a first direction (X direction) and a second direction (Y direction) that are horizontal directions. In some embodiments, the substrate 102 may include, for example, Si, Ge, or SiGe. In some embodiments, the substrate 102 may include, for example, a silicon-on-insulator (SOI) substrate or a germanium-on-insulator (GeOI) substrate.

Referring to FIGS. 1 to 3, in the memory cell array MCA, the memory cell transistors MC1, MC2, . . . , MCn-1, and MCn forming the memory cell strings MS may have a structure of being serially connected in a third direction (Z direction) that is perpendicular to the main surface 102M of the substrate 102. A plurality of channel structures CHS included in the string selection transistor SST, the ground selection transistor GST, and the memory cell transistors MC1, MC2, . . . , MCn-1, and MCn may extend in the third direction (Z direction) that is perpendicular to the main surface 102M of the substrate 102. The channel structures CHS may be arranged spaced apart from each other with an interval therebetween in the first direction (X direction) and the second direction (Y direction).

Each of the channel structures CHS may include a semiconductor pattern 120 that is in contact with the substrate 102 and is in (e.g., partially fills) a channel hole CHH, a channel film 150 in contact with the semiconductor pattern 120 and extending in the third direction (Z direction) in the channel hole CHH, a buried insulating film 156 that is in (e.g., fills) an inner space of the channel film 150, and a drain region 158 that is in contact with the channel film 150 and is in (e.g., fills) a top inlet side of the channel hole CHH. In some embodiments, the channel film 150 may have a cylindrical shape having an inner space, and the inner space of the channel film 150 may be filled with (e.g., partially filled with or completely filled with) the buried insulating film 156. The channel film 150 may include, for example, impurity-doped polysilicon or polysilicon with no impurities doped (e.g., polysilicon without dopants intentionally added). The buried insulating film 156 may include, for example, a silicon oxide, a silicon nitride, a silicon oxynitride, or a combination thereof. In some embodiments, the buried insulating film 156 may be omitted. In this case, the channel film 150 may have a pillar structure having no inner space. The drain region 158 may include, for example, an impurity-doped polysilicon film. The drain regions 158 included in the channel structures CHS may be insulated from each other by an insulating pattern 114. The insulating pattern 114 may include, for example, an oxide film, a nitride film, or a combination thereof. It will be understood that "an element having a cylindrical shape" as used herein refers to an element that includes a bottom portion and a vertical portion protruding from the bottom portion in a vertical direction (e.g., the Z direction). The vertical portion of the element may or may not have a side perpendicular to a main surface of a substrate (e.g., the substrate 102). In some embodiments, the side of the vertical portion of the element may be slanted with respect to the main surface 102M of the substrate 102.

In the channel hole CHH, a blocking dielectric film 125, a charge storage film 130, a tunneling dielectric film 140, the channel film 150, and the buried insulating film 156 may be sequentially arranged, and the top inlet side of the channel hole CHH may be filled with (e.g., partially filled with or completely filled with) the drain region 158.

In the channel hole CHH, each of the blocking dielectric film 125, the tunneling dielectric film 140, and the channel film 150 may have a cylindrical shape. In the channel hole CHH, the charge storage film 130 may have a ring shape by being arranged spaced apart from each other in the third direction (Z direction), or may have a cylindrical shape. Each of the blocking dielectric film 125, the tunneling dielectric film 140, and the channel film 150 may include a plurality of bent portions formed in a portion covering a plurality of word line structures WS and a plurality of insulating films 110. In some embodiments, multiple charge storage films 130 that are spaced apart from each other in the third direction (Z direction) may be provided in a single channel hole CHH, as illustrated in FIG. 3.

During the process of forming the blocking dielectric film 125, the charge storage film 130, and the tunneling dielectric film 140, a recessed surface 120R may be formed in an upper surface of the semiconductor pattern 120 by removing a partial area of the upper surface of the semiconductor pattern 120. The channel film 150 may be in contact with the recessed surface 120R of the semiconductor pattern 120.

The word line structures WS may extend on the substrate 102 along an X-Y plane in the horizontal direction parallel to the main surface 102M, and, in the third direction (Z direction) that is perpendicular to the main surface 102M of the substrate 102, the word line structures WS may be arranged to be spaced apart from each other and to vertically overlap each other. It will be understood that references herein to "an element A vertically overlapping an element B" (or similar language) means that at least one vertical line exists that intersects both the elements A and B.

The width of the word line structures WS in the first direction (X direction) may be restricted by a plurality of word line cut areas WLC. In a plan view, the word line structures WS may be repeatedly arranged to be spaced apart from each other by a constant interval by the word line cut areas WLC. In some embodiments, the integrated circuit device 100 may include multiple groups of word line structures WS, and each of the multiple groups of word line structures WS may include word line structures WS stacked along the third direction (Z direction). In some embodiments, a width of each of the multiple groups of word line structures WS in the first direction (X direction) may be equal to a distance between two adjacent word line cut areas WLC, and the multiple groups of word line structures WS may be spaced apart from each other in the first direction (X direction).

A plurality of common source regions 160 may extend in the substrate 102 in the second direction (Y direction). In some embodiments, the common source regions 160 may be impurity areas doped with n-type impurities at a high concentration. The common source regions 160 may function as source regions for supplying current to vertical memory cells.

The word line cut areas WLC may be partially filled with the common source line CSL. The common source line CSL may extend in the common source regions 160 in the second direction (Y direction). An insulating spacer 170 for covering a side wall of the common source line CSL may be formed in the word line cut areas WLC. The insulating spacer 170 may electrically insulate between the common source line CSL and the word lines WL (WL1, WL2, . . . , WLn-1, and WLn). The common source line CSL and the insulating spacer 170 may be covered with a capping insulating film 172. The common source line CSL may include, for example, metal such as tungsten, copper, or aluminum; a conductive metal nitride such as a titanium nitride or a tantalum nitride; transition metal such as titanium or tantalum; or a combination thereof. Each of the insulating spacer 170 and the capping insulating film 172 may include, for example, a silicon oxide film, a silicon nitride film, a silicon oxynitride film, or a combination thereof. In some embodiments, a metal silicide film (not shown) for reducing contact resistance may be provided between the common source regions 160 and the common source line CSL. For example, the metal silicide film may include cobalt silicide, tungsten silicide, or nickel silicide. It will be understood that "an element A covers a surface of an element B" (or similar language) means that the element A is on the surface of the element B but does not necessarily mean that the element A covers the surface of the element B entirely.

A top insulating film 180 may cover the insulating pattern 114, the drain region 158, and the capping insulating film 172. A string selection line cut area SSLC, which is formed by removing a part of the top insulating film 180, a part of the insulating pattern 114, a part of at least two upper insulating films of the insulating films 110, and a part of two uppermost word line structures of the word line structures WS, may be filled with a cut insulating film 184. The cut insulating film 184 may include, for example, an oxide film, a nitride film, an air gap, or a combination thereof. The term "air gap" used in the present specification may signify a space including gases that may exist in the air or may be used in a manufacturing process.

A plurality of bit line contact pads 182 may be provided, respectively, in a plurality of bit line contact holes 180H that penetrate partial areas of the top insulating film 180, and a plurality of bit lines BL on the top insulating film 180 may be connected to the bit line contact pads 182.

The word line structures WS located between two neighboring word line cut areas WLC may include the ground selection line GSL, the word lines WL (WL1, WL2, WLn-1, and WLn), and the string selection line SSL, which are described with reference to FIG. 1. The number of word line structures WS stacked on the substrate 102 in the third direction (Z direction) may be variously selected as needed. One of the word line structures WS that is closest to the substrate 102 may form the ground selection line GSL. Each of the two uppermost word line structures WS of the word line structures WS may form the string selection line SSL. The string selection line SSL may include a portion separated by the string selection line cut area SSLC.

The word line structures WS may include, for example, metal such as tungsten, nickel, cobalt, or tantalum, metal silicide such as tungsten silicide, nickel silicide, cobalt silicide, or tantalum silicide, impurity-doped polysilicon, or a combination thereof.

In some embodiments, a dielectric thin film covering bottom surfaces and top surfaces of the word line structures WS and side walls thereof facing the channel film 150 a may be further included. The dielectric thin film may include, for example, a high dielectric film having a dielectric constant higher than a silicon oxide. In some embodiments, the high dielectric film may include a metal oxide, for example, a hafnium oxide, an aluminum oxide, a zirconium oxide, or a tantalum oxide.

The insulating films 110 each extend between the word line structures WS in the horizontal direction parallel to the main surface 102M of the substrate 102. The insulating films 110 may include, for example, a silicon oxide film. In some embodiments, the insulating films 110 may further include an air gap.

The word line structures WS and the insulating films 110 may form a stack structure ST.

Figure 4A:
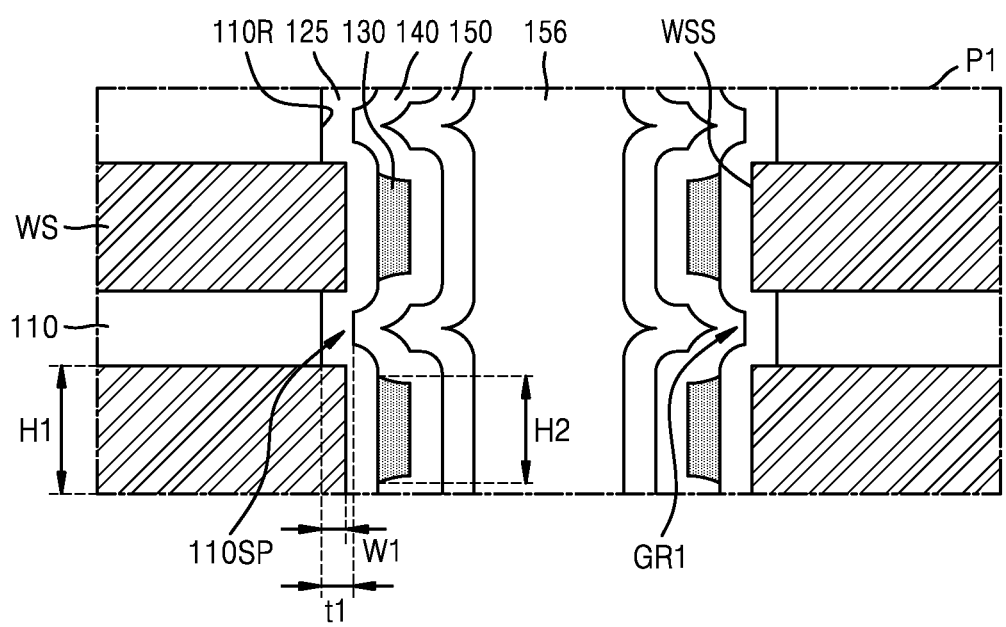
FIGS. 4A to 4G are enlarged cross-sectional views of an area P1 of FIG. 3.

Referring to FIGS. 3 and 4A, the word line structures WS may have a structure protruding toward the channel film 150 further than the insulating films 110. The insulating films 110 may have a recessed side wall 110R that is located farther from the channel film 150 than a side wall WSS of each of the word line structures WS facing the channel film 150.

The blocking dielectric film 125 may be formed to cover the word line structures WS and the insulating films 110, extend in the third direction (Z direction) with bent portions, and have a first groove GR1 toward the recessed side walls 110R of the insulating films 110. The blocking dielectric film 125 may cover substantially and conformally the side walls WSS of the word line structures WS and the recessed side walls 110R of the insulating films 110. The blocking dielectric film 125 may include, for example, a silicon oxide film or a silicon oxynitride film. In some embodiments, the blocking dielectric film 125 includes a surface that faces the channel film 150 and includes multiple first grooves GR1, and the multiple first grooves GR1 may be on sides of the insulating films 110, respectively, as illustrated in FIG. 4A.

A thickness t1 of the blocking dielectric film 125 may be greater than a width W1 between the side walls WSS of the word line structures WS and the recessed side walls 110R of the insulating films 110 in the first direction (X direction). The blocking dielectric film 125 may completely fill an indent space 110SP that is defined by the bottom surface and the top surface of the word line structures WS and the recessed side wall 110R of the insulating film 110 so that the first groove GR1 may not extend into the indent space 110SP.

The charge storage films 130 may be arranged on the side walls WSS of the word line structures WS with the blocking dielectric film 125 therebetween. The charge storage film 130 may include, for example, a silicon nitride film, polysilicon, or impurity-doped polysilicon. In some embodiments, the charge storage film 130 may be a charge trap film that is a silicon nitride film. In some embodiments, the charge storage film 130 may a floating gate including polysilicon or impurity-doped polysilicon. In some embodiments, a first height H1 of the word line structures WS in the third direction (Z direction) may be greater than a second height H2 of the charge storage films 130 in the third direction (Z direction). In some embodiments, the height of the charge storage film 130 in the third direction (Z direction) may increase from the side of the channel film 150 toward the side of the word line structures WS, as illustrated in FIG. 4A. For example, the height of a side wall of the charge storage film 130 facing the word line structures WS in the third direction (Z direction) may be greater than the height of a side wall of the charge storage film 130 facing the channel film 150.

The tunneling dielectric film 140 may extend in the third direction (Z direction) with bent portions, covering the blocking dielectric film 125 and the charge storage films 130. The tunneling dielectric film 140 may substantially and conformally cover the blocking dielectric film 125 and the charge storage films 130. The tunneling dielectric film 140 may include, for example, a silicon oxide film.

The channel film 150 may extend in the third direction (Z direction) with bent portions, covering the tunneling dielectric film 140.

The blocking dielectric film 125, the tunneling dielectric film 140, and the channel film 150 may extend non-linearly in the third direction (Z direction). The blocking dielectric film 125, the tunneling dielectric film 140, and the channel film 150 each may have a shape concavely protruding in a direction away from the word line structures WS in a portion facing the word line structures WS. The blocking dielectric film 125, the tunneling dielectric film 140, and the channel film 150 each may have a shape concavely protruding toward the insulating films 110 in a portion facing the insulating films 110.

Figure 4B:
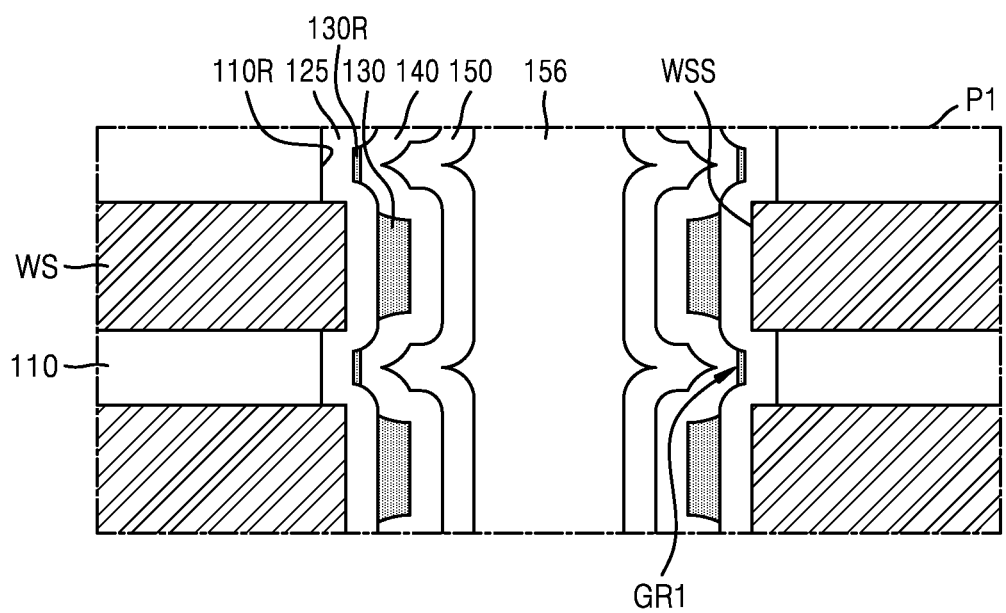

Referring to FIGS. 3 and 4B, the integrated circuit device 100 may further include a residual layer 130R located between the blocking dielectric film 125 and the tunneling dielectric film 140 in the first groove GR1. In some embodiments, the residual layer 130R may include the same material as the charge storage film 130. For example, the residual layer 130R may include, for example, a silicon nitride film, polysilicon, or impurity-doped polysilicon.

Figure 4C:
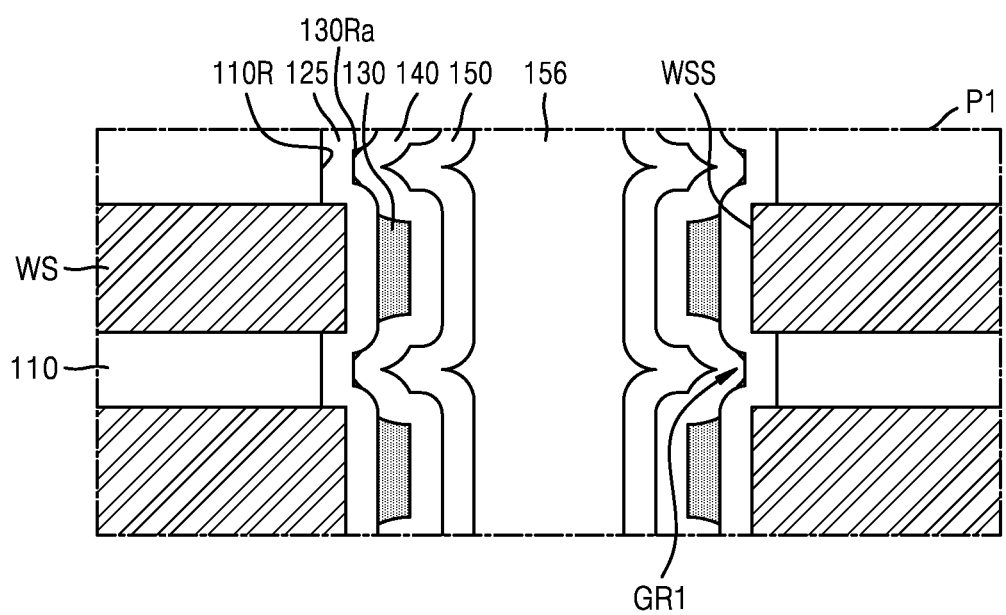

Referring to FIGS. 3 and 4C, the integrated circuit device 100 may further include a residual layer 130Ra located between the blocking dielectric film 125 and the tunneling dielectric film 140 in the first groove GR1. At least two residual layers 130Ra spaced apart from each other may be arranged between the blocking dielectric film 125 and the tunneling dielectric film 140 in the first groove GR1. In some embodiments, the residual layer 130Ra may include the same material as the charge storage film 130.

Figure 4D:
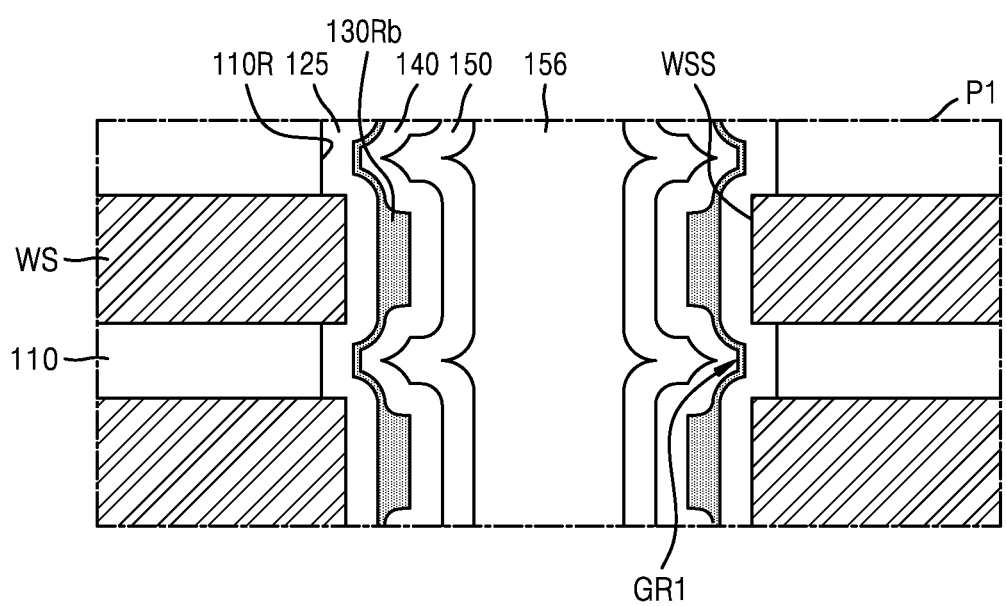

Referring to FIGS. 3 and 4D, the integrated circuit device 100 may include a charge storage film 130Rb located between the blocking dielectric film 125 and the tunneling dielectric film 140. The charge storage film 130Rb may extend between the blocking dielectric film 125 and the tunneling dielectric film 140 such that the charge storage film 130 and the residual layer 130R of FIG. 4B are not separated but are integrally formed. In some embodiments, the charge storage film 130 and the residual layer 130R may be connected to each other as illustrated in FIG. 4D. A thickness of a portion of the charge storage film 130Rb facing each of the word line structures WS in the first direction (X direction) may be greater than a thickness of a portion facing each of the insulating films 110 in the first direction (X direction).

Figure 4E:
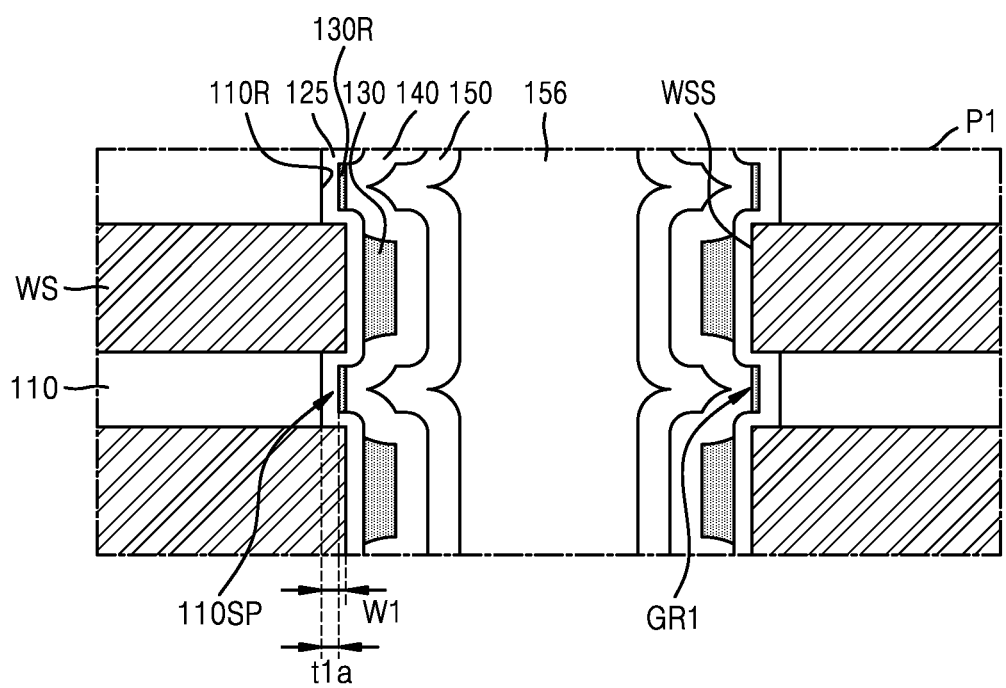

Referring to FIGS. 3 and 4E, a thickness t1a of the blocking dielectric film 125 may be less than the width W1 between the side walls WSS of the word line structures WS and the recessed side walls 110R of the insulating films 110 in the first direction (X direction). As the blocking dielectric film 125 does not completely fill the indent space 110SP defined by the bottom surface and the top surface of the word line structures WS and the recessed side wall 110R of the insulating film 110, the first groove GR1 may extend into the indent space 110SP.

Figure 4F:
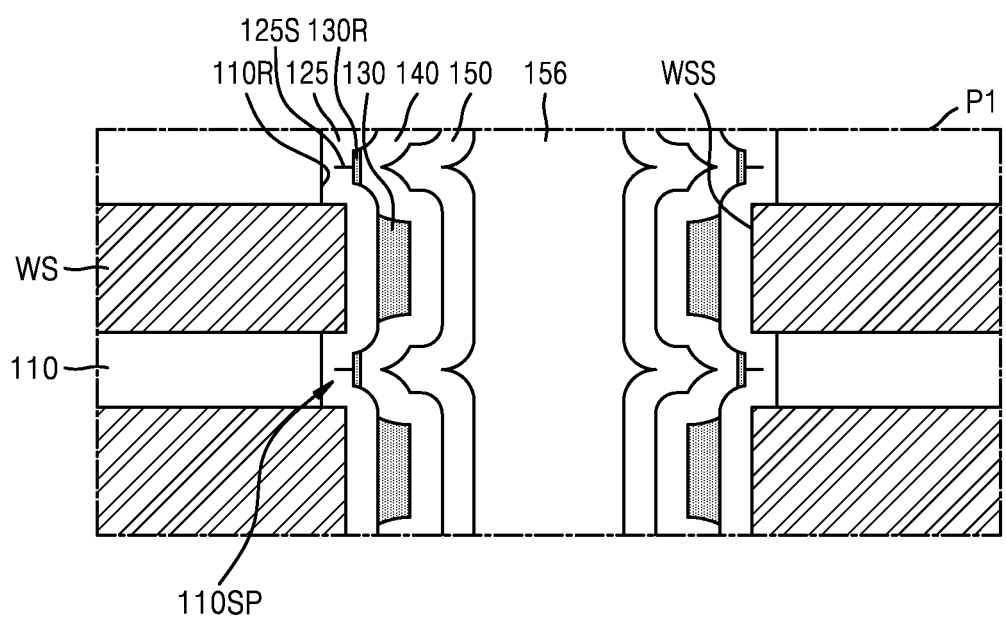

Referring to FIGS. 3 and 4F, the blocking dielectric film 125 may have a seam 125S extending from a side wall facing the channel film 150 toward the recessed side walls 110R of the insulating films 110. The seam 125S may be formed in a process in which the blocking dielectric film 125 fills the indent space 110SP defined by the bottom surface and the top surface of the word line structures WS and the recessed side wall 110R of the insulating film 110.

Figure 4G:
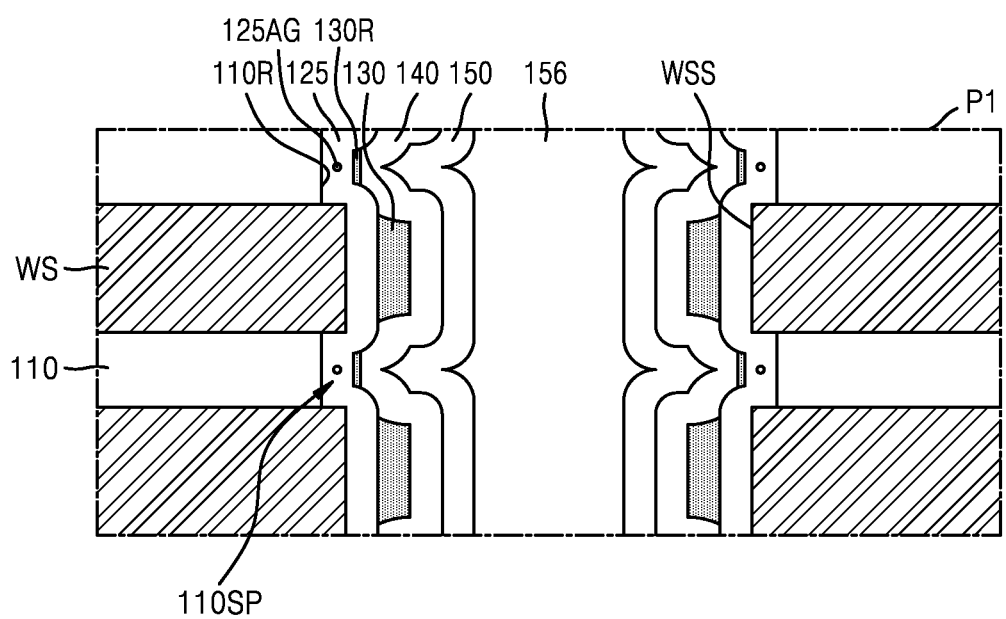

Referring to FIGS. 3 and 4G, the blocking dielectric film 125 may have a first air gap 125AG therein. The first air gap 125AG may be formed in a process in which the blocking dielectric film 125 fills the indent space 110SP defined by the bottom surface and the top surface of the word line structures WS and the recessed side wall 110R of the insulating film 110.

Although FIGS. 4E to 4G both illustrate the residual layer 130R, the residual layer 130R may be omitted as illustrated in FIG. 4A, may be replaced with the residual layer 130Ra of FIG. 4C instead of the residual layer 130R, or may be replaced with the charge storage film 130Rb of FIG. 4D instead of the charge storage film 130 and the residual layer 130R.

Figure 5A:
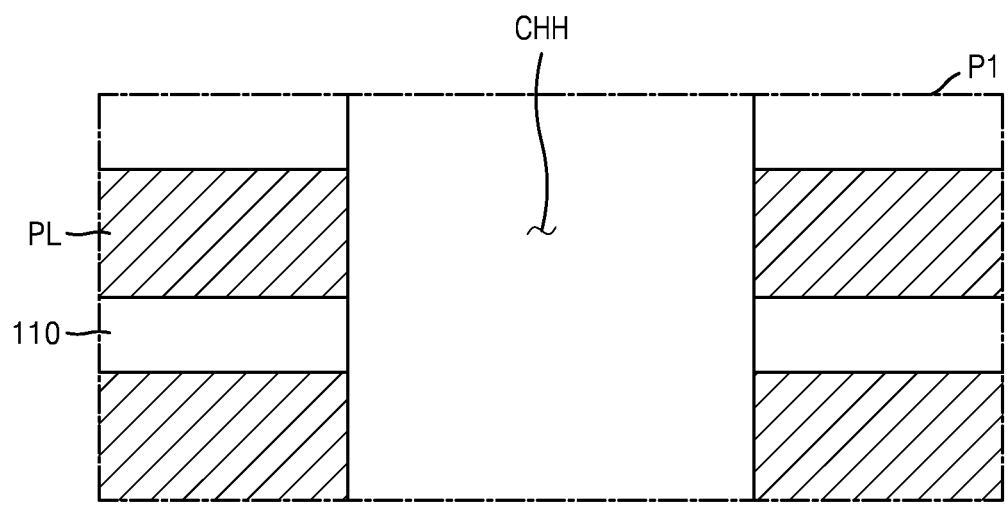
FIGS. 5A to 5P are enlarged cross-sectional views illustrating a method of manufacturing an integrated circuit device according to some embodiments of the present inventive concept.
Figure 5B:
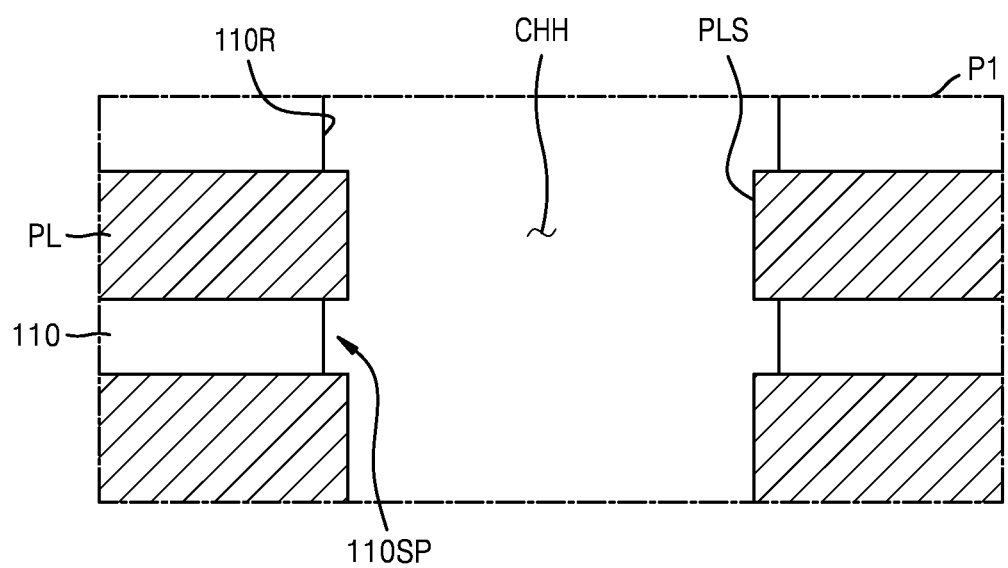
Figure 5C:
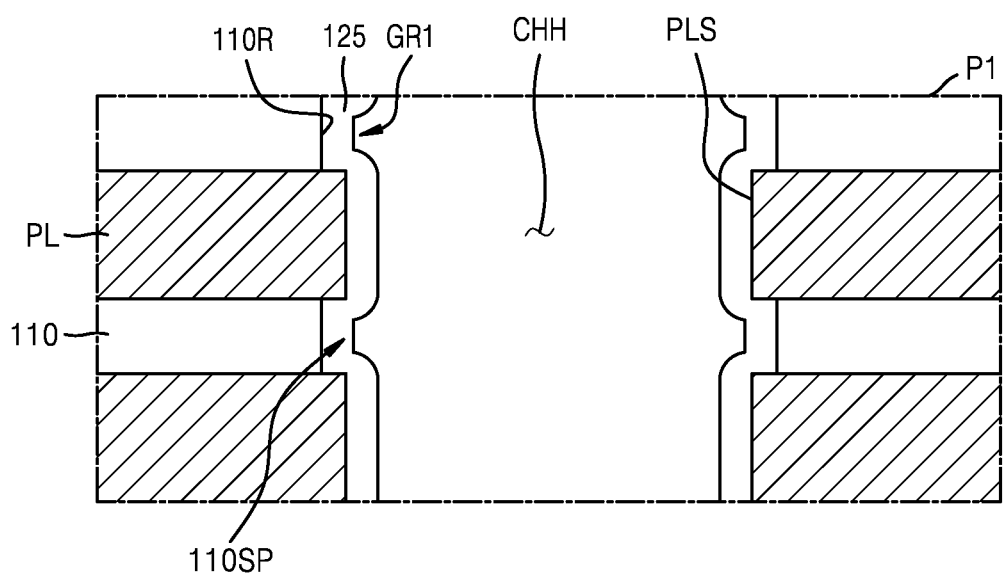
Figure 5D:
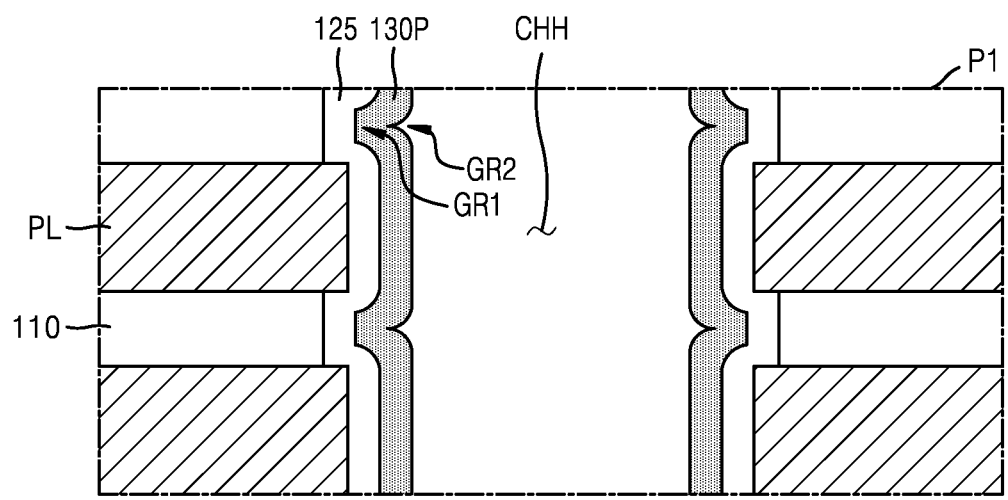
Figure 5E:
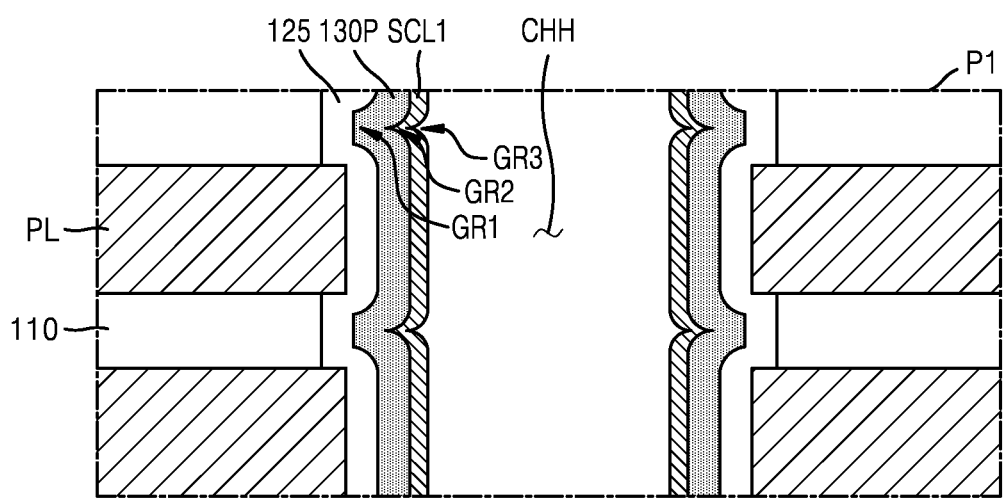
Figure 5F:
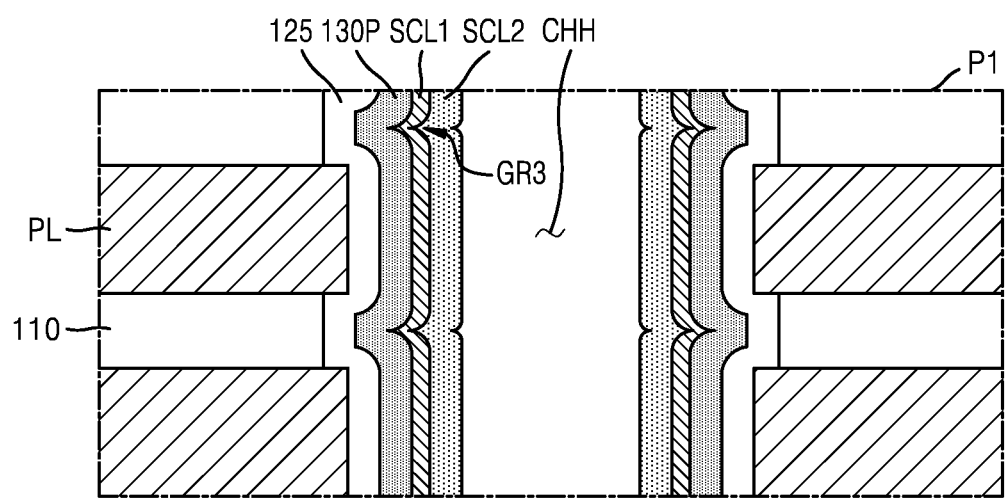
Figure 5G:
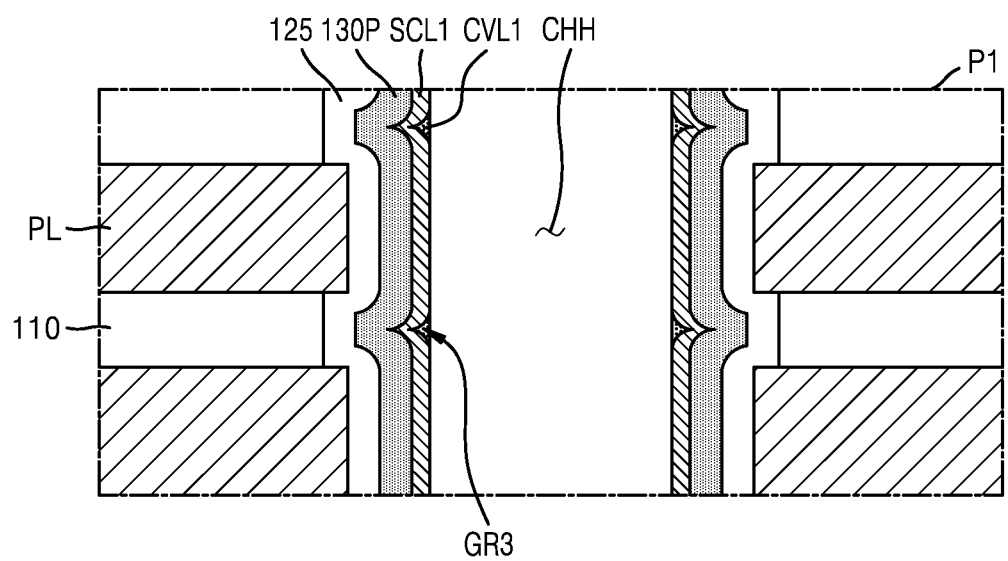
Figure 5H:
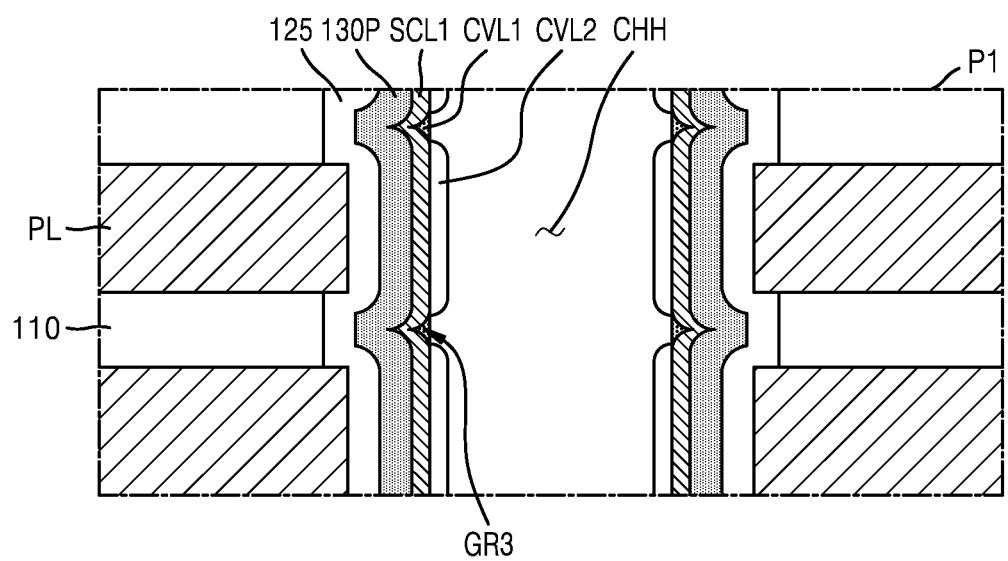
Figure 5I:
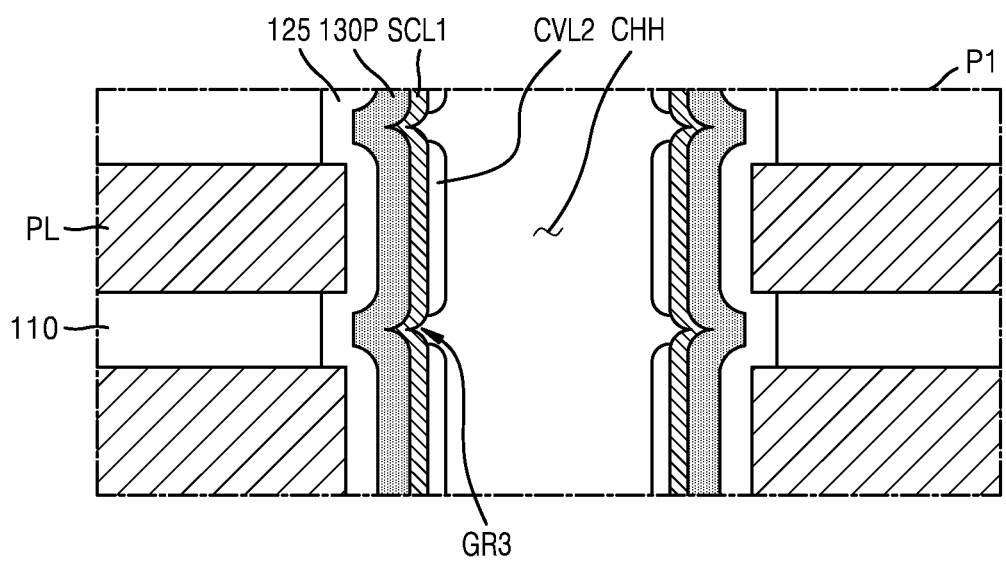
Figure 5J:
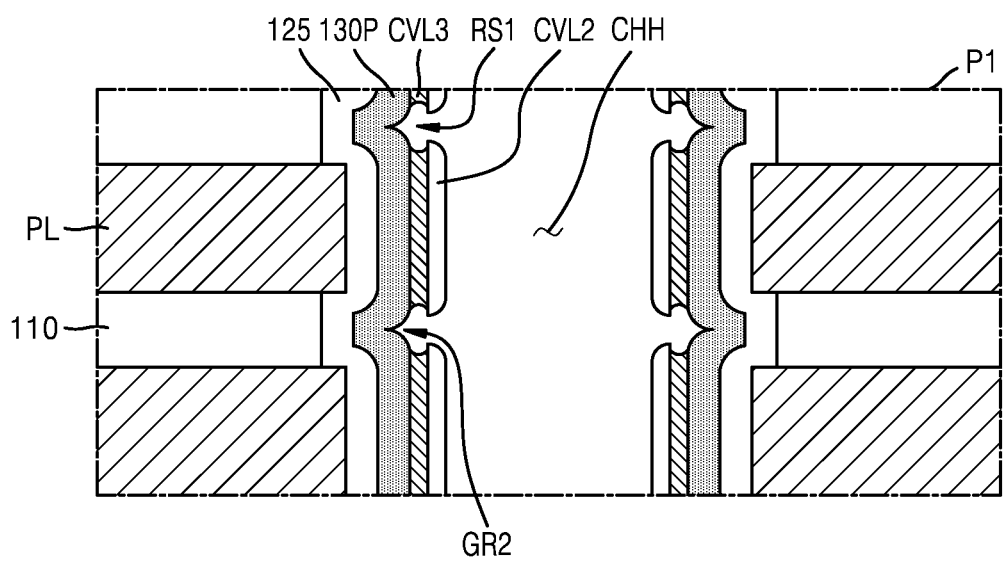
Figure 5K:
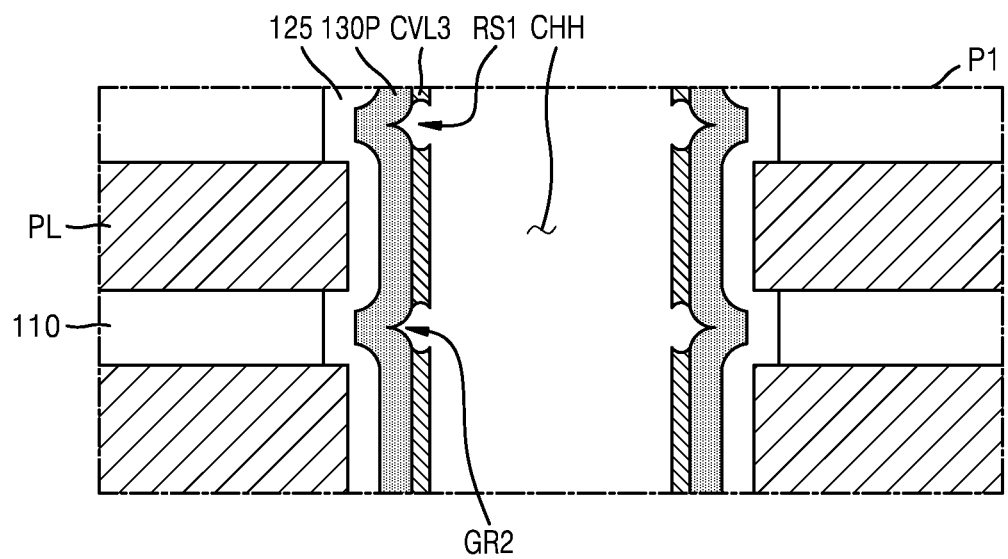
Figure 5L:
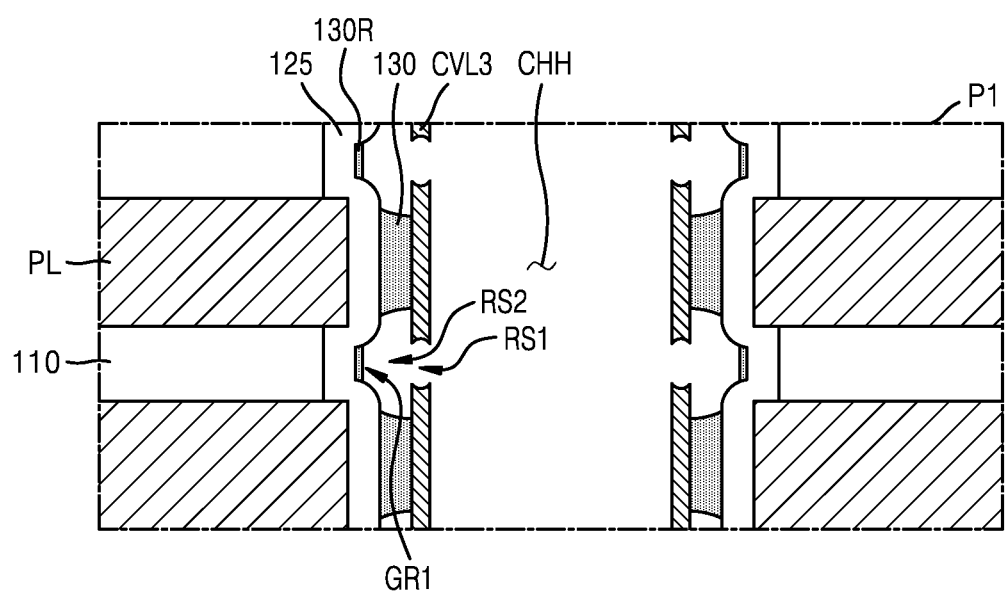
Figure 5M:
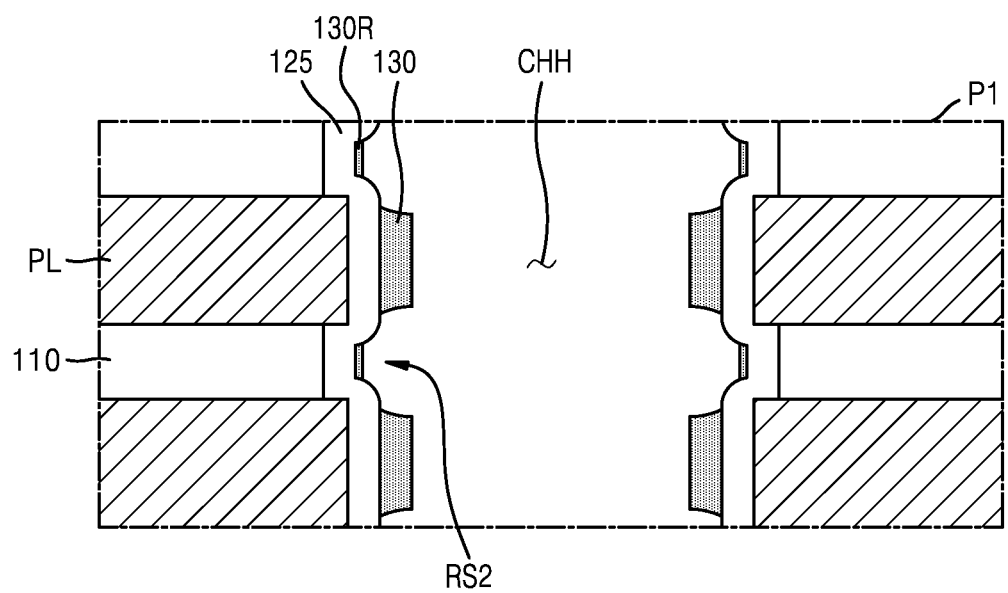
Figure 5N:
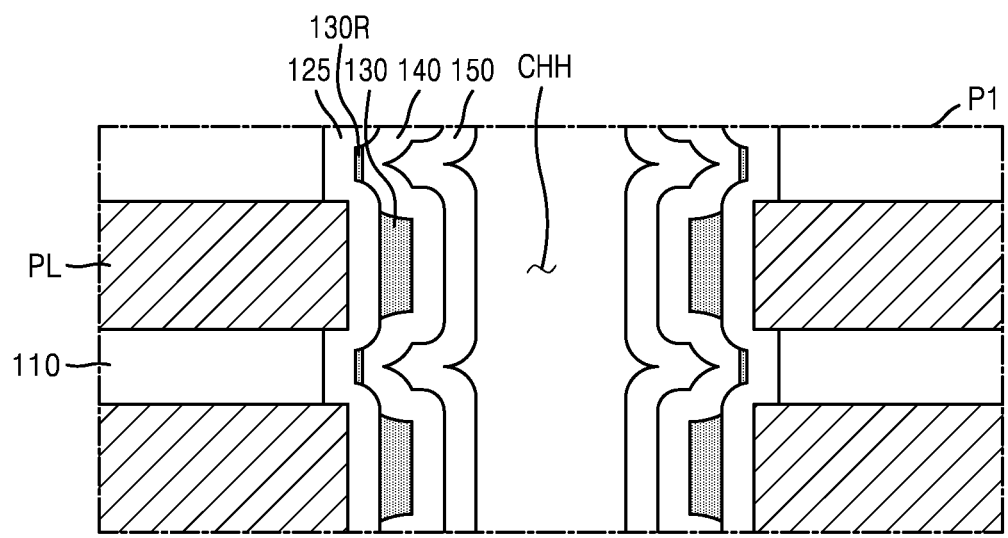
Figure 50:
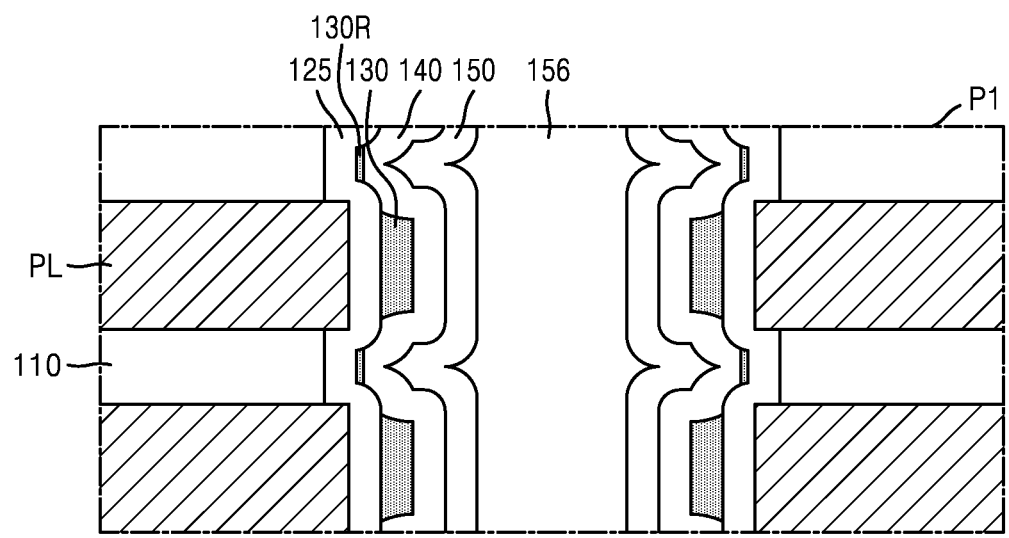
Figure 5P:
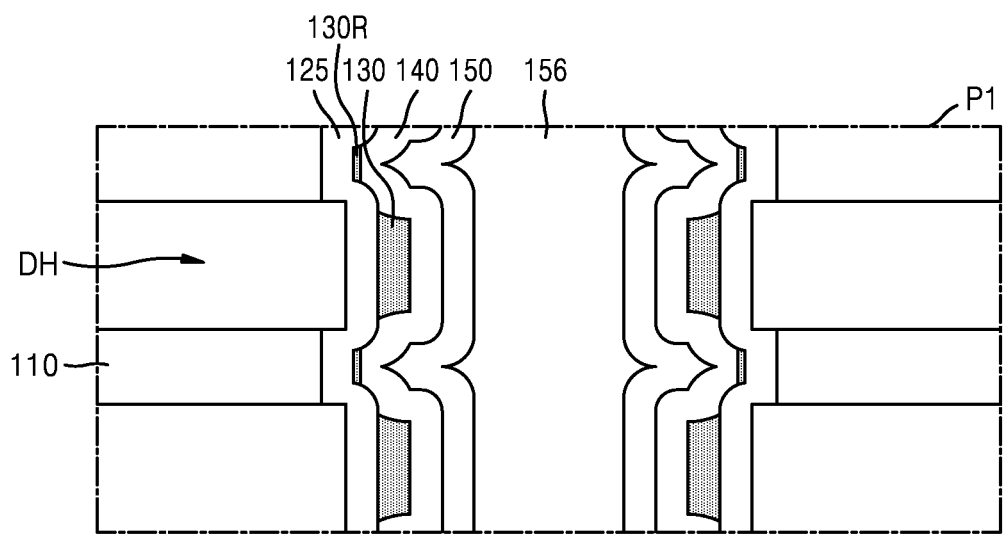

FIGS. 5A to 5P are enlarged cross-sectional views illustrating a method of manufacturing an integrated circuit device, according to some embodiments of the present inventive concept. In detail, FIGS. 5A to 5P illustrate the area P1 of FIG. 3 according to the method of manufacturing the integrated circuit device of FIG. 4B, and differences between the methods of manufacturing the integrated circuit devices of FIG. 4A and FIGS. 4C to 4G are mainly described with reference to FIG. 3.

Referring to FIGS. 3 and 5A, a structure in which the insulating films 110 and a plurality of sacrificial layers PL are alternately stacked one by one is formed on the substrate 102. In some embodiments, the sacrificial layers PL may include, for example, a silicon nitride film, and the insulating films 110 may include, for example, a silicon oxide film. The insulating films 110 and the sacrificial layers PL each may be formed by a method such as a chemical vapor deposition (CVD) method, a plasma enhanced CVD (PECVD) method, or an atomic layer deposition (ALD) method.

The sacrificial layers PL may provide, in each of subsequent processes, a space for forming at least one ground selection line GSL, the word lines WL, and at least one string selection line SSL illustrated in FIG. 1.

Among the insulating films 110, a lowermost insulating film 110L in contact with the substrate 102 may have a thickness less than that of the other insulating films 110. The insulating film 110 that is formed directly above the first one of the sacrificial layers PL from the substrate 102 may have a thickness greater than that of that other insulating films 110 located at different positions.

The insulating pattern 114 is formed on the uppermost one of the insulating films 110, and the insulating films 110 and the sacrificial layers PL are anisotropically etched by using the insulating pattern 114 as an etch mask, thereby forming the channel hole CHH that exposes the substrate 102.

A width of the channel hole CHH in the horizontal direction may decrease toward the substrate 102. The insulating pattern 114 may be in a single layer or multilayer including, for example, an oxide film, a nitride film, or a combination thereof.

The semiconductor pattern 120 that partially fills the channel hole CHH is formed by a selective epitaxial growth (SEG) process using the substrate 102 exposed in the bottom of the channel hole CHH as a seed. An upper surface of the semiconductor pattern 120 may be on a level between an upper surface of one of the sacrificial layers PL that is closest to the substrate 102 and a bottom surface of one of the insulating films 110 that is closest to the substrate 102. The semiconductor pattern 120 may perform a channel function in a manner similar to the channel film 150. The semiconductor pattern 120 may include, for example, Si or Ge. In some embodiments, the semiconductor pattern 120 may include impurities-doped semiconductor.

Referring to FIG. 5B, through the channel hole CHH, a part of each of the insulating films 110 is removed, and thus, a plurality of indent spaces 110SP communicating with the channel hole CHH are formed on the same level as the insulating films 110. The insulating films 110 each may have the recessed side wall 110R located farther from a center of the channel hole CHH than each of side walls PLS of the sacrificial layers PL facing the channel hole CHH. Side walls of the insulating films 110, that is, the recessed side wall 110R, may be indented by the indent space 110SP from the channel hole CHH than the side walls PLS of the sacrificial layers PL. In some embodiments, the indent spaces 110SP may be formed by removing the part of each of the insulating films 110 by a wet etching process.

Referring to FIG. 5C, the blocking dielectric film 125 covering the surfaces of the insulating films 110 and the sacrificial layers PL exposed in the channel hole CHH is formed. The blocking dielectric film 125 may be formed to cover the sacrificial layers PL and the insulating films 110, may extend in the third direction (Z direction) with bent portions, and may have the first groove GR1 of the insulating films 110 facing each of the recessed side walls 110R. The blocking dielectric film 125 may substantially and conformally cover parts of upper surfaces and bottom surfaces of the sacrificial layers PL, and the side walls PLS and the recessed side walls 110R of the insulating films 110.

According to the thickness of the blocking dielectric film 125, the blocking dielectric film 125 may completely fill the indent space 110SP as illustrated in FIG. 4A, or the blocking dielectric film 125 may not completely fill the indent space 110SP and the first groove GR1 may extend into the indent space 110SP, as illustrated in FIG. 4D.

Referring to FIG. 5D, a preliminary charge storage film 130P covering the blocking dielectric film 125 in the channel hole CHH is formed. The preliminary charge storage film 130P may be formed to cover the blocking dielectric film 125, extend in the third direction (Z direction) with bent portions, and have a second groove GR2 corresponding to the first groove GR1. The preliminary charge storage film 130P may include, for example, a silicon nitride film. In some embodiments, the preliminary charge storage film 130P may completely fill the first groove GR1. In some embodiments, multiple second grooves GR2 may be formed, and the multiple second grooves GR2 may be on the first grooves GR1, respectively, as illustrated in FIG. 5D.

Referring to FIG. 5E, a first cover sacrificial layer SCL1 covering the preliminary charge storage film 130P is formed in the channel hole CHH. The first cover sacrificial layer SCL1 may be formed to cover the preliminary charge storage film 130P, extend in the third direction (Z direction) with bent portions, and have a third groove GR3 corresponding to the second groove GR2. The first cover sacrificial layer SCL1 may include, for example, polysilicon. In some embodiments, multiple third grooves GR3 may be formed, and the multiple third grooves GR3 may be on the second grooves GR2, respectively, as illustrated in FIG. 5E.

Referring to FIG. 5F, a second cover sacrificial layer SCL2 covering the first cover sacrificial layer SCL1 is formed in the channel hole CHH. The second cover sacrificial layer SCL2 may be formed to cover the first cover sacrificial layer SCL1, extend in the third direction (Z direction) with bent portions, and fill the third groove GR3. The second cover sacrificial layer SCL2 may include, for example, a nitride film.

Referring to FIG. 5G, a first cover layer CVL1 that is a part of the second cover sacrificial layer SCL2 filling at least a part of the third groove GR3 is formed by anisotropically etching the second cover sacrificial layer SCL2 of FIG. 5F. In the channel hole CHH, the first cover layers CVL1 each may have a ring shape spaced apart from each other in the third direction (Z direction).

Referring to FIGS. 5H and 5I, a second cover layer CVL2 is formed on the first cover sacrificial layer SCL1 exposed in the channel hole CHH. The second cover layer CVL2 may be formed by oxidizing the first cover sacrificial layer SCL1. The second cover layer CVL2 may be formed by oxidizing a part of the first cover sacrificial layer SCL1 that is not covered by the first cover layer CVL1 and may not be formed on the first cover layer CVL1. After forming the second cover layer CVL2, the first cover layer CVL1 is removed.

Referring to FIGS. 5I and 5J, the first cover sacrificial layer SCL1 is isotropically etched by using the second cover layer CVL2 as an etch mask, thereby forming a third cover layer CVL3 that is the part of the first cover sacrificial layer SCL1 exposing a part of the preliminary charge storage film 130P. The third cover layer CVL3 may be separated into a plurality of third cover layers CVL3 by a first recess space RS1 that exposes the second groove GR2 of the preliminary charge storage film 130P.

Referring to FIGS. 5J to 5L, after removing the second cover layer CVL2, by isotropically etching the part of the preliminary charge storage film 130P exposed through the first recess space RS1 of the third cover layer CVL3, the charge storage films 130 that are separated by a second recess space RS2 communicating with the first recess space RS1 are formed. In some embodiments, the second cover layer CVL2 may be removed during the isotropical etching of the part of the preliminary charge storage film 130P, or after forming the charge storage films 130.

In the process of forming the charge storage film 130 by isotropically etching the part of the preliminary charge storage film 130P, another part of the preliminary charge storage film 130P may remain, as the residual layer 130R, on the blocking dielectric film 125 in the first groove GR1. In some embodiments, as illustrated in FIG. 4A, a part of the preliminary charge storage film 130P may be removed in the first groove GR1 so that the residual layer 130R no longer exists. In some embodiments, as illustrated in FIG. 4C, the other part of the preliminary charge storage film 130P may remain as at least two residual layers 130Ra spaced apart from each other on the blocking dielectric film 125 in the first groove GR1. In some embodiments, in the process of removing the part of the preliminary charge storage film 130P by isotropically etching the same, the charge storage film 130 and the residual layer 130R may be integrally formed (e.g., may be connected to each other) without being separated like the charge storage film 130Rb of FIG. 4D.

Referring to FIGS. 5M to 5O, after removing the third cover layer CVL3 of FIG. 5L, the tunneling dielectric film 140 covering the charge storage film 130 and the blocking dielectric film 125 is formed in the channel hole CHH. Then, after removing the blocking dielectric film 125 covering the semiconductor pattern 120 and a part of the part of the tunneling dielectric film 140, the channel film 150 covering the tunneling dielectric film 140 and the semiconductor pattern 120 is formed. In the process of removing the blocking dielectric film 125 covering the semiconductor pattern 120 and the part of the tunneling dielectric film 140, a partial area of the upper surface of the semiconductor pattern 120 is removed, thereby forming the recessed surface 120R on the upper surface of the semiconductor pattern 120. Then, the buried insulating film 156 filling the channel hole CHH is formed on the channel film 150.

Referring to FIG. 5P, after forming the word line cut areas WLC by removing a part of each of the insulating films 110 and the sacrificial layers PL of FIG. 5O, a plurality of word line spaces DH communicating with the word line cut areas WLC may be formed by removing the sacrificial layers PL through the word line cut areas WLC. The word line spaces DH may be filled with the word line structures WS, respectively.

Then, as illustrated in FIG. 3, the integrated circuit device 100 may be formed by forming the common source regions 160, the insulating spacer 170, the common source line CSL, the capping insulating film 172, the top insulating film 180, the string selection line cut area SSLC, the cut insulating film 184, the bit line contact holes 180H, the bit line contact pads 182, and the bit lines BL.

FIGS. 6A and 6C, FIGS. 7A to 7I, FIGS. 8A to 8C, FIG. 9A, FIGS. 10A to 10C, FIGS. 12A to 12C, FIG. 14A, and FIG. 16A are enlarged cross-sectional views illustrating a method of manufacturing an integrated circuit device according to some embodiments of the present inventive concept, and FIG. 6B, FIG. 6D, FIG. 7J, FIG. 8D, FIG. 9B, FIG. 10D, FIG. 11, FIG. 12D, FIG. 13, FIG. 14B, FIG. 15, FIG. 16B, FIG. 17, FIG. 18, FIG. 19, and FIG. 20 are enlarged cross-sectional views of an integrated circuit device according to some embodiments of the present inventive concept. In detail, FIGS. 6A to 20 are enlarged cross-sectional views of the area P1 of FIG. 3, and descriptions redundant with those of FIGS. 3 to 5P may be omitted.

Figure 6A:
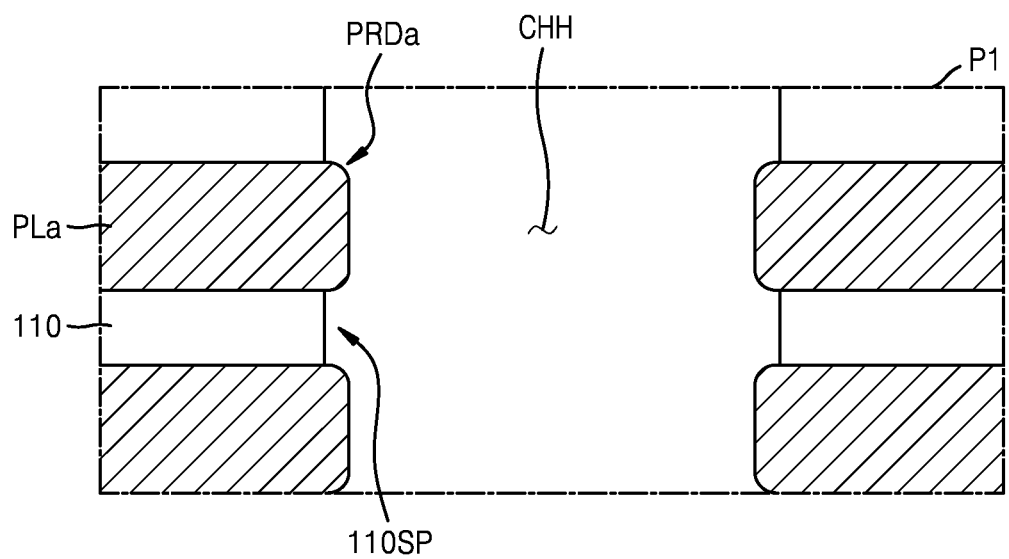
FIGS. 6A, 6C, 7A to 7I, 8A to 8C, 9A, 10A to 10C, 12A to 12C, 14A, and 16A are enlarged cross-sectional views illustrating a method of manufacturing an integrated circuit device according to some embodiments of the present inventive concept.

Referring to FIG. 6A, with respect to the resultant of FIG. 5B, a plurality of sacrificial layers PLa having a round part PRDa at the corner are formed by removing a part of a corner of each of the sacrificial layers PL of FIG. 5B exposed in the channel hole CHH.

Figure 6B:
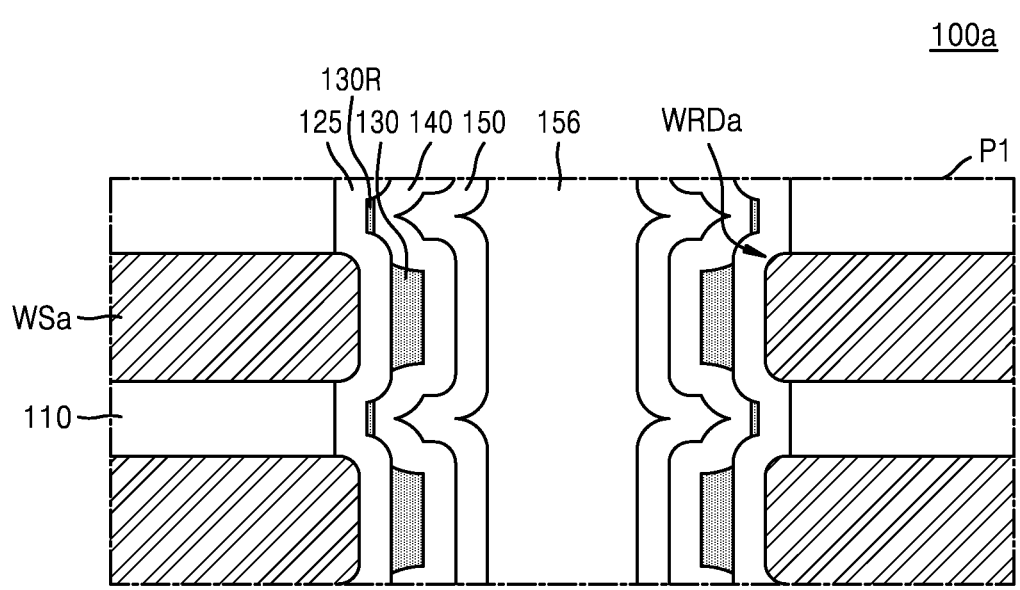
FIGS. 6B, 6D, 7J, 8D, 9B, 10D, 11, 12D, 13, 14B, 15, 16B, 17, 18, 19, and 20 are enlarged cross-sectional views of an integrated circuit device according to some embodiments of the present inventive concept.

Referring to FIG. 6B, with respect to the resultant of FIG. 6A, an integrated circuit device 100a is formed by performing the process described with reference to FIGS. 5C to 5P.

The integrated circuit device 100a may include a plurality of round word line structures WSa having a round part WRDa.

Figure 6C:
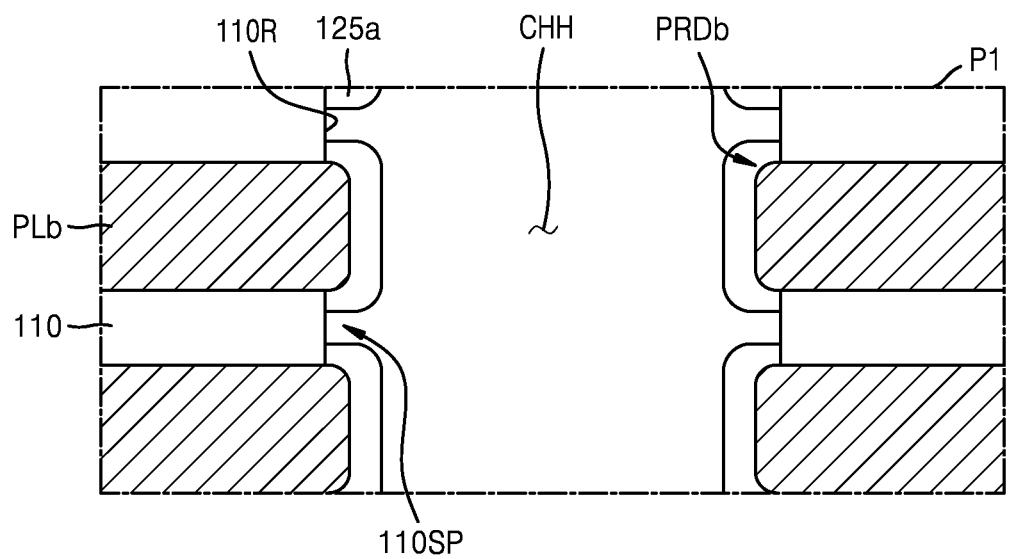

Referring to FIG. 6C, with respect to the resultant of FIG. 5B, a blocking dielectric film 125a covering surfaces of a plurality of sacrificial layers PLb exposed in the channel hole CHH is formed. The blocking dielectric film 125*a* may be formed by oxidizing a part of the sacrificial layers PL of FIG. 5B. In the process of forming the blocking dielectric film 125*a*, as a part of the corner of each of the sacrificial layers PL is consumed, the sacrificial layers PLb having a round part PRDb at the corner may be formed.

The blocking dielectric film 125*a* may not cover a part of the recessed side walls 110R of the insulating films 110 while completely covering the surfaces of the sacrificial layers PLb in the channel hole CHH.

Figure 6D:
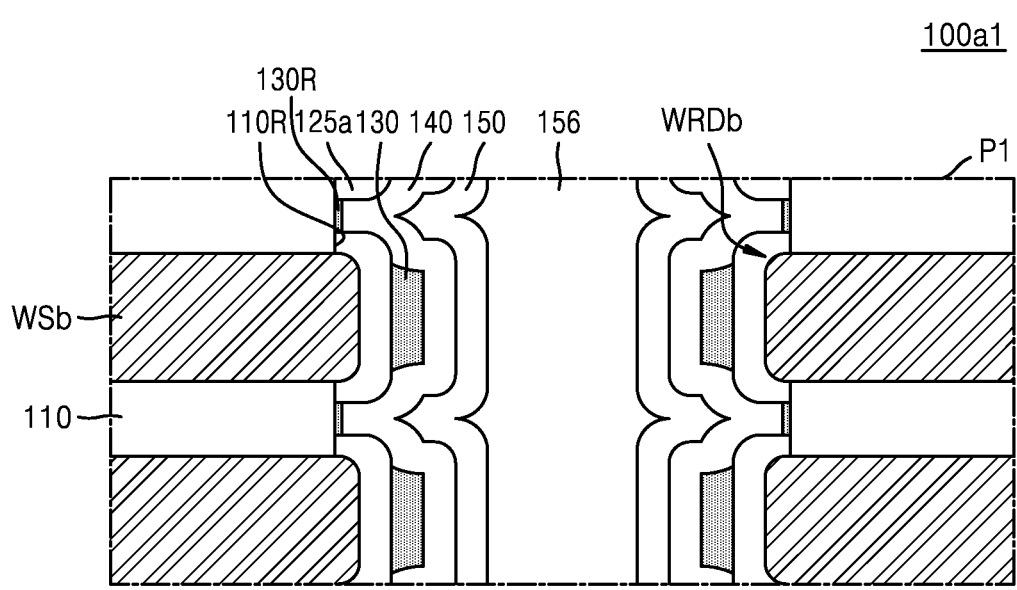

Referring to FIG. 6D, with respect to the resultant of FIG. 6C, an integrated circuit device 100*a*1 is formed by performing the process described with reference to FIGS. 5C to 5P.

The integrated circuit device 100*a*1 may include a plurality of round word line structures WSb having a round part WRDb.

Figure 7A:
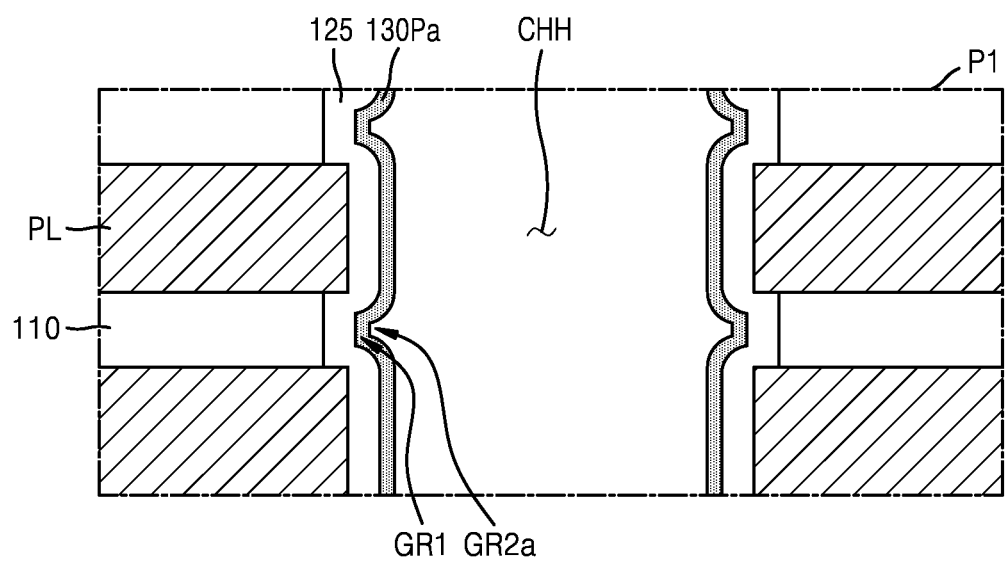

Referring to FIG. 7A, a preliminary charge storage film 130Pa for covering the blocking dielectric film 125 in the channel hole CHH is formed. The preliminary charge storage film 130Pa may cover the blocking dielectric film 125, extend in the third direction (Z direction) with bent portions, and have a second groove GR2*a* corresponding to the first groove GR1. The preliminary charge storage film 130Pa may have a thickness less than that of the preliminary charge storage film 130P of FIG. 5D. In some embodiments, the preliminary charge storage film 130Pa may fill a part of the first groove GR1 and may have a height of the second groove GR2*a* in the third direction (Z direction) greater than that of the second groove GR2 of the preliminary charge storage film 130P of FIG. 5D.

Figure 7B:
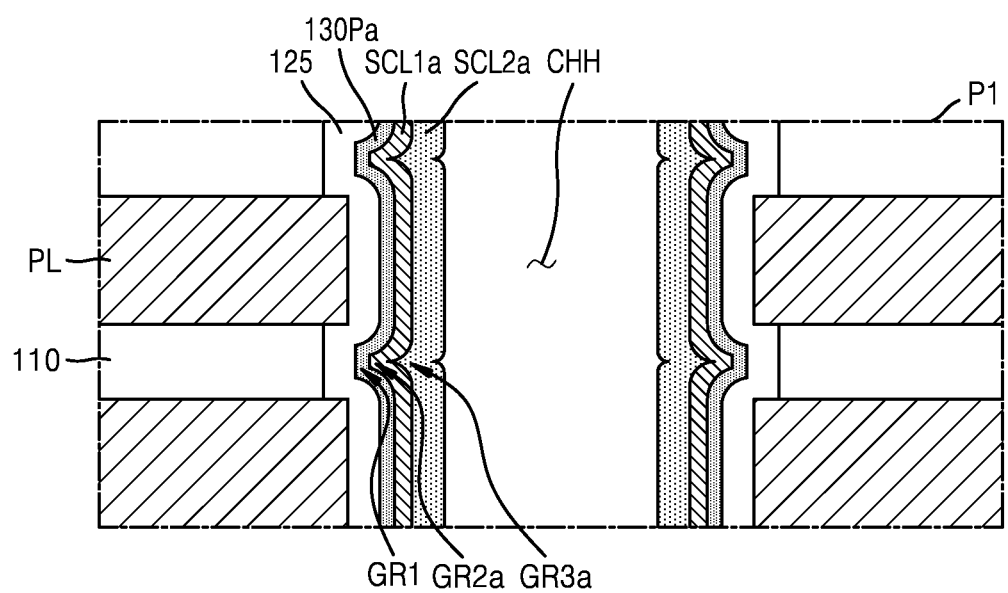

Referring to FIG. 7B, a first cover sacrificial layer SCL1*a* having the second groove GR2*a*, and a second cover sacrificial layer SCL2*a*, are sequentially formed on the preliminary charge storage film 130Pa in the channel hole CHH. The height of a third groove GR3*a* in the third direction (Z direction) may be greater than the height of the third groove GR3 of the second cover sacrificial layer SCL2 of FIG. 5E in the third direction (Z direction).

Figure 7C:
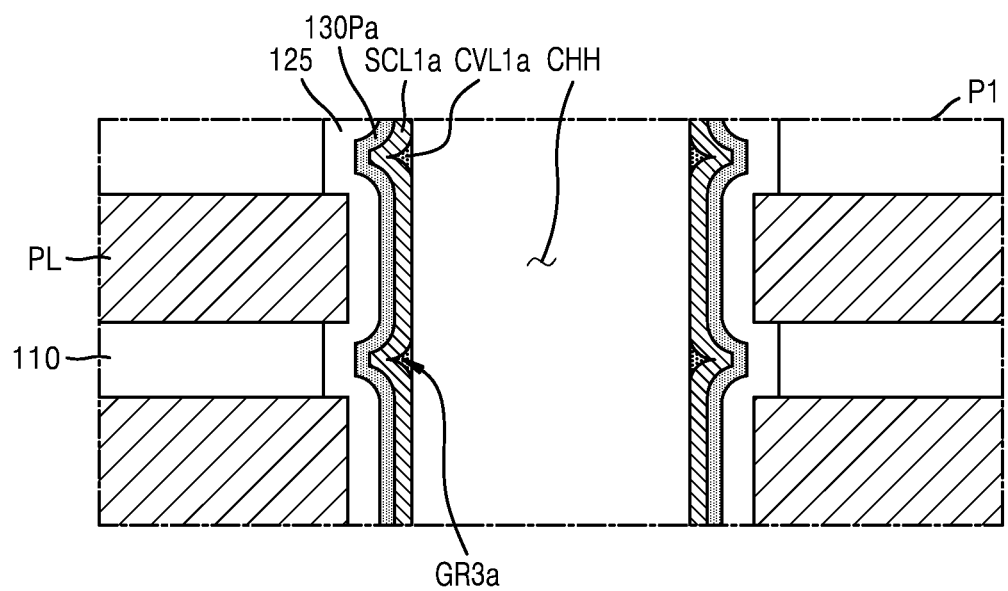

Referring to FIG. 7C, a first cover layer CVL1*a* that is a part of the second cover sacrificial layer SCL2*a* filling at least a part of the third groove GR3*a* is formed by anisotropically etching the second cover sacrificial layer SCL2*a* of FIG. 7B. In some embodiments, the height of the first cover layer CVL1*a* in the third direction (Z direction) may be greater than the height of the first cover layer CVL1 of FIG. 5G in the third direction (Z direction).

Figure 7D:
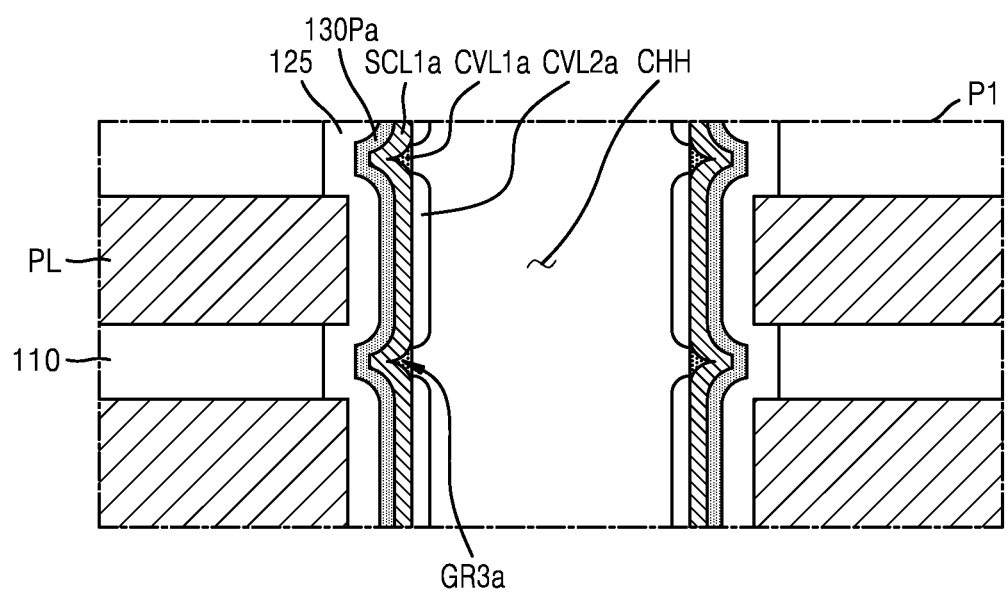
Figure 7E:
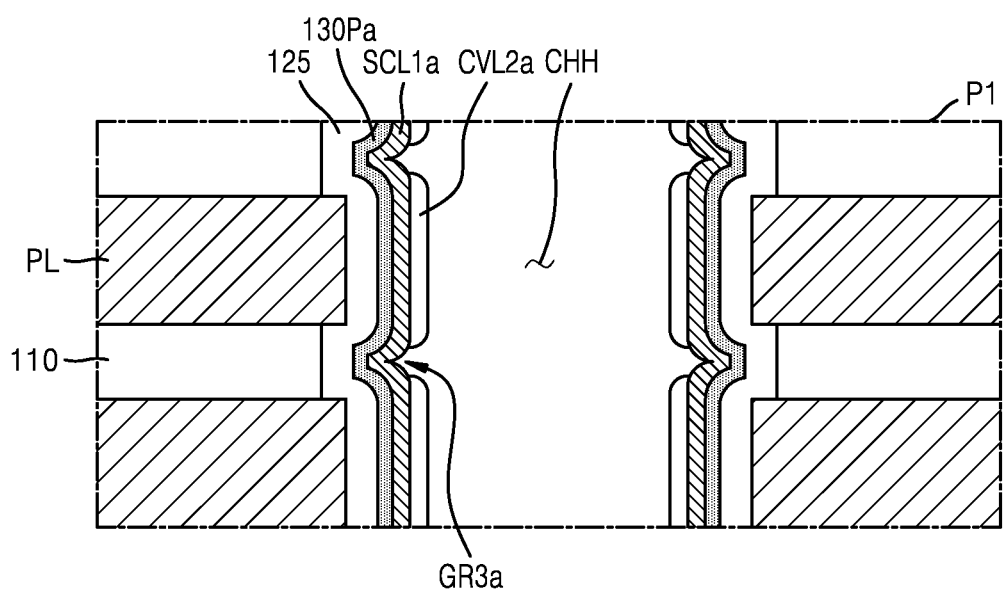

Referring to FIGS. 7D and 7E, a second cover layer CVL2*a* is formed on the first cover sacrificial layer SCL1*a* exposed in the channel hole CHH. The second cover layer CVL2*a* may be formed by oxidizing the first cover sacrificial layer SCL1*a*, and may not be formed on the first cover layer CVL1*a*. After the second cover layer CVL2*a* is formed, the first cover layer CVL1*a* is removed.

Figure 7F:
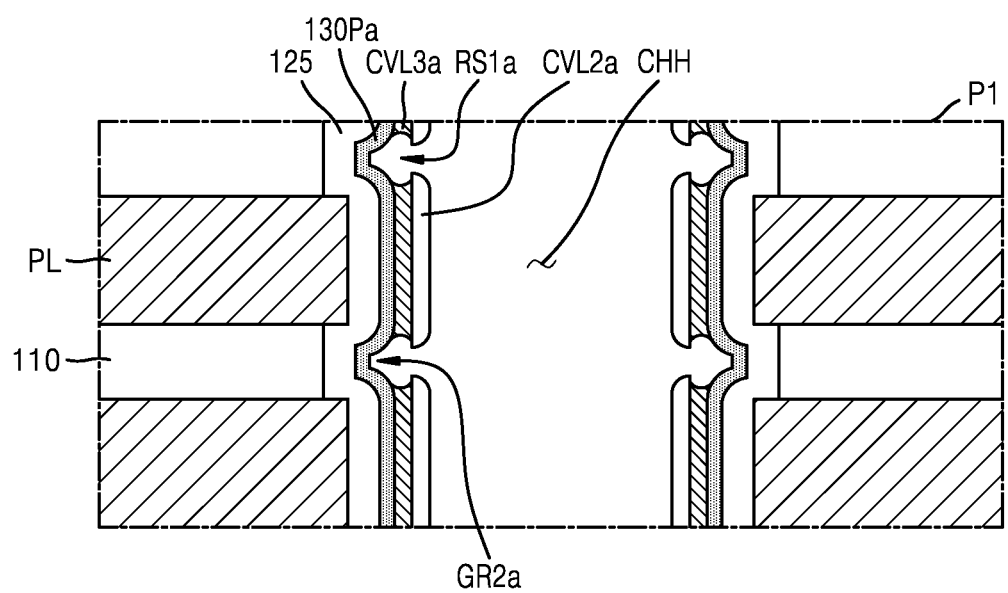

Referring to FIGS. 7E and 7F, a third cover layer CVL3*a* that is a part of the first cover sacrificial layer SCL1*a* and exposes a part of the preliminary charge storage film 130Pa is formed by isotropically etching the first cover sacrificial layer SCL1*a* by using the second cover layer CVL2*a* as an etch mask. The third cover layer CVL3*a* may have a first recess space RS1*a* for exposing the second groove GR2*a* of the preliminary charge storage film 130Pa.

Figure 7G:
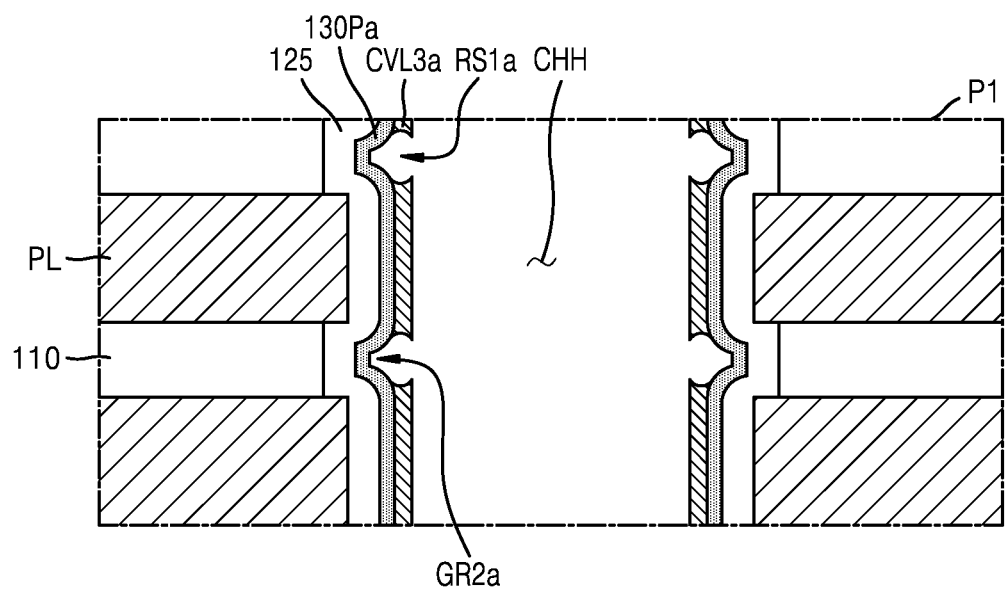
Figure 7H:
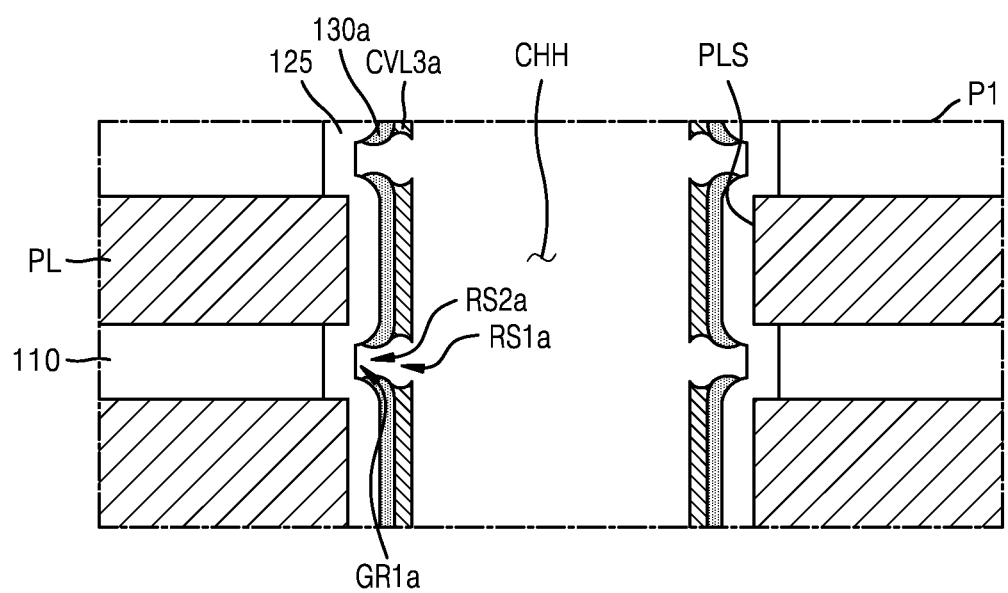

Referring to FIGS. 7F to 7H, after removing the second cover layer CVL2*a*, the charge storage films 130*a* spaced apart from each other by a second recess space RS2*a* communicating with the first recess space RS1*a* are formed by isotropically etching a part of the preliminary charge storage film 130Pa exposed through the first recess space RS1*a* of the third cover layer CVL3*a*. In some embodiments, the second cover layer CVL2*a* may be removed during isotropical etching of a part of the preliminary charge storage film 130Pa or after forming the charge storage films 130*a*.

Each of both ends of each of the charge storage films 130*a* may have a round structure extending toward a first groove GRl*a* on the blocking dielectric film 125.

Figure 7I:
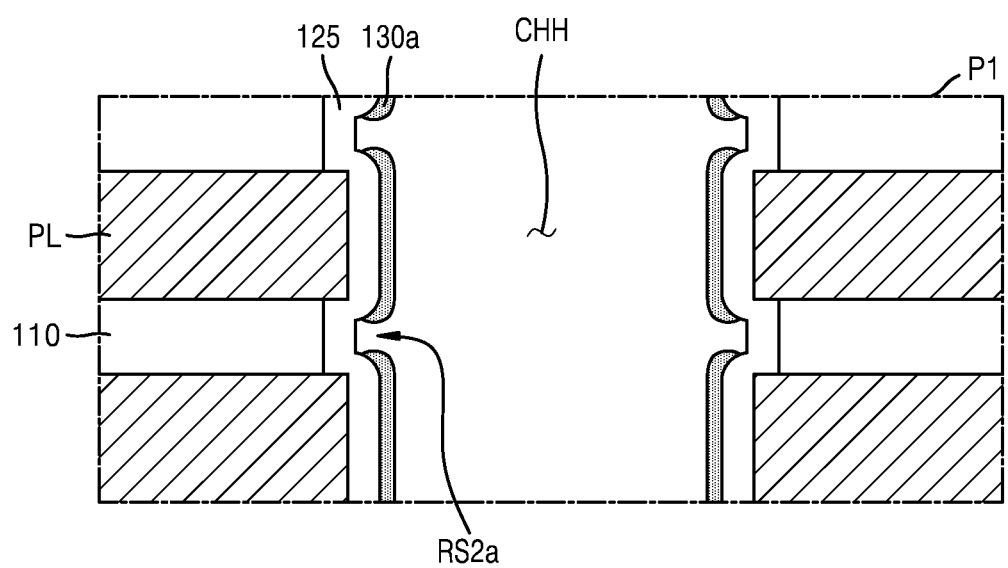
Figure 7J:
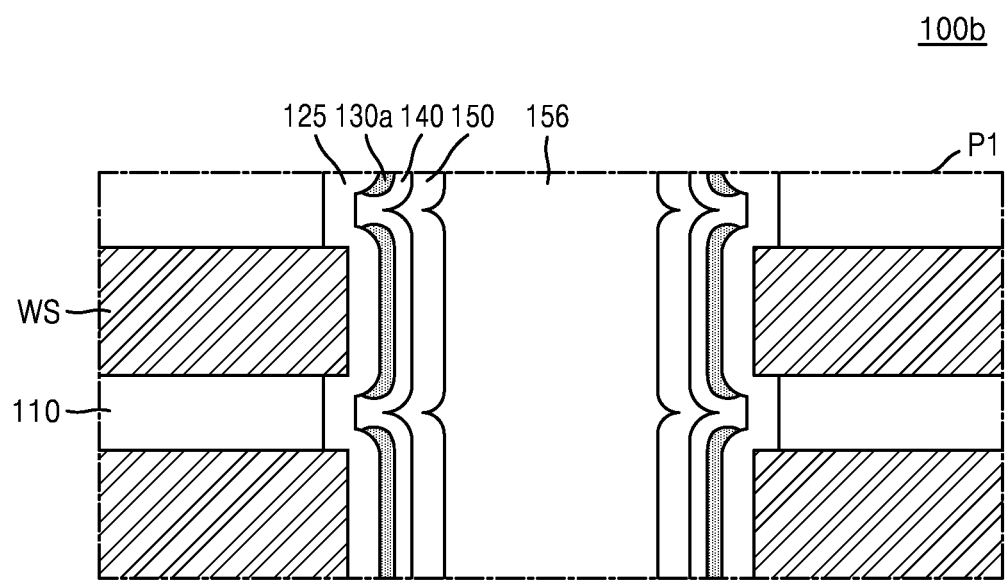

Referring to FIGS. 7I and 7J, after removing the third cover layer of CVL3*a* of FIG. 7H, the tunneling dielectric film 140 covering the charge storage films 130*a* and the blocking dielectric film 125, the channel film 150 covering the tunneling dielectric film 140 and the semiconductor pattern 120, and the buried insulating film 156 filling the channel hole CHH on the channel film 150 are sequentially formed in the channel hole CHH. Then, the word line structures WS filling the space obtained by removing the sacrificial layers PL are formed, and thus an integrated circuit device 100*b* is formed.

Figure 8A:
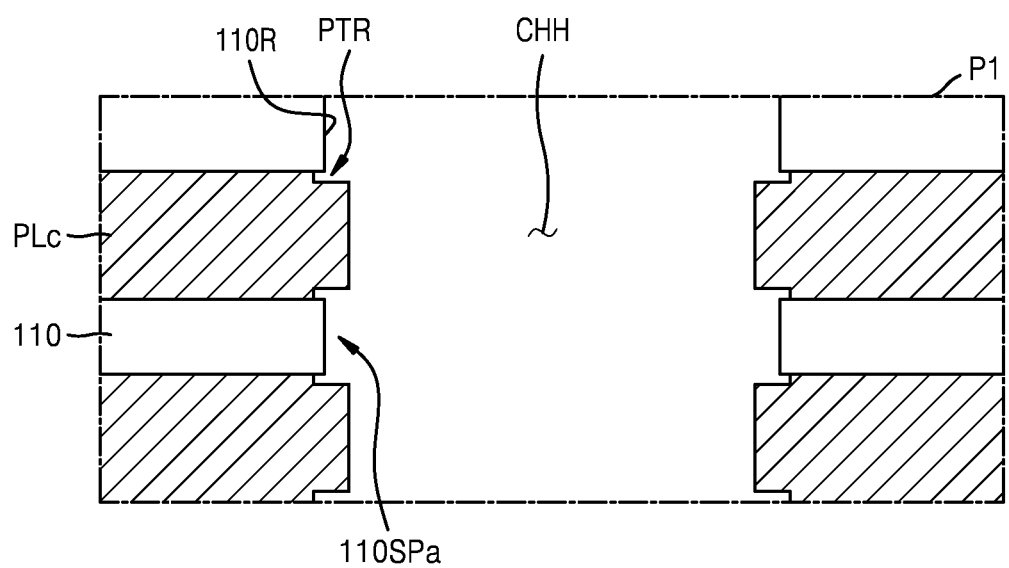

Referring to FIG. 8A, a plurality of sacrificial layers PLc each having a trimmed portion PTR at an end portion thereof facing the channel hole CHH are formed by removing a part of the end portion of each of the sacrificial layers PLc by performing, on the resultant of FIG. 5B, a trimming process of removing a part of the sacrificial layers PL of FIG. 5B exposed in the channel hole CHH. The height of the trimmed portion PTR in the third direction (Z direction) may be less than the other part of the sacrificial layers PLc.

The height of an indent space 110SPa defined by the bottom surface and the upper surface of the sacrificial layers PLc and the recessed side wall 110R of the insulating film 110 in the third direction (Z direction) may be greater than the height of the indent space 110SP of FIG. 5B.

Figure 8B:
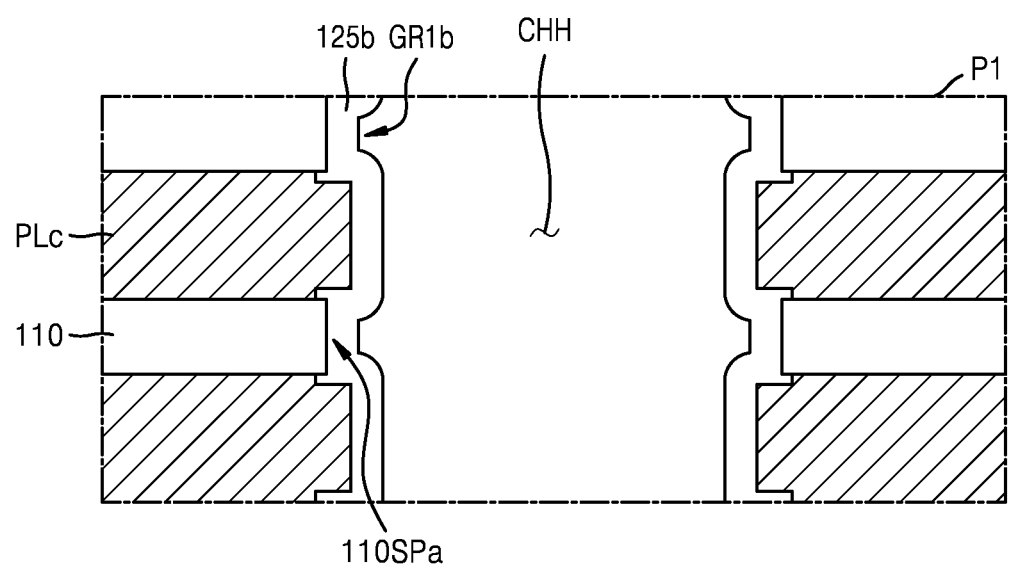

Referring to FIG. 8B, a blocking dielectric film 125*b* having a first groove GR1*b* and covering the surfaces of the insulating films 110 and the sacrificial layers PLc exposed in the channel hole CHH is formed.

Figure 8C:
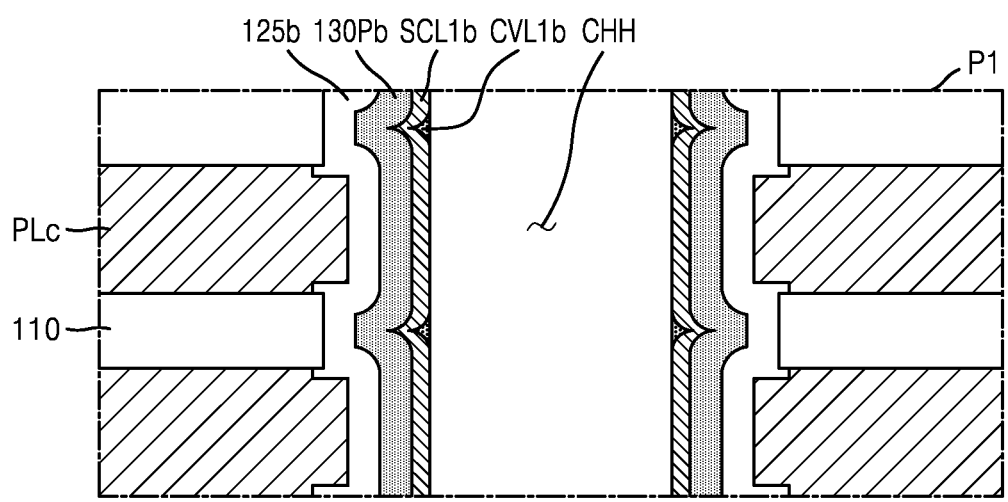

Referring to FIG. 8C, a preliminary charge storage film 130Pb, a first cover sacrificial layer SCL1*b*, and a first cover layer CVL1*b* are sequentially formed on the blocking dielectric film 125*b* in the channel hole CHH by performing a process similar to that illustrated in FIGS. 5D to 5G.

Figure 8D:
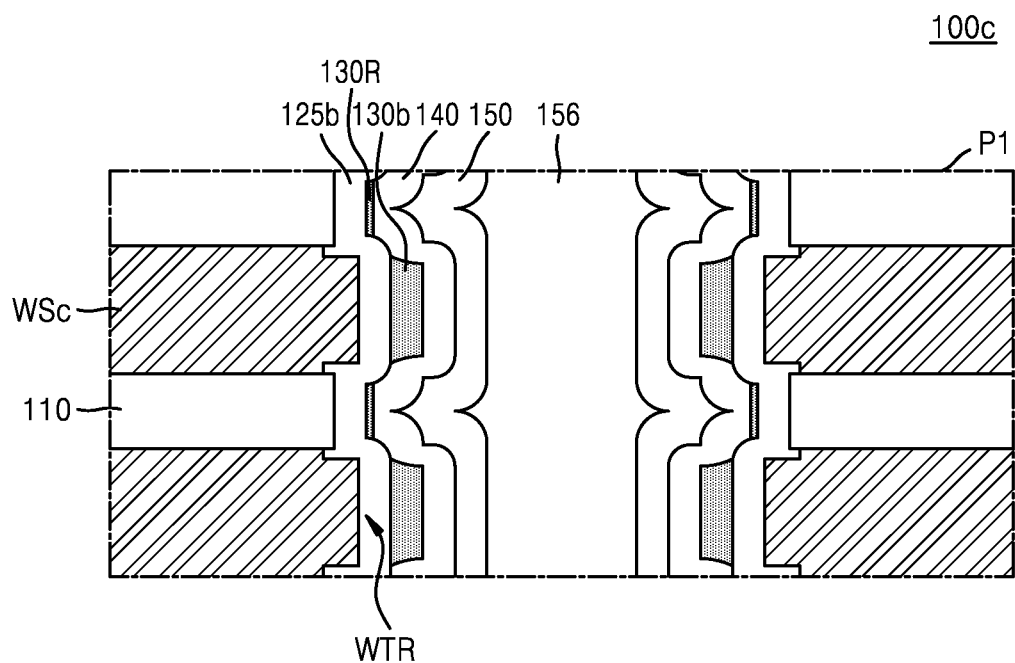

Referring to FIG. 8D, a charge storage film 130*b*, the tunneling dielectric film 140, the channel film 150, and the buried insulating film 156 are sequentially formed on the blocking dielectric film 125B by performing a process similar to that illustrated in FIGS. 5H to 5P. Then, a plurality of word line structures WSc filling the space obtained by removing the sacrificial layers PLc of FIG. 8C are formed, and thus an integrated circuit device 100*c* is formed. Each of the word line structures WSc may have a trimmed portion WTR having a height in the third direction (Z direction) less than that of the other part of word line structures WSc at the end portion thereto facing the channel film 150.

Figure 9A:
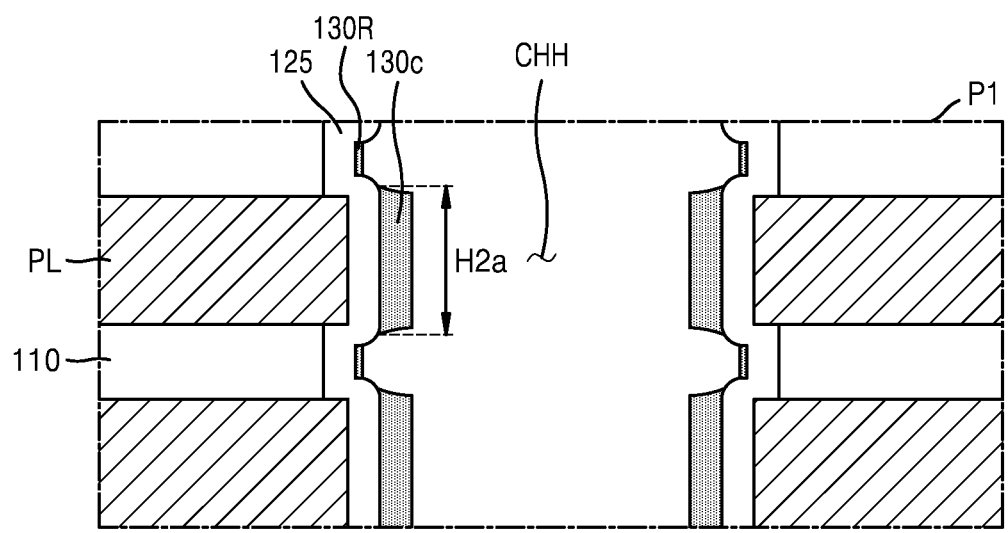

Referring to FIG. 9A, a plurality of charge storage films 130*c* are formed on the blocking dielectric film 125 by performing a process similar to that illustrated in FIGS. 5A to 5M. The charge storage films 130*c* may be formed by removing a relatively small amount of a part of the preliminary charge storage film 130P of FIGS. 5J, compared to the process of forming the charge storage films 130 of FIG. 5L. A second height H2*a* of the charge storage films 130*c* in the third direction (Z direction) may be greater than the second height H2 of the charge storage films 130*c* of FIG. 4A.

Figure 9B:
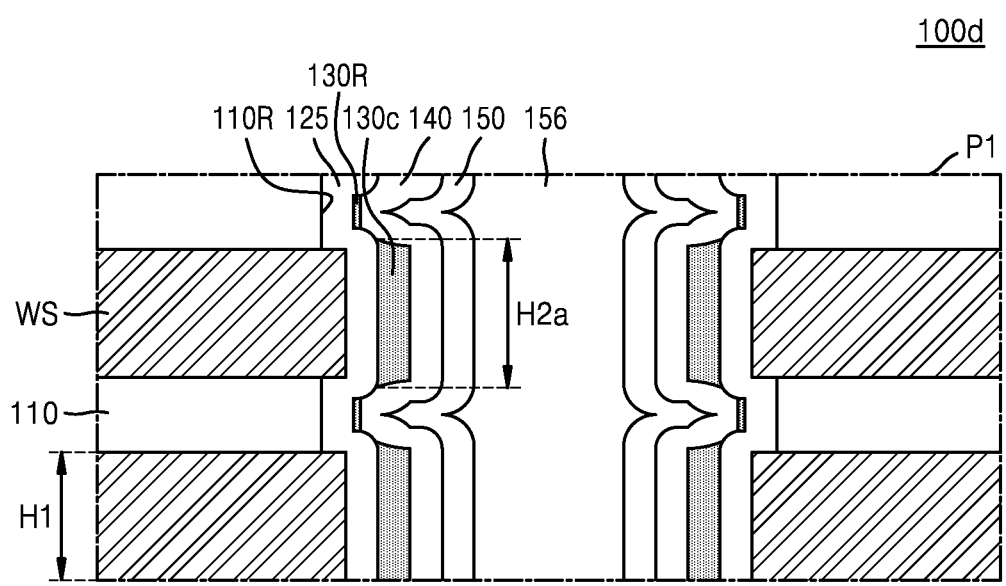

Referring to FIG. 9B, the tunneling dielectric film 140, the channel film 150, and the buried insulating film 156 are sequentially formed on the blocking dielectric film 125 and the charge storage films 130c by performing a process similar to that illustrated in FIGS. 5N to 5P. Then, the word line structures WS for filling the space obtained by removing a plurality of sacrificial layers PL of FIG. 9B are formed, and thus an integrated circuit device 100d is formed.

In some embodiments, the first height H1 of the word line structures WS in the third direction (Z direction) may be less than the second height H2a of the charge storage films 130c.

Figure 10A:
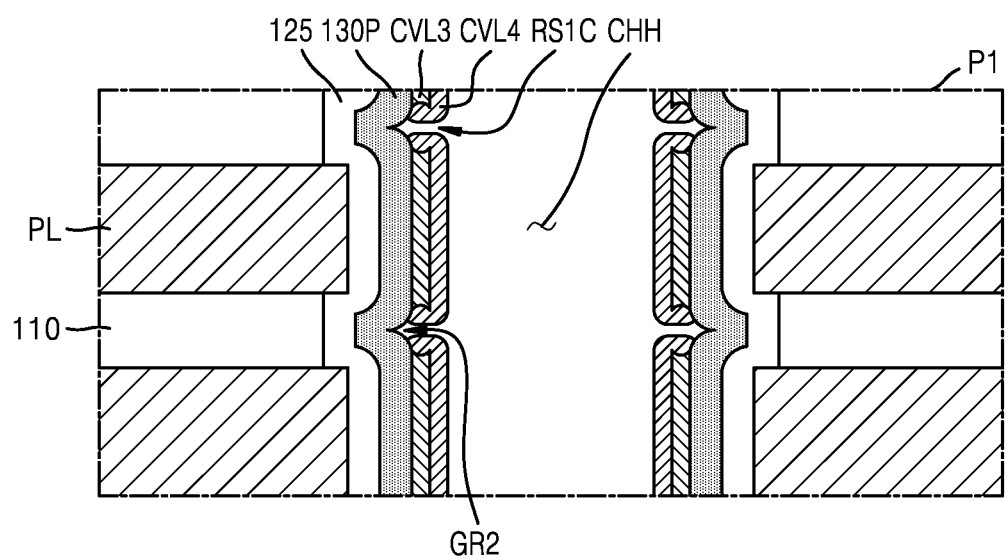

Referring to FIG. 10A, with respect to the resultant of FIG. 5K, a fourth cover layer CVL4 is formed on the third cover layer CVL3. The fourth cover layer CVL4 may be formed on the third cover layer CVL3 by the SEG process or a selective deposition process. The fourth cover layer CVL4 may include, for example, polysilicon.

The fourth cover layer CVL4 may have a first recess space RS for exposing the second groove GR2 of the preliminary charge storage film 130P. As the first recess space RS1C is a space left after filling the fourth cover layer CVL4 in the first recess space RS1 illustrated in FIG. 5K, the first recess space RS1 illustrated in FIG. 5K may be reduced by forming the fourth cover layer CVL4.

Figure 10B:
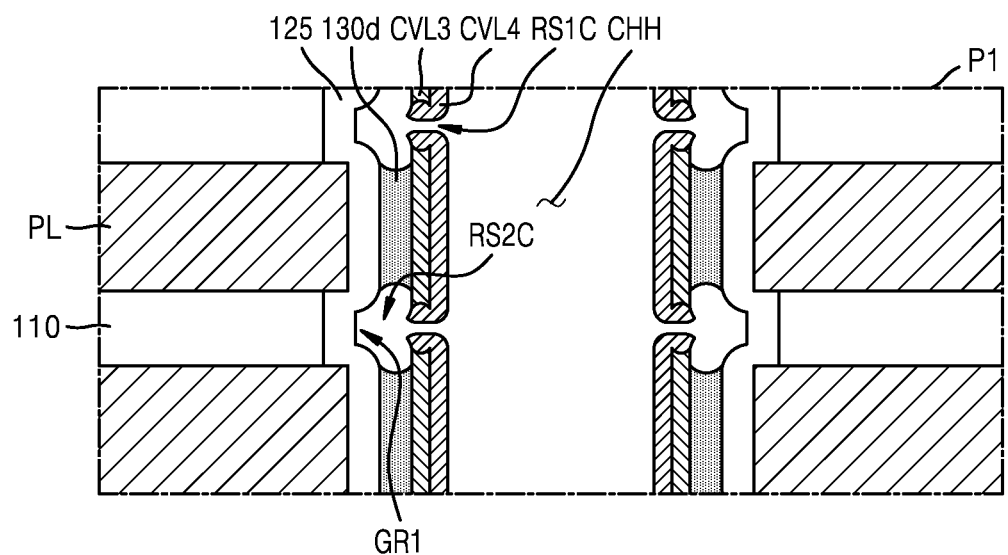
Figure 10C:
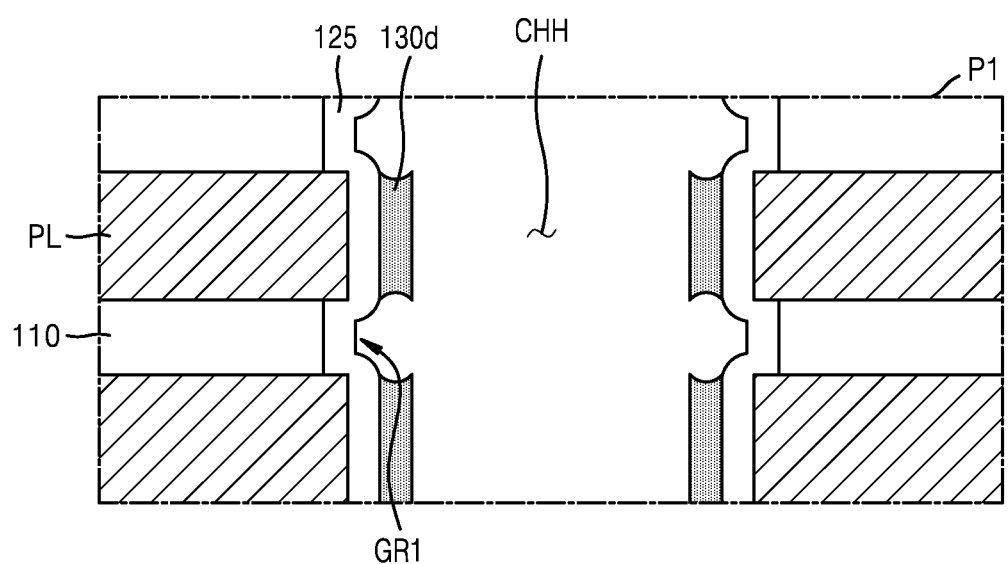

Referring to FIGS. 10B and 10C, after forming a plurality of charge storage films 130d spaced apart from each other by a second recess space RS2C communicating with the first recess space RS1C by isotropically etching a part of the preliminary charge storage film 130P of FIG. 10A exposed through the first recess space RS1C of the fourth cover layer CVL4, the third cover layer CVL3 and the fourth cover layer CVL4 are removed.

In some embodiments, each of the charge storage films 130d may have a shape that both ends, that is, an upper surface and a bottom surface thereof, are concave in the third direction (Z direction).

Figure 10D:
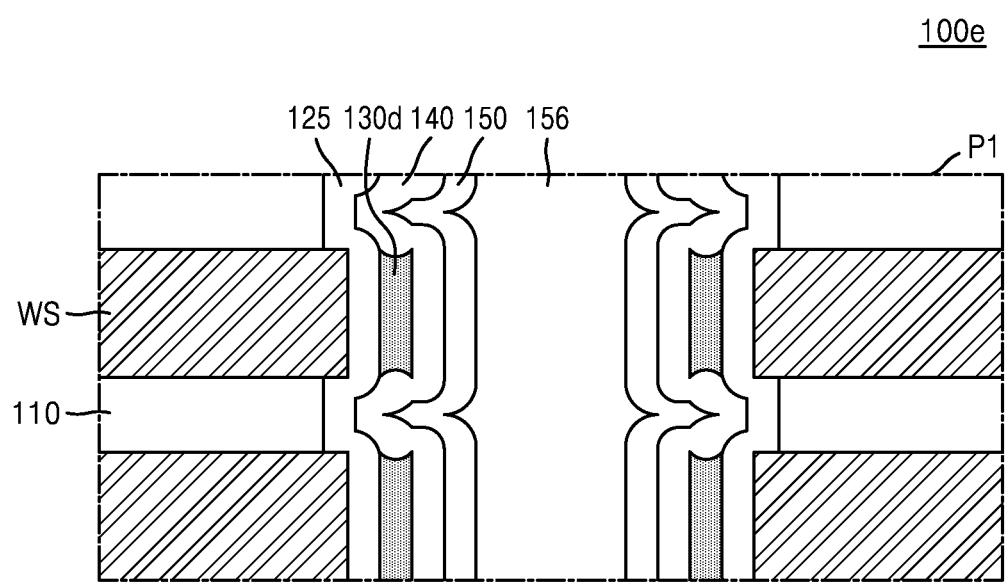

Referring to FIG. 10D, by performing a process similar to that illustrated in FIGS. 5N to 5P, the tunneling dielectric film 140, the channel film 150, and the buried insulating film 156 are sequentially formed on the blocking dielectric film 125 and the charge storage films 130d. Then, the word line structures WS filling the space obtained by removing the sacrificial layers PL of FIG. 10C are formed, and thus an integrated circuit device 100e is formed.

Figure 11:
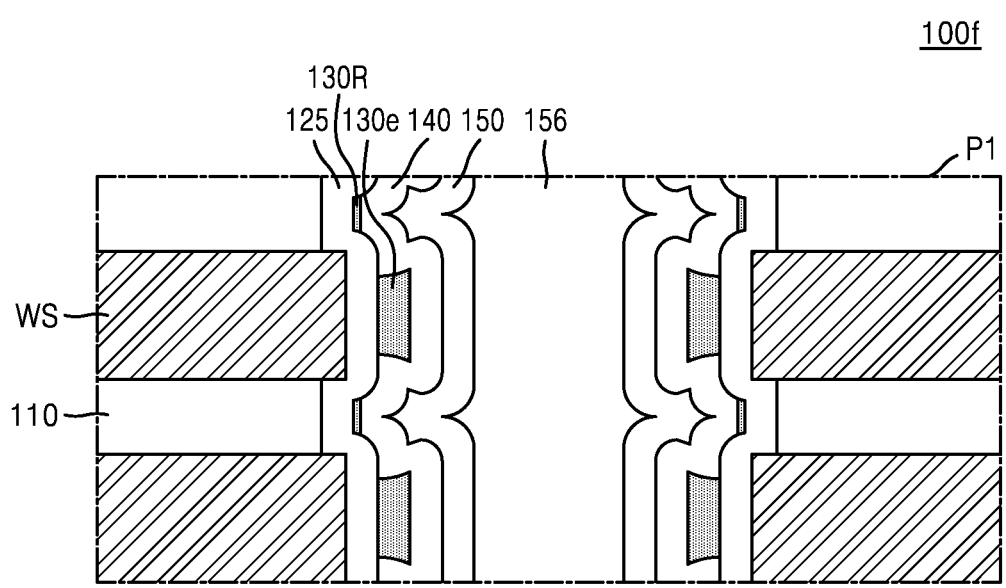

Referring to FIG. 11, an integrated circuit device 100f may include a charge storage film 130e. The charge storage film 130e of the integrated circuit device 100f may have a shape different from the charge storage film 130 of the integrated circuit device 100 illustrated in FIG. 4A.

In some embodiments, the height of the charge storage film 130e in the third direction (Z direction) may decrease from the channel film 150 toward the word line structures WS. For example, the height of a side wall of the charge storage film 130e facing the word line structures WS in the third direction (Z direction) may be less than the height of a side wall of the charge storage film 130e, in the third direction (Z direction), facing the channel film 150.

Figure 12A:
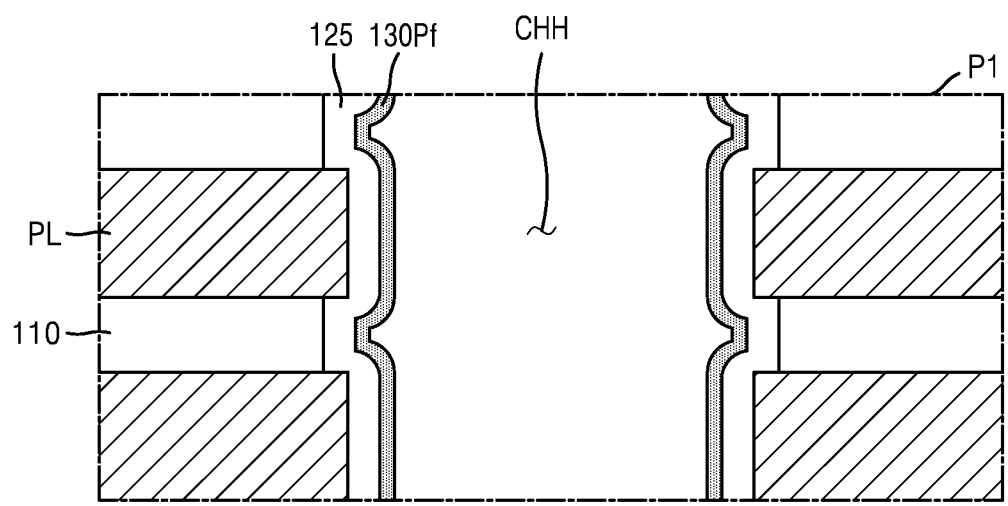
Figure 12B:
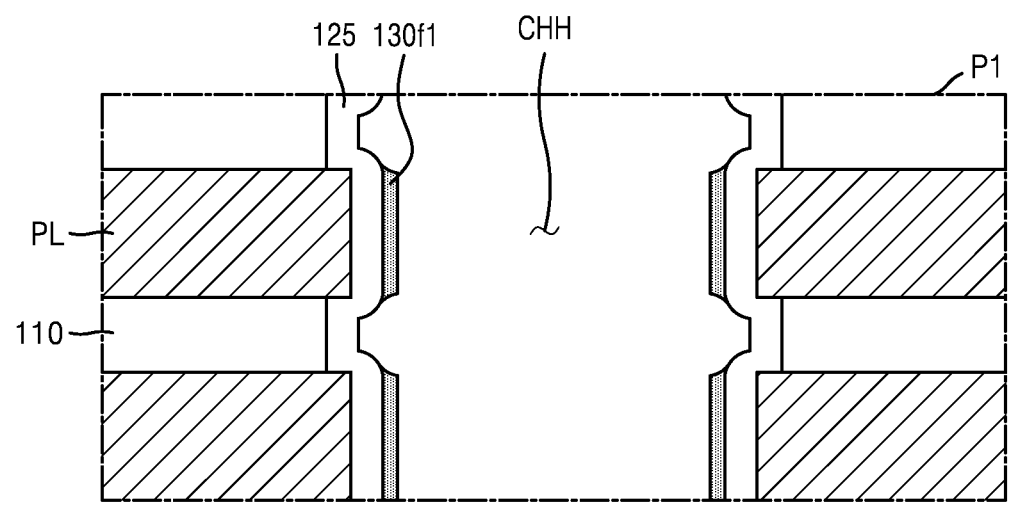

Referring to FIGS. 12A and 12B, a preliminary charge storage film 130Pf covering the blocking dielectric film 125 in the channel hole CHH is formed. The preliminary charge storage film 130Pf may have a relatively small thickness compared to the preliminary charge storage film 130P of FIG. 5D.

Then, a first layer 130f1 is formed by etching a part of the preliminary charge storage film 130Pf by performing a process similar to that illustrated in FIGS. 5E to 5M.

Figure 12C:
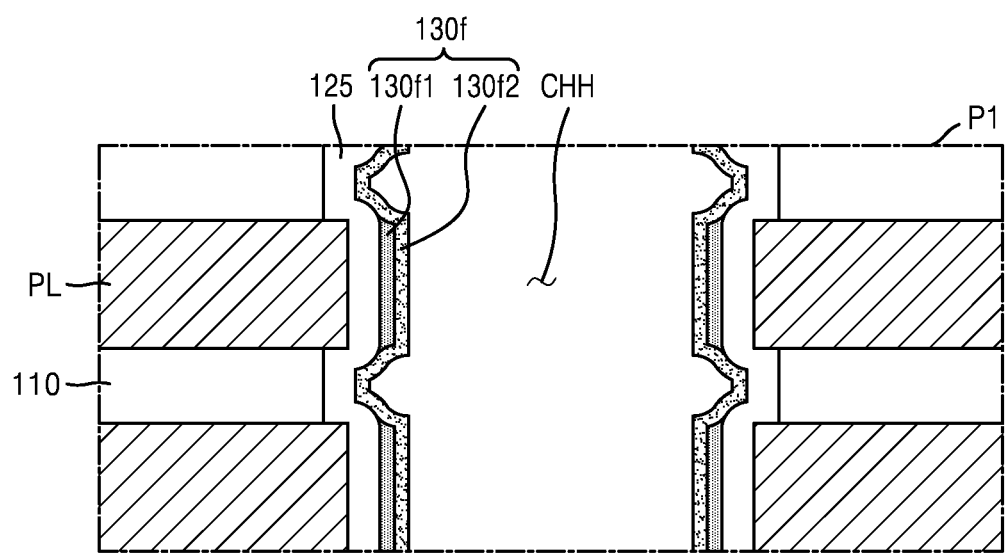

Referring to FIG. 12C, a second layer 130f2 conformally covering the blocking dielectric film 125 and the first layer 130f1 in the channel hole CHH is formed, and thus a charge storage film 130f including the first layer 130f1 and the second layer 130f2 is formed. The first layer 130f1 may be surrounded by the second layer 130f2 and the blocking dielectric film 125. The second layer 130f2 may surround an upper surface, a bottom surface, and a side wall of the first layer 130f1, the side wall facing the channel film 150. In some embodiments, the second layer 130f2 may extend on an upper surface, a bottom surface, and a side wall of the first layer 130f1 that face the channel film 150.

The charge storage film 130f may have a stack structure of the first layer 130f1 and the second layer 130f2 roughly on the same level as the sacrificial layers PL and may include only the second layer 130f2 roughly on the same level as the insulating films 110. In other words, the second layer 130f2 may cover the blocking dielectric film 125 and the first layer 130f1 and extend in the third direction (Z direction) with bent portions. The width of the charge storage film 130f in the horizontal direction roughly at the same level as the sacrificial layers PL may be greater than the width thereof in the horizontal direction roughly at the same level as the insulating films 110. In some embodiments, a first portion of the charge storage film 130f on a side of the sacrificial layer PL may include both the first layer 130f1 and the second layer 130f2, and a second portion of the charge storage film 130f on a side of the insulating film 110 may include only the first layer 130f1, as illustrated in FIG. 12C. Accordingly, the first portion of the charge storage film 130f may have a first width in the first direction (X direction) wider than a second width of the second portion of the charge storage film 130f in the first direction (X direction).

In some embodiments, the first layer 130f1 and the second layer 130f2 may include the same material. In some embodiments, the first layer 130f1 and the second layer 130f2 may include materials different from each other. For example, each of the first layer 130f1 and the second layer 130f2 may include any one of a silicon nitride film and polysilicon.

Figure 12D:
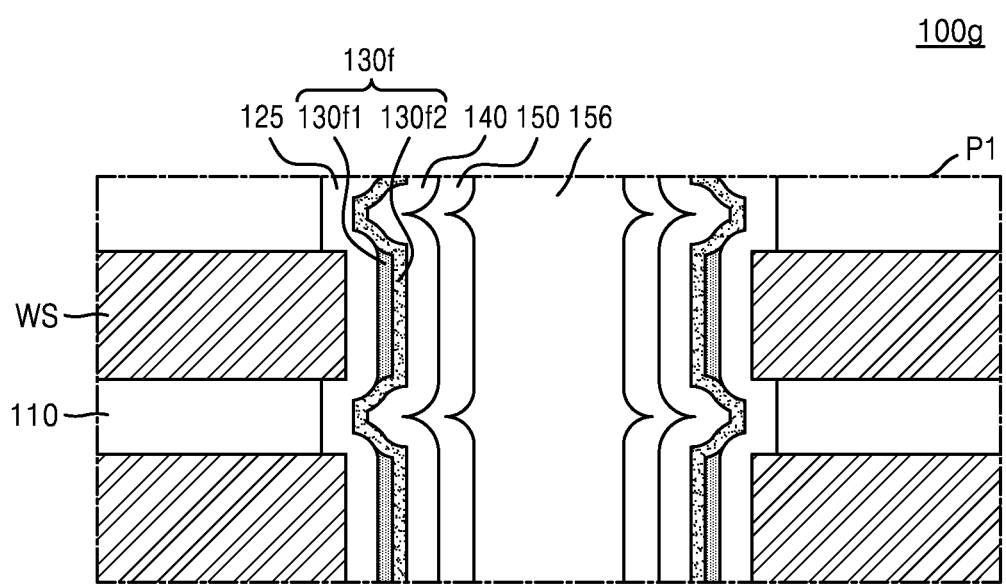

Referring to FIG. 12D, by performing a process similar to that illustrated in FIGS. 5N to 5P, the tunneling dielectric film 140, the channel film 150, and the buried insulating film 156 are sequentially formed on the blocking dielectric film 125 and the charge storage film 130f. Then, the word line structures WS filling the space obtained by removing the sacrificial layers PL of FIG. 12C are formed, and thus an integrated circuit device 100g is formed.

Figure 13:
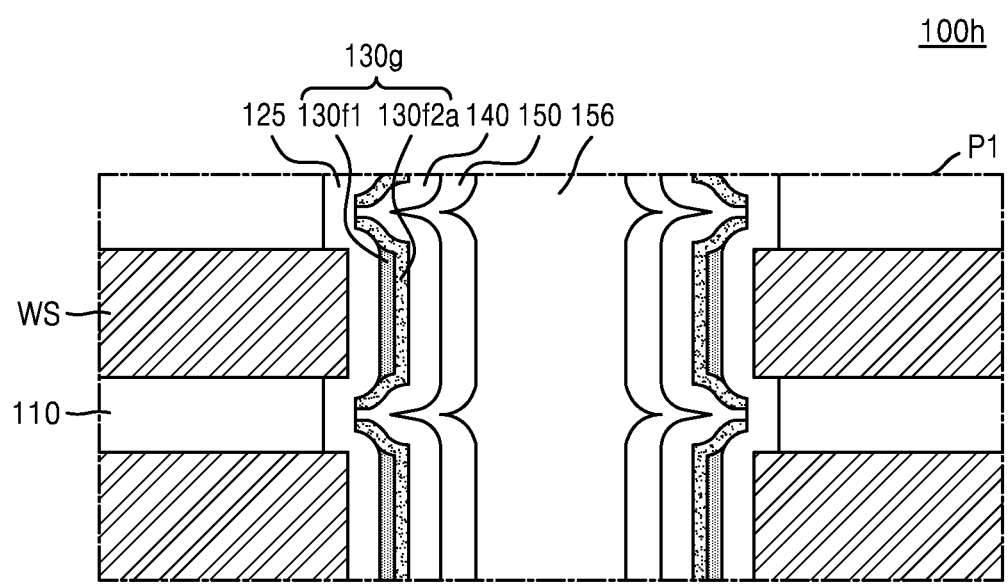

Referring to FIG. 13, an integrated circuit device 100h may include a charge storage film 130g. In the charge storage film 130g of the integrated circuit device 100h, unlike the charge storage film 130f of the integrated circuit device 100g illustrated in FIG. 12D, portions respectively corresponding to the word line structures WS may be spaced apart from each other.

The charge storage film 130g may include the first layer 130f1 and a second layer 130f2a. In the second layer 130f2a, unlike the second layer 130f2 illustrated in FIG. 12D, portions respectively corresponding to the word line structures WS may be spaced apart from each other. The first layer 130f1 may be surrounded by the second layer 130f2a and the blocking dielectric film 125. The second layer 130f2a may surround an upper surface, a bottom surface, and a side wall of the first layer 130f1, the side wall facing the channel film 150. In some embodiments, the second layer 130f2a may extend on an upper surface, a bottom surface, and a side wall of the first layer 130f1 that face the channel film 150.

Figure 14A:
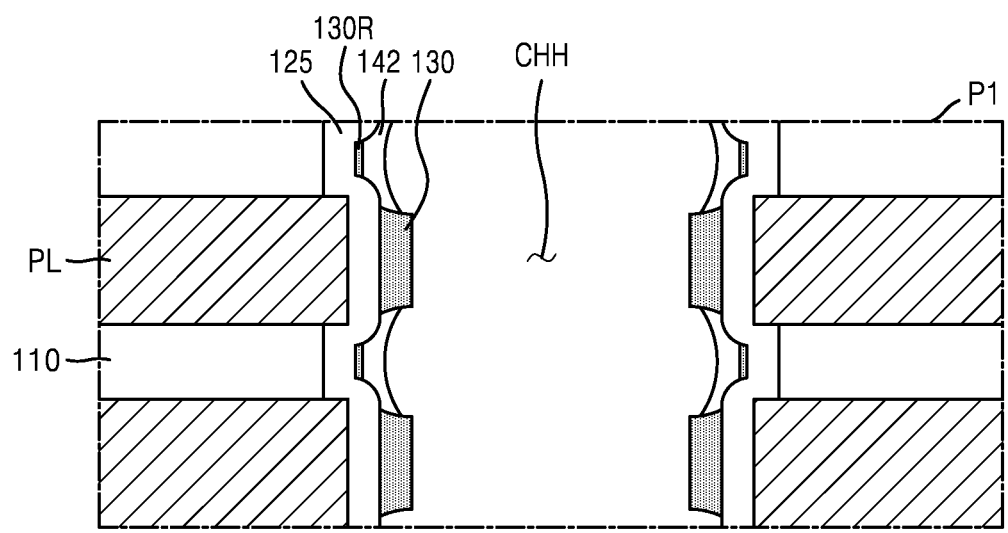

Referring to FIG. 14A, with respect to the resultant of FIG. 5M, a relief insulating film 142 filling a part of the second recess space RS2 of FIG. 5M is formed. The relief insulating film 142 forms a relief insulating material layer covering the blocking dielectric film 125 and the charge storage film 130 in the channel hole CHH. Then, a part of the relief insulating material layer is removed by anisotropic etching to remain only in the second recess space RS2. The relief insulating film 142 may relieve a step between the surfaces of the blocking dielectric film 125 and the charge storage film 130 exposed in the channel hole CHH.

Figure 14B:
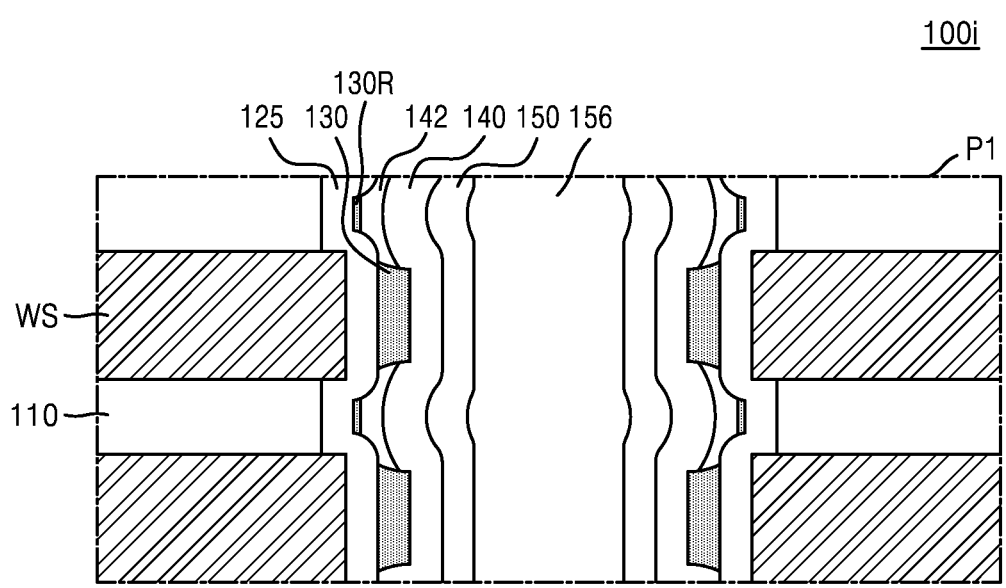

Referring to FIG. 14B, the tunneling dielectric film 140, the channel film 150, and the buried insulating film 156 are sequentially formed on the relief insulating film 142 and the charge storage film 130 by performing a process similar to that illustrated in FIGS. 5N to 5P. Then, the word line structures WS filling the space obtained by removing the sacrificial layers PL of FIG. 14A are formed, and thus an integrated circuit device 100i is formed.

Figure 15:
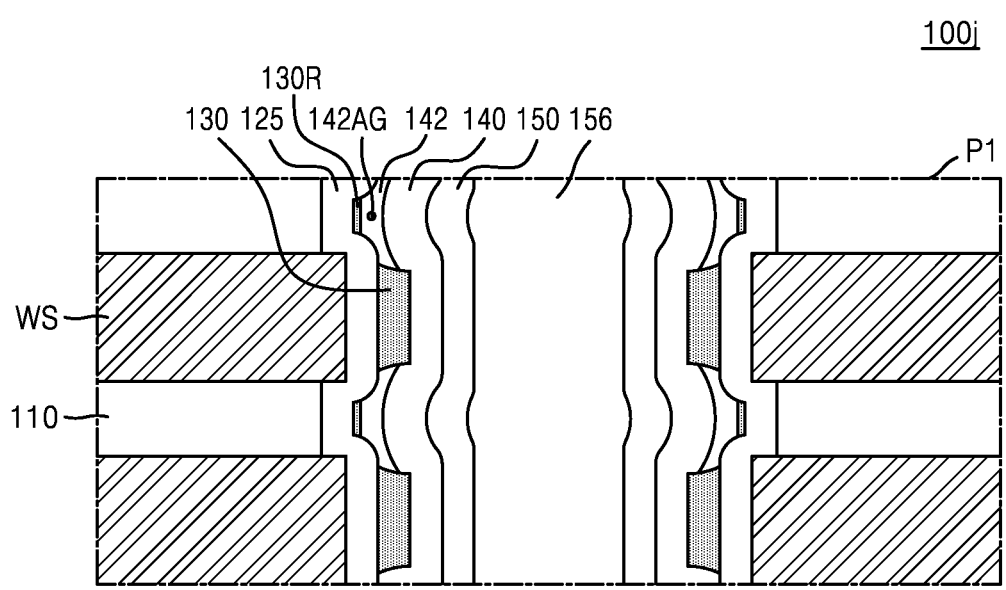

Referring to FIG. 15, the relief insulating film 142 of an integrated circuit device 100j may include a second air gap 142AG therein.

Figure 16A:
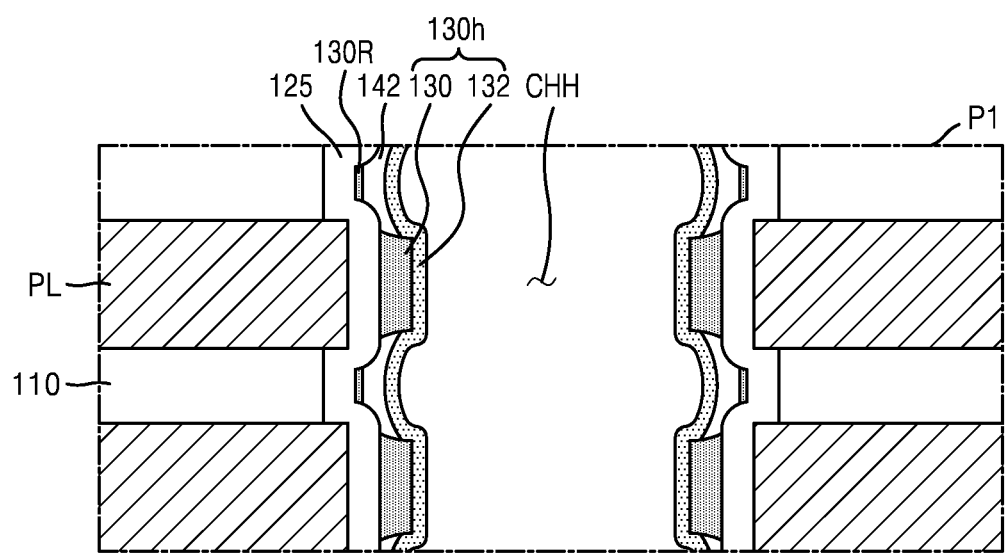

Referring to FIG. 16A, with respect to the resultant of FIG. 14A, a cover charge storage film 132 covering the charge storage film 130 and the relief insulating film 142 is formed, and thus an extended charge storage film 130h including the charge storage film 130 and the cover charge storage film 132 is formed.

Figure 16B:
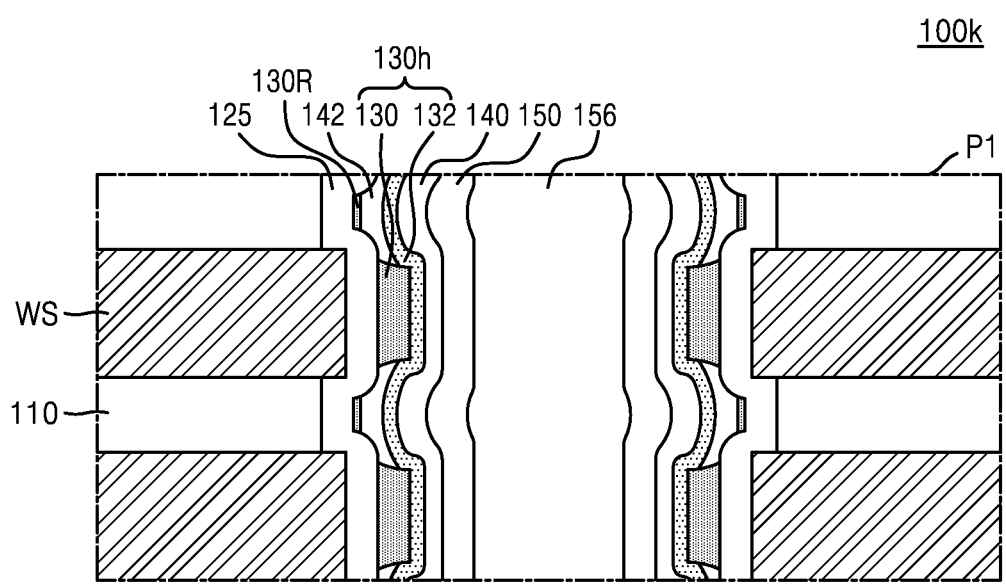

Referring to FIG. 16B, the tunneling dielectric film 140, the channel film 150, and the buried insulating film 156 are sequentially formed on the extended charge storage film 130h by performing a process similar to that illustrated in FIGS. 5N to 5P. Then, the word line structures WS filling the space obtained by removing the sacrificial layers PL of FIG. 16A are formed, and thus an integrated circuit device 100k is formed.

The extended charge storage film 130h including the charge storage film 130 and the cover charge storage film 132 may correspond to the charge storage film 130f including the first layer 130f1 and the second layer 130f2 illustrated in FIG. 12D. The integrated circuit device 100k may be similar to one in which the relief insulating film 142 is inserted between the blocking dielectric film 125 and the second layer 130f2 in the integrated circuit device 100g illustrated in FIG. 12D.

Figure 17:
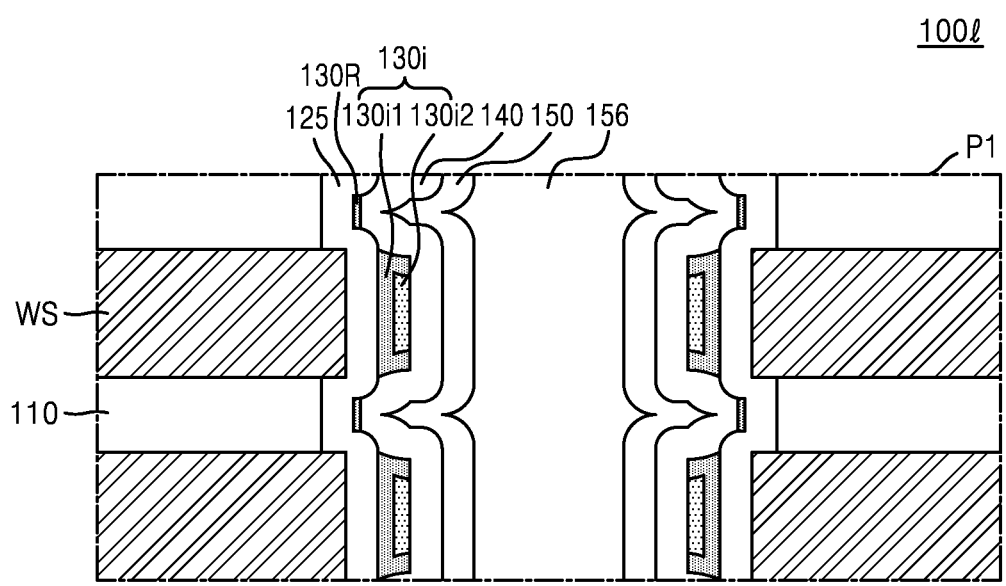

Referring to FIG. 17, an integrated circuit device 100l may include a charge storage film 130i including a first layer 130i1 and a second layer 130i2.

In some embodiments, the first layer 130i1 and the second layer 130i2 may include the same material. In some embodiments, the first layer 130i1 and the second layer 130i2 may include materials different from each other. For example, each of the first layer 130i1 and the second layer 130i2 may include any one of a silicon nitride film and polysilicon.

The second layer 130i2 may be surrounded by the first layer 130i1 and the tunneling dielectric film 140. The first layer 130i1 may surround an upper surface, a bottom surface, and a side wall of the second layer 130i2, the side wall facing the word line structures WS. In some embodiments, the first layer 130i1 may extend on an upper surface, a bottom surface, and a side wall of the second layer 130i2 that faces the word line structures WS.

In some embodiments, the first layer 130i1 may be formed, with respect to the resultant of FIG. 5D, by filling the second groove GR2, forming a cover pattern covering a peripheral part of the second groove GR2 of the preliminary charge storage film 130P, and then removing the part of the preliminary charge storage film 130P by using the cover pattern as an etch mask. The second layer 130i2 may be formed by filling a part where the part of the preliminary charge storage film 130P is removed.

Figure 18:
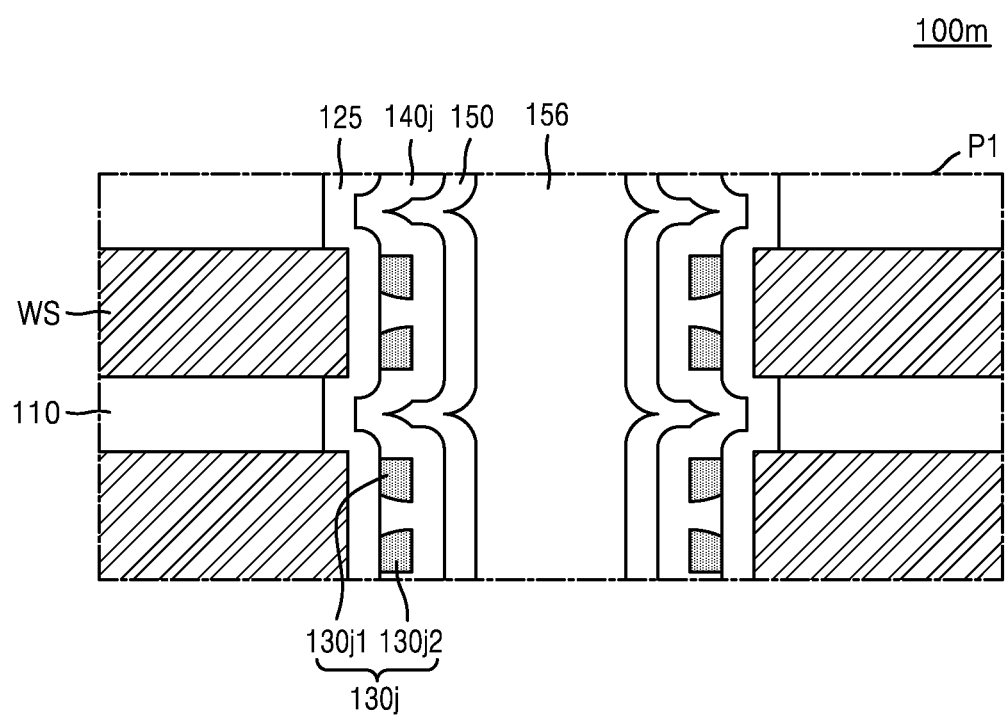

Referring to FIG. 18, an integrated circuit device 100m may include a charge storage film 130j that includes a first part 130j1 and a second part 130j2. In some embodiments, the first part 130j1 and the second part 130j2 may include the same material.

The first part 130j1 and the second part 130j2 forming the charge storage film 130j corresponding to one of the word line structures WS may be spaced apart from each other in the third direction (Z direction).

In some embodiments, the first part 130j1 and the second part 130j2 are formed by removing the charge storage film 130 illustrated in FIG. 5L after filling the space between the blocking dielectric film 125 and the third cover layer CVL3, with respect to the resultant of FIG. 5L.

Figure 19:
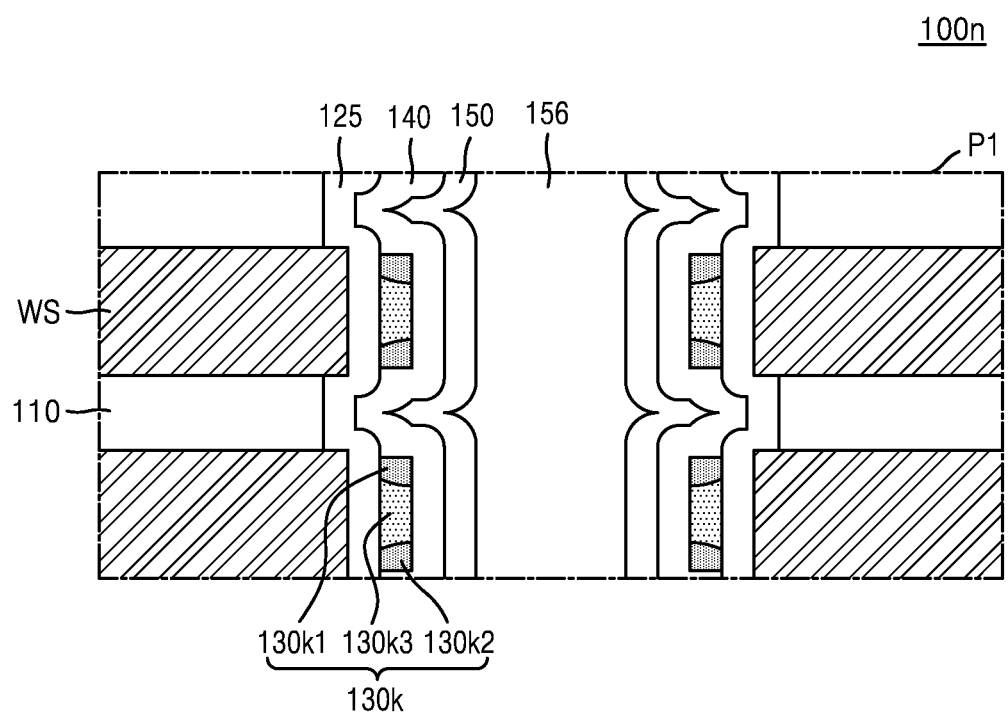

Referring to FIG. 19, an integrated circuit device 100n may include a charge storage film 130k that includes a first part 130k1, a second part 130k2, and a third part 130k3.

The first part 130k1 and the second part 130k2 forming the charge storage film 130k corresponding to one of the word line structures WS may be spaced apart from each other in the third direction (Z direction). The third part 130k3 may fill the space between the first part 130k1 and the second part 130k2. The first part 130k1 and the second part 130k2 may be in contact with an upper surface and a bottom surface of the third part 130k3, respectively.

In some embodiments, the first part 130k1 and the second part 130k2 may be formed by a method similar to that used for the first part 130j1 and the second part 130j2 illustrated in FIG. 18, and the third part 130k3 may be a part that is not removed from the charge storage film 130 illustrated in FIG. 5L.

In some embodiments, the first part 130k1, the second part 130k2 and the third part 130k3 may include the same material. In some embodiments, the first part 130k1 and the second part 130k2 may include the same material, and the third part 130k3 may include a material different from that of the first part 130k1 and the second part 130k2.

Figure 20:
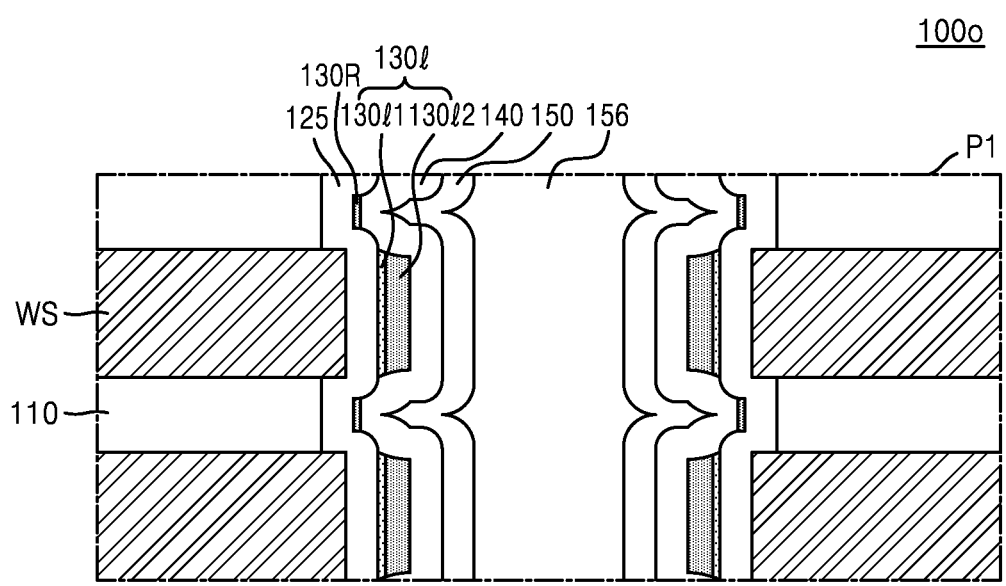

Referring to FIG. 20, an integrated circuit device 100o may include a charge storage film 130l that includes a first layer 130l1 and a second layer 130l2.

In some embodiments, the first layer 130l1 and the second layer 130l2 may be formed by performing the process described with reference to FIGS. 5E to 5M after forming the preliminary the charge storage film 130 illustrated in FIG. 5D to have a stack structure of a preliminary first layer and a preliminary second layer.

In some embodiments, the first layer 130l1 and the second layer 130l2 may include the same material. In some embodiments, the first layer 130l1 and the second layer 130l2 may include materials different from each other.

A side wall of the first layer 130l1 facing the channel film 150 and a side wall of the second layer 130l2 facing the word line structures WS2 may be in contact with each other.

In the integrated circuit devices 100, 100a, 100b, 100c, 100d, 100e, 100f, 100g, 100h, 100i, 100j, 100k, 100l, 100m, 100n, and 100o according to the present inventive concept, as the charge storage films 130, 130a, 130b, 130c, 130d, 130e, 130f, 130g, 130h, 130i, 130j, 130k, and 130l are formed in the channel hole CHH and the heights and/or thicknesses of the charge storage films 130, 130a, 130b, 130c, 130d, 130e, 130f, 130g, 130h, 130i, 130j, 130k, and 130l are variously implemented, a sufficient amount of charges may be stored in the memory cells and generation of interference between the adjacent memory cells may be reduced.

Figure 21:
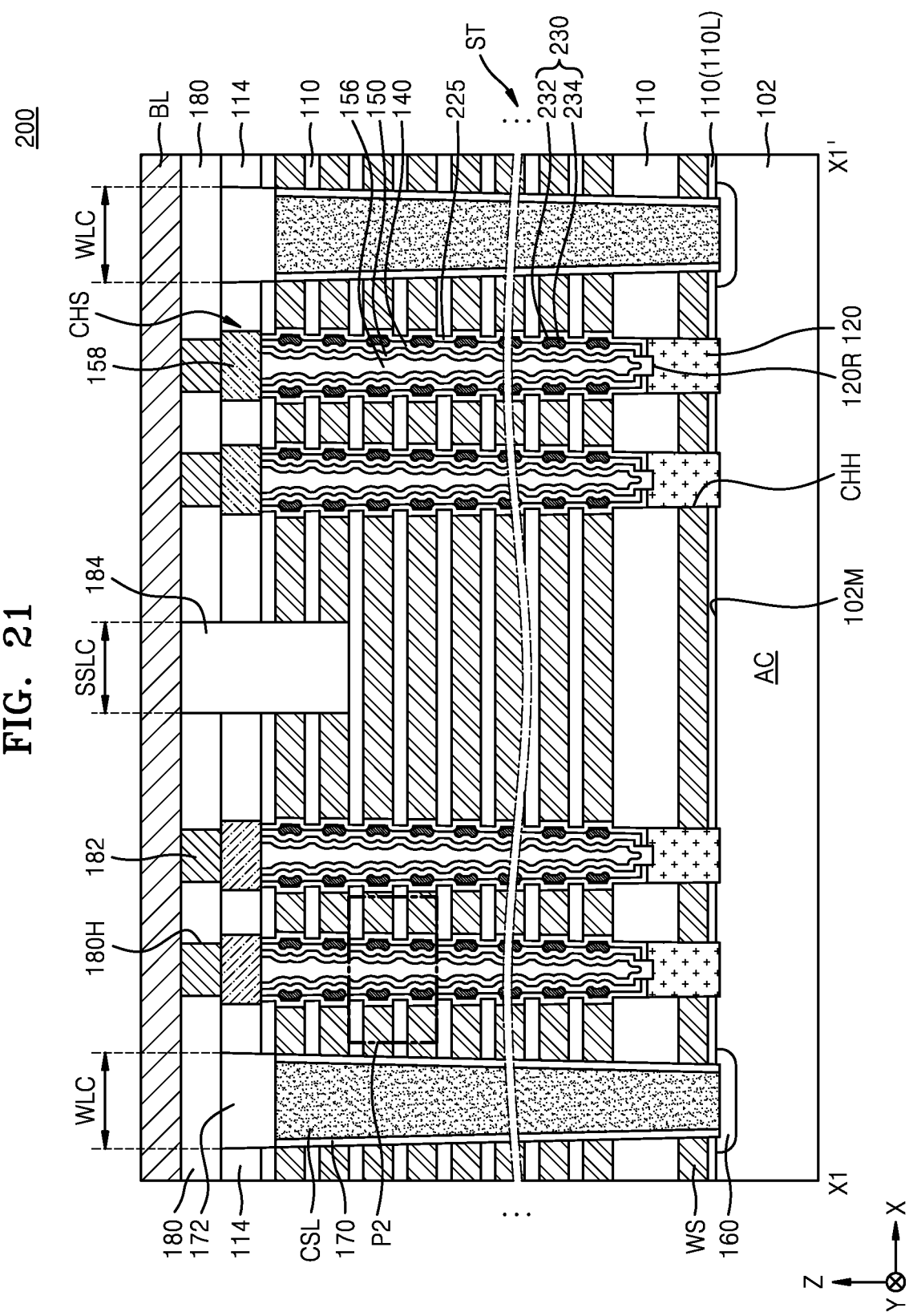
FIG. 21 is a cross-sectional view of an integrated circuit device according to some embodiments of the present inventive concept; in detail.
Figure 22:
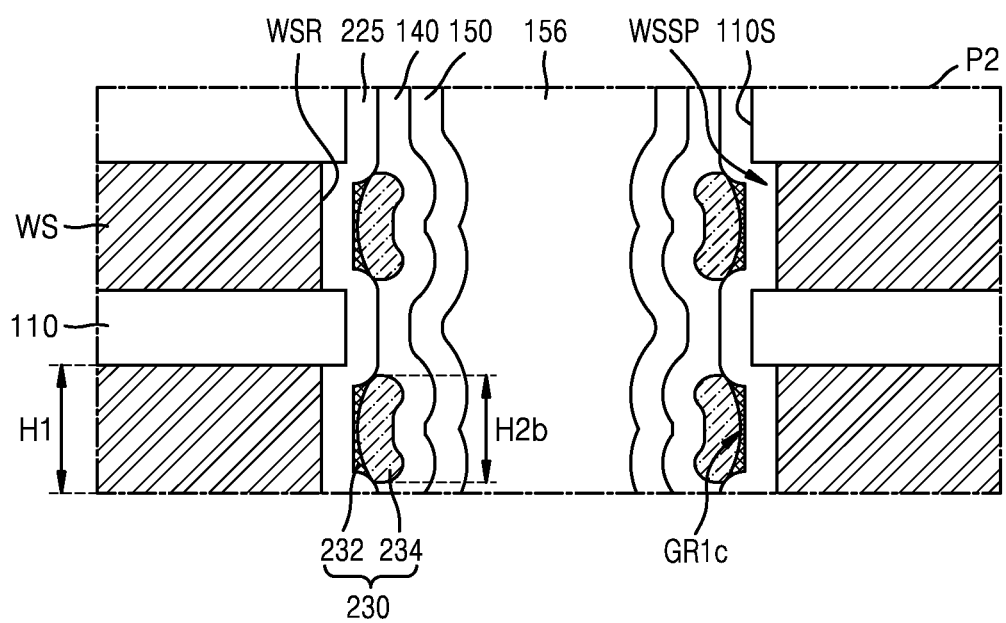
FIG. 22 is an enlarged cross-sectional view of an area P2 of FIG. 21.

FIG. 21 is a cross-sectional view of an integrated circuit device according to some embodiments of the present inventive concept. FIG. 22 is an enlarged cross-sectional view of an area P2 of FIG. 21. In detail, FIG. 21 is a cross-sectional view of the integrated circuit device at a position corresponding to the line X1-X1' of FIG. 2. In the descriptions of FIGS. 21 and 22, descriptions that are redundant with those of FIGS. 2 and 3 may be omitted.

Referring to FIGS. 3 and 21, an integrated circuit device 200 may include the substrate 102 having the active area AC. Each of a plurality of channel holes CHH may include the semiconductor pattern 120 in contact with the substrate 102 and partially filling the channel hole CHH, the channel film 150 in contact with the semiconductor pattern 120 and extending in the channel hole CHH in the third direction (Z direction), the buried insulating film 156 filling the inner space of the channel film 150, and the drain region 158 in contact with the channel film 150 and filling the top inlet side of the channel hole CHH. A plurality of drain regions 158 may be insulated from each other by the insulating pattern 114.

In the channel hole CHH, a blocking dielectric film 225, a charge storage film 230, the tunneling dielectric film 140, the channel film 150, and the buried insulating film 156 are sequentially arranged, and the top inlet side of the channel hole CHH may be filled with the drain region 158.

In the channel hole CHH, each of the blocking dielectric film 225, the tunneling dielectric film 140, and the channel film 150 may have a cylindrical shape. In the channel hole CHH, the charge storage film 230 may have a shape of a plurality of rings that are arranged spaced apart from each other in the third direction (Z direction). Each of the blocking dielectric film 225, the tunneling dielectric film 140, and the channel film 150 may include a plurality of bent portions that are formed in a portion covering the word line structures WS and the insulating films 110.

In the process of forming the blocking dielectric film 225, the charge storage film 230, and the tunneling dielectric film 140, as the partial area of the upper surface of the semiconductor pattern 120 is removed, the recessed surface 120R may be formed on the upper surface of the semiconductor pattern 120. The channel film 150 may be in contact with the recessed surface 120R of the semiconductor pattern 120.

The word line structures WS may extend on the substrate 102 in the horizontal direction parallel to the main surface 102M along the X-Y plane and may be arranged spaced apart from each other in the third direction (Z direction) that is perpendicular to the main surface 102M of the substrate 102 and overlapping with each other. The insulating films 110 may extend between the word line structures WS in the horizontal direction parallel to the main surface 102M of the substrate 102. The word line structures WS and the insulating films 110 may form the stack structure ST.

Referring to FIGS. 21 and 22, the insulating films 110 of the integrated circuit device 200 may have a structure protruding toward the channel film 150 further than the word line structures WS. The word line structures WS may have a recessed side wall WSR that is located farther from the channel film 150 than a side wall 110S of each of the insulating films 110 facing the channel film 150.

The blocking dielectric film 225 may cover the word line structures WS and the insulating films 110, extend in the third direction (Z direction) with bent portions, and have a first groove GR1c facing the recessed side wall WSR of the word line structures WS. The blocking dielectric film 225 may substantially and conformally cover the recessed side wall WSR of the word line structures WS and the side wall 110S of the insulating films 110. The blocking dielectric film 125 may include, for example, a silicon oxide film or a silicon oxynitride film.

In some embodiments, the blocking dielectric film 225 may completely fill an indent space WSSP defined by a bottom surface and an upper surface of the insulating films 110 and the recessed side wall WSR of the word line structures WS, and thus the first groove GR1c may not extend into the indent space WSSP. In some embodiments, the blocking dielectric film 125 may not completely fill the indent space WSSP defined by the bottom surface and the upper surface of the insulating films 110 and the recessed side wall WSR of the word line structures WS, and thus the first groove GR1c may extend into the indent space WSSP.

The charge storage films 230 may be arranged on the recessed side wall WSR of the word line structures WS with the blocking dielectric film 225 therebetween. The charge storage films 230 may include, for example, a silicon nitride film, polysilicon, or impurity-doped polysilicon. In some embodiments, the charge storage film 230 may include a charge trap film that includes, for example, a silicon nitride film. In some embodiments, the charge storage film 230 may be a floating gate that includes polysilicon or impurity-doped polysilicon. In some embodiments, the first height H1 of the word line structures WS in the third direction (Z direction) may be greater than a second height H2b of the charge storage films 230 in the third direction (Z direction).

A surface of each of the charge storage films 230 that are opposite to the blocking dielectric film 225, that is, facing the tunneling dielectric film 140 and the channel film 150, may have a concave shape in a middle portion thereof. For example, the surface of each of the charge storage films 230 facing tunneling dielectric film 140 and the channel film 150 may have a concave shape toward the blocking dielectric film 225 in the middle portion thereof further than from an upper portion and a lower portion thereof. In some embodiments, each of the charge storage films 230 has a first surface facing the blocking dielectric film 225 and a second surface opposite the first surface of the charge storage films 230, and the second surface of the charge storage films 230 may include a recess in a middle portion thereof in the third direction (Z direction), which is recessed toward the blocking dielectric film 225 as illustrated in FIG. 22.

Each of the charge storage films 230 may include a first charge storage film 232 filling at least a part of the first groove GR1c and a second charge storage film 234 covering the first charge storage film 232. A width of the second charge storage film 234 in the horizontal direction (X direction or Y direction) may be greater than a width of the first charge storage film 232. A height of the second charge storage film 234 in the vertical direction (Z direction) may be greater than a height of the first charge storage film 232 in the third direction (Z direction). The second charge storage film 234 may cover the first charge storage film 232 and a part of the blocking dielectric film 225. In some embodiments, the first charge storage film 232 has a width in the first direction (X direction) narrower than a width of the second charge storage film 234 in the first direction (X direction) as illustrated in FIG. 22.

The tunneling dielectric film 140 may extend in the third direction (Z direction) with bent portions, covering the blocking dielectric film 125 and the charge storage films 130. The channel film 150 may extend in the third direction (Z direction) with bent portions, covering the tunneling dielectric film 140.

The blocking dielectric film 225, the tunneling dielectric film 140, and the channel film 150 may non-linearly extend in the third direction (Z direction). In some embodiments, each of the blocking dielectric film 225, the tunneling dielectric film 140, and the channel film 150 may have a non-linear shape.

FIGS. 23A to 23F are enlarged cross-sectional views illustrating a method of manufacturing an integrated circuit device according to some embodiments of the present inventive concept. In detail, FIGS. 23A to 23F are enlarged cross-sectional views of the area P2 indicated by a dash-dot line in FIG. 21 illustrating the method of manufacturing the integrated circuit device 200 of FIG. 22. In the descriptions of FIGS. 23A to 23F, descriptions redundant with those of FIGS. 5A to 5P may be omitted.

Figure 23A:
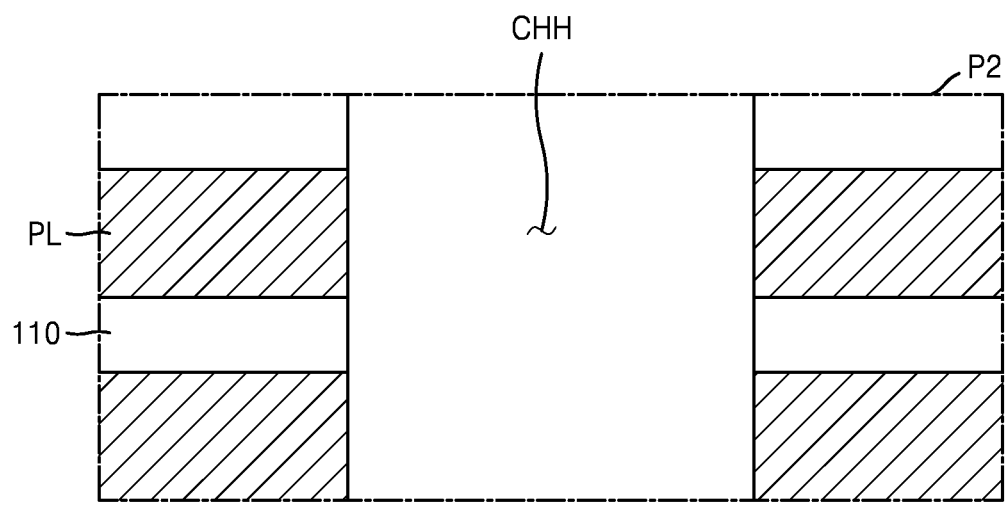
FIGS. 23A to 23F are enlarged cross-sectional views illustrating a method of manufacturing an integrated circuit device according to some embodiments of the present inventive concept.

Referring to FIGS. 12 and 23A, the insulating films 110 and the sacrificial layers PL are alternately stacked one by one on the substrate 102. After forming the insulating pattern 114 on the top one of the insulating films 110, the insulating films 110 and the sacrificial layers PL are anisotropically etched by using the insulating pattern 114 as an etch mask, thereby forming the channel hole CHH that exposes the substrate 102. A width of the channel hole CHH in the horizontal direction may decrease closer to the substrate 102.

Figure 23B:
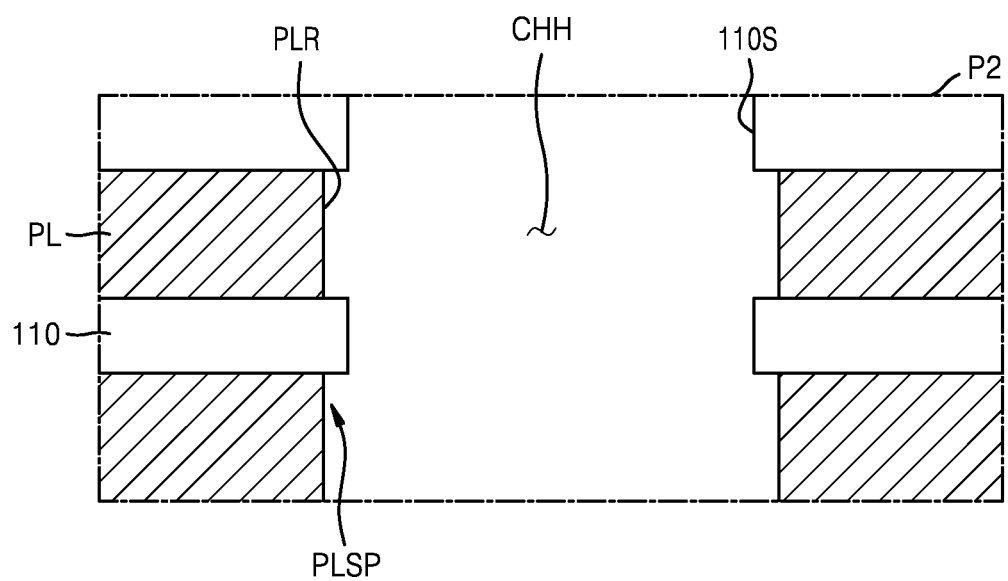

Referring to FIG. 23B, by removing a part of each of the sacrificial layers PL through the channel hole CHH, each of a plurality of indent spaces PLSP communicating with the channel hole CHH is formed on the same level as a corresponding one of the sacrificial layers PL. In the indent spaces PLSP, the sacrificial layers PL may have a recessed side wall PLR that is located farther from the center of the channel hole CHH than the side wall 110S of each of the insulating films 110 facing the channel hole CHH. In some embodiments, the indent spaces PLSP may be formed by removing a part of each of the sacrificial layers PL by a wet etching process.

Figure 23C:
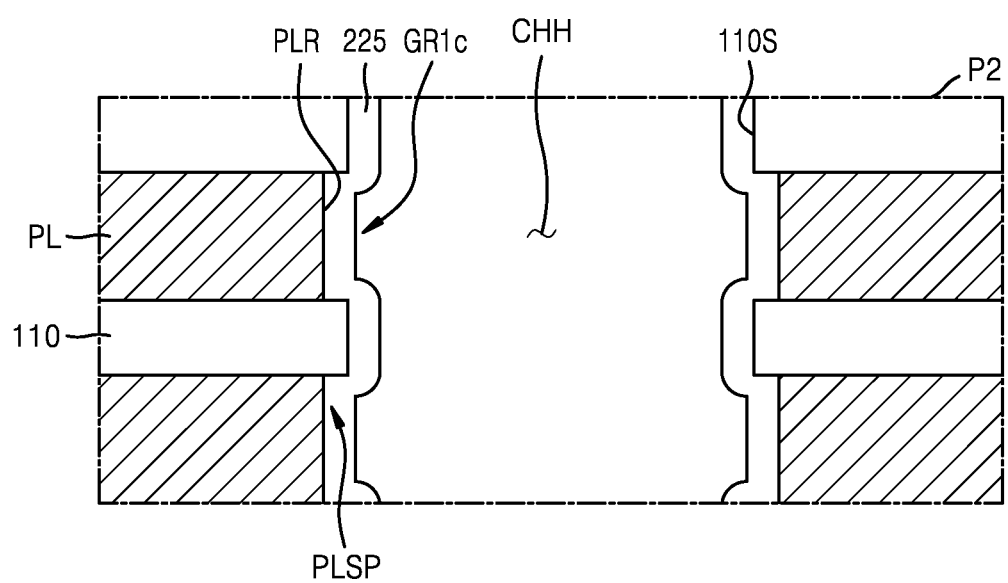

Referring to FIG. 23C, the blocking dielectric film 225 covering the surfaces of the insulating films 110 and the sacrificial layers PL exposed in the channel hole CHH is formed. The blocking dielectric film 225 may be formed to cover the sacrificial layers PL and the insulating films 110, may extend in the third direction (Z direction) with bent portions, and may have the first groove GR1c on the sacrificial layers PL (e.g., on the recessed side wall PLR of the sacrificial layers PL). The blocking dielectric film 225 may substantially and conformally cover parts of upper surfaces and bottom surfaces of the insulating films 110, and the side wall 110S and the recessed side wall PLR of the sacrificial layers PL.

According to the thickness of the blocking dielectric film 225, the blocking dielectric film 225 may completely fill the indent spaces PLSP, or the blocking dielectric film 225 may not completely fill the indent spaces PLSP, and the first groove GR1c may extend into the indent spaces PLSP.

Figure 23D:
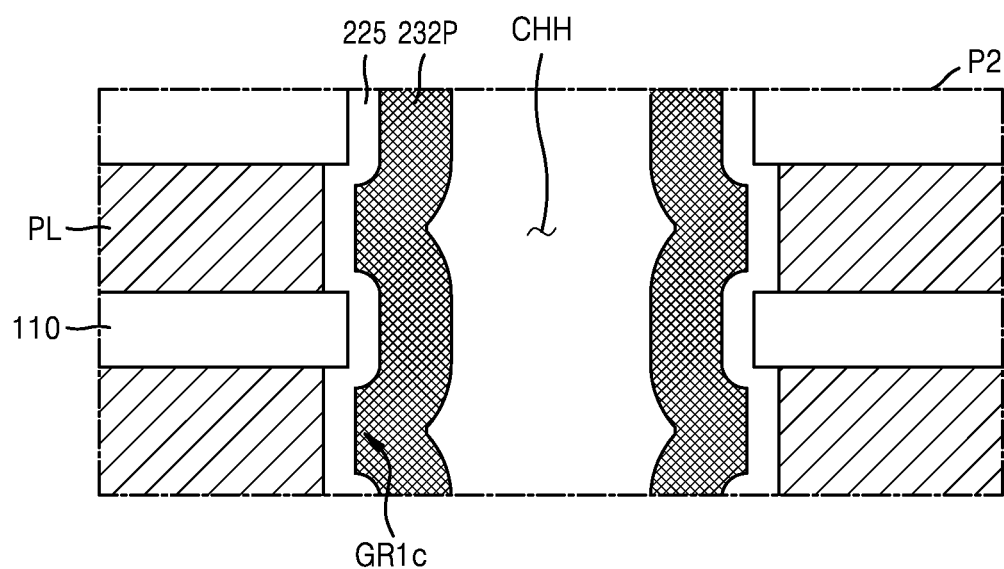
Figure 23E:
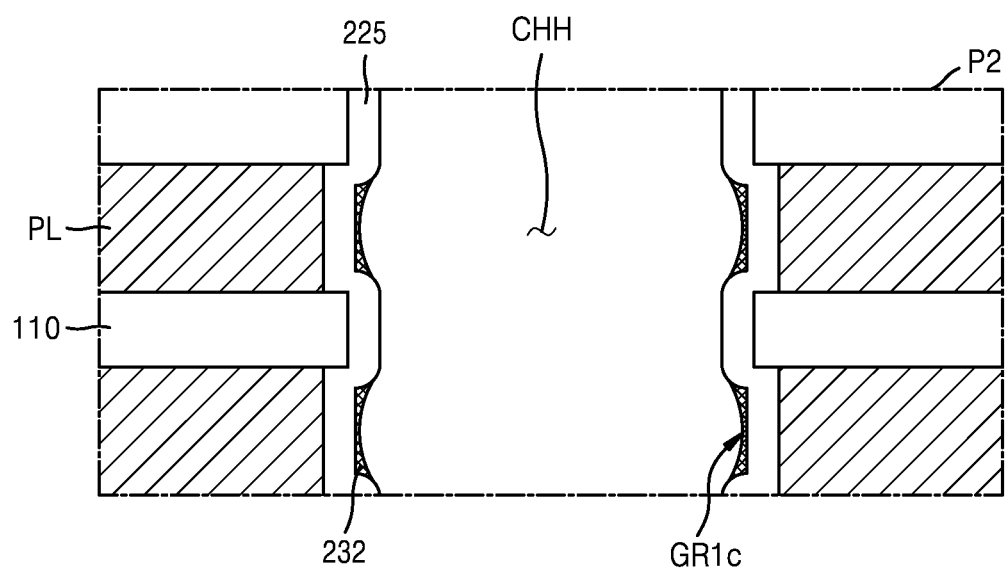

Referring to FIGS. 23D and 23E, a preliminary charge storage film 232P covering the blocking dielectric film 225 is formed in the channel hole CHH. The preliminary charge storage film 232P may cover the blocking dielectric film 225 and may extend in the third direction (Z direction) with bent portions. The preliminary charge storage film 232P may include, for example, a silicon nitride film, polysilicon, or impurity-doped polysilicon.

Then, the first charge storage film 232 that is a part of the preliminary charge storage film 232P filling at least a part of the first groove GR1c is formed by anisotropically etching the preliminary charge storage film 232P. The first charge storage film 232 may have a surface that is concave in a middle portion thereof when viewed from the channel hole CHH. For example, the first charge storage film 232 may further protrude toward the channel hole CHH from the upper and lower portions than from the middle portion thereof.

Figure 23F:
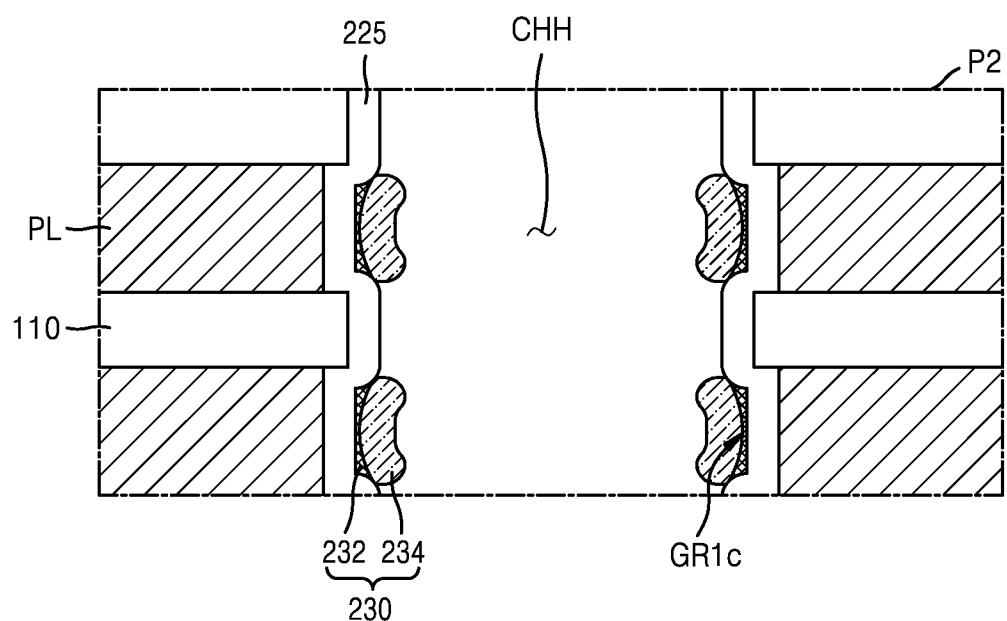

Referring to FIG. 23F, the charge storage film 230 including the first charge storage film 232 and the second charge storage film 234 is formed by forming the second charge storage film 234 on the first charge storage film 232. The second charge storage film 234 may be formed by the SEG process using the first charge storage film 232 as a seed or the selective deposition process. In some embodiments, the first charge storage film 232 and the second charge storage film 234 may include the same material. In some embodiments, the first charge storage film 232 and the second charge storage film 234 may include materials different from each other. The second charge storage film 234 may include, for example, a silicon nitride film or impurity-doped polysilicon.

The second charge storage film 234 may completely cover the exposed surface of the first charge storage film 232 in the channel hole CHH illustrated in FIG. 23F. In some embodiments, the second charge storage film 234 may further cover a part of a surface of the blocking insulating film 225 adjacent to the first charge storage film 232. The second charge storage film 234 may have a surface that is concave in the middle portion thereof when viewed from the channel hole CHH. For example, the second charge storage film 234 may further protrude toward the channel hole CHH from the upper and lower portions than from the middle portion thereof.

Then, the tunneling dielectric film 140 covering the charge storage film 230 and the blocking dielectric film 225, the channel film 150 covering the tunneling dielectric film 140 and the semiconductor pattern 120 of FIG. 21, and the buried insulating film 156 filling the channel hole CHH on the channel film 150 are sequentially formed in the channel hole CHH, by performing the process described with reference to FIGS. 5N to 5P. Next, the word line structures WS of FIG. 22 filling the space obtained by removing the sacrificial layers PL are formed, and thus, the integrated circuit device 200 is formed.

FIGS. 24A and 24B, FIGS. 25A and 25B, FIG. 26A, FIGS. 27A to 27D, and FIGS. 28A to 28D are enlarged cross-sectional views illustrating a method of manufacturing an integrated circuit device according to some embodiments of the present inventive concept. FIGS. 24C, 25C, 26B, 27E, and 28E are enlarged cross-sectional views of an integrated circuit device according to some embodiments of the present inventive concept. In detail, FIGS. 24A to 28E are enlarged cross-sectional views of the area P2 indicated by a dash-dot line in FIG. 21. In the descriptions below, descriptions redundant with those of FIGS. 21 to 23F may be omitted.

Figure 24A:
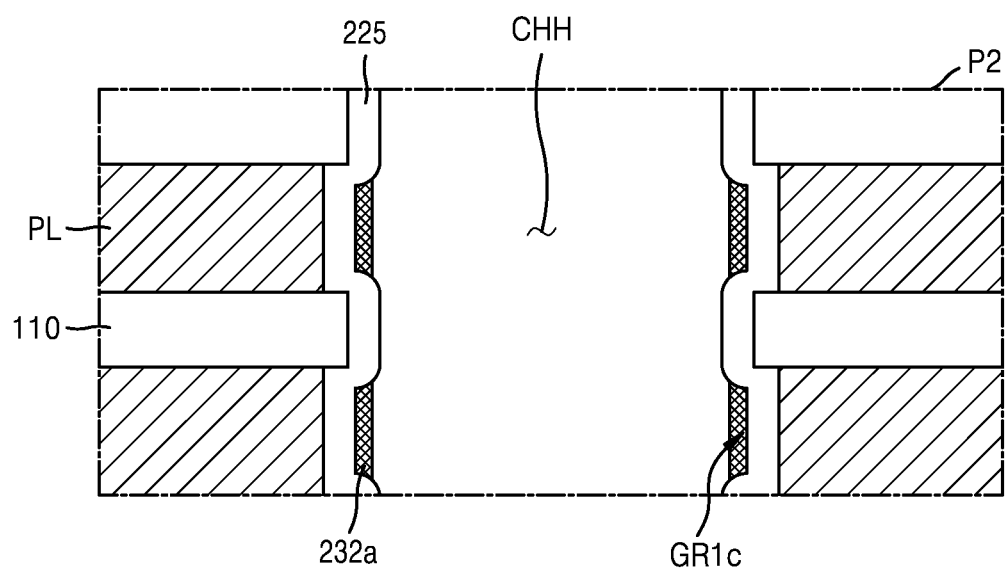
FIGS. 24A and 24B, FIGS. 25A and 25B, FIG. 26A, FIGS. 27A to 27D, and FIGS. 28A to 28D are enlarged cross-sectional views illustrating a method of manufacturing an integrated circuit device according to some embodiments of the present inventive concept.

Referring to FIG. 24A, with respect to the resultant of FIG. 23D, by anisotropically etching the preliminary charge storage film 232P, a first charge storage film 232a that is a part of the preliminary charge storage film 232P filling at least a part of the first groove GR1c is formed. The first charge storage film 232a may have a flat surface when viewed from the channel hole CHH. In other words, a side wall of the first charge storage film 232a facing the channel hole CHH may have a flat surface.

Figure 24B:
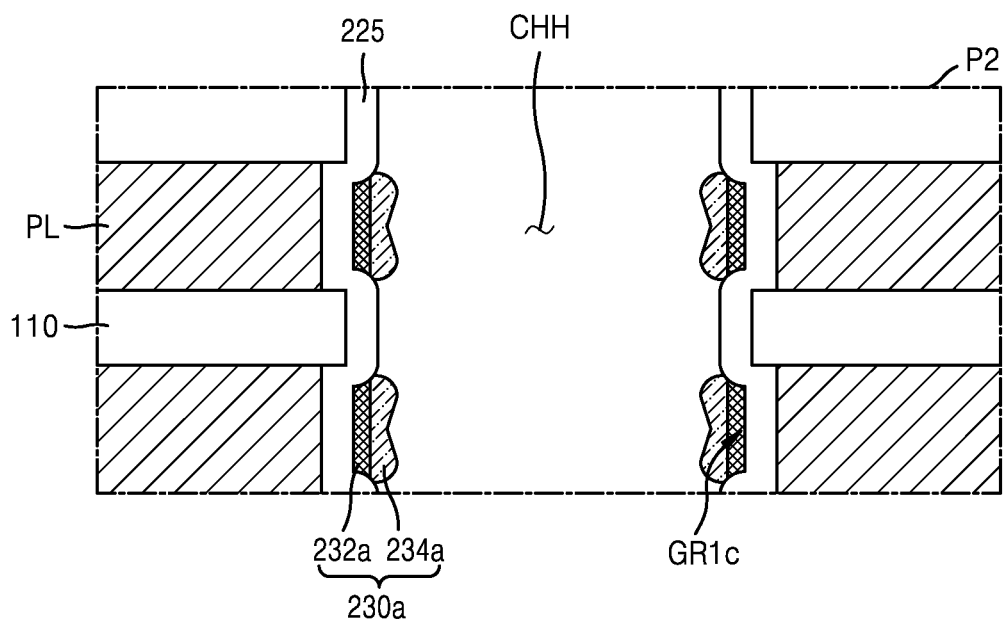

Referring to FIG. 24B, a second charge storage film 234a is formed on the first charge storage film 232a, and a charge storage film 230a including the first charge storage film 232a and the second charge storage film 234a is formed.

The second charge storage film 234a may have a surface that is concave in the middle portion thereof when viewed from the channel hole CHH. For example, the second charge storage film 234a may further protrude toward the channel hole CHH from the upper and lower portions than the middle portion thereof.

Figure 24C:
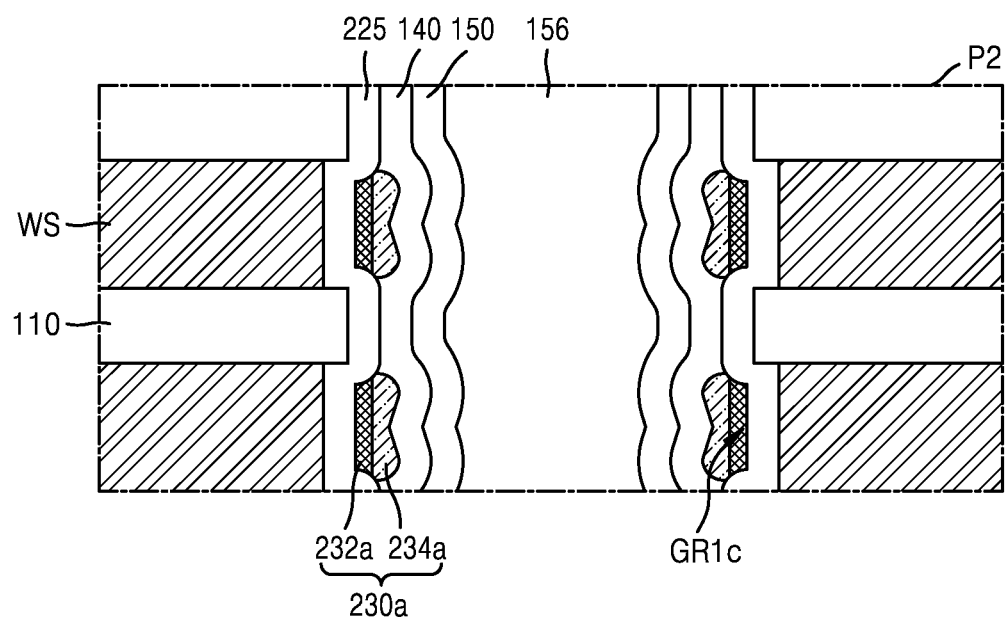
FIGS. 24C, 25C, 26B, 27E, and 28E are enlarged cross-sectional views of an integrated circuit device according to some embodiments of the present inventive concept.

Referring to FIG. 24C, the tunneling dielectric film 140 covering the charge storage film 230a and the blocking dielectric film 225, the channel film 150 covering the tunneling dielectric film 140 and the semiconductor pattern 120 of FIG. 21, and the buried insulating film 156 filling the channel hole CHH on the channel film 150 are sequentially formed in the channel hole CHH by performing the process described with reference to FIGS. 5N to 5P. Then, the word line structures WS filling the space obtained by removing the sacrificial layers PL of FIG. 24B are formed, and thus an integrated circuit device 200a is formed.

Figure 25A:
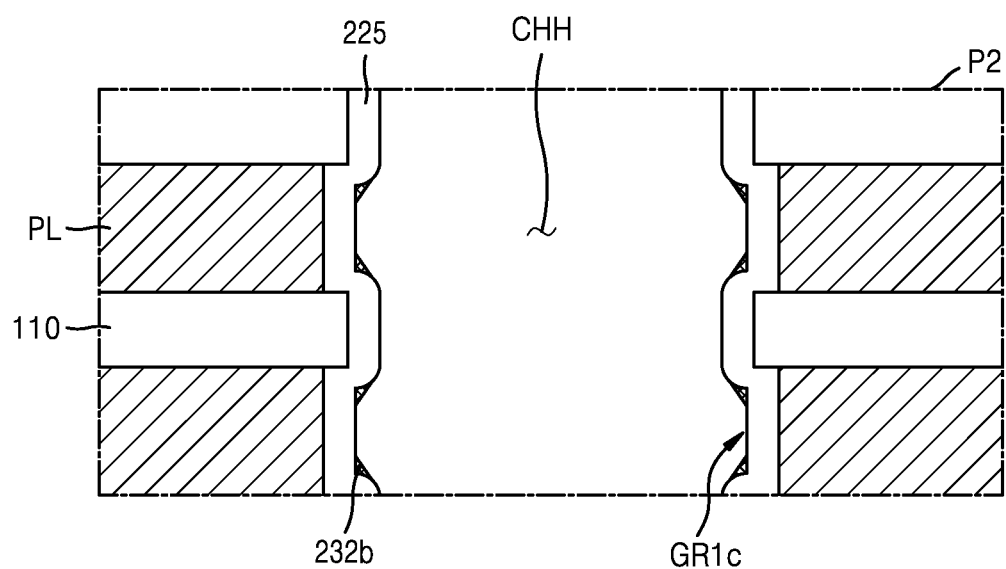

Referring to FIG. 25A, with respect to the resultant of FIG. 23D, a first charge storage film 232b that is a part of the preliminary charge storage film 232P filling at least a part of the first groove GR1c is formed by anisotropically etching the preliminary charge storage film 232P. The first charge storage film 232b comprises at least two first charge storage films 232b spaced apart from each other on the blocking dielectric film 125 in the first groove GR1c.

Figure 25B:
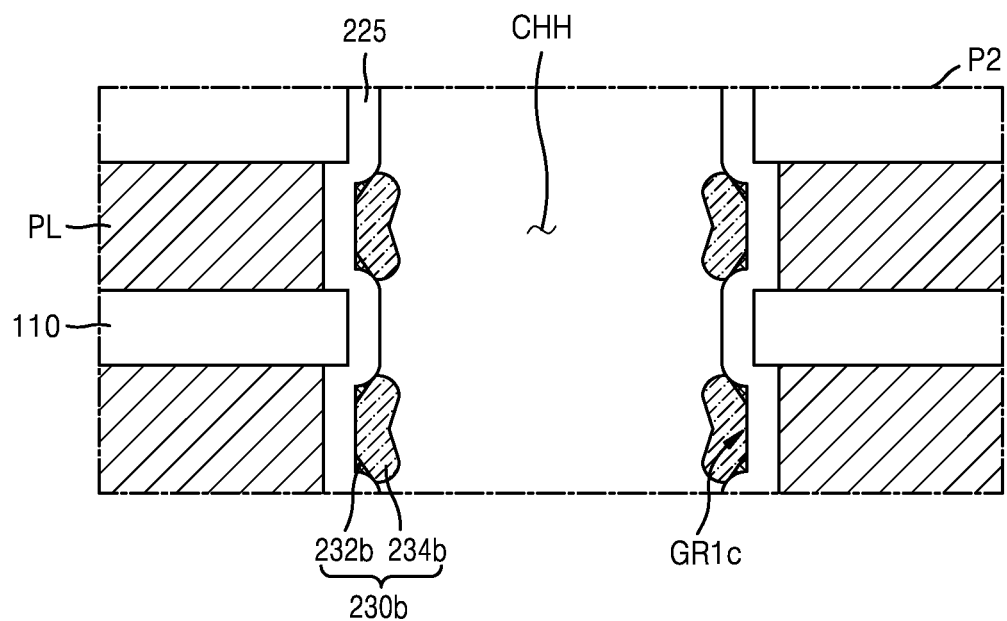

Referring to FIG. 25B, a second charge storage film 234b filling the first groove GR1c is formed on the first charge storage film 232b, and thus a charge storage film 230b including at least two first charge storage films 232b and the second charge storage film 234b is formed. The second charge storage film 234b may be formed as parts formed by the SEG process or the selective deposition process from the at least two first charge storage films 232b spaced apart from each other on the blocking dielectric film 125 in the first groove GR1c are integrally coupled. In other words, the second charge storage film 234b forming one body may be formed on the at least two first charge storage films 232b spaced apart from each other.

The second charge storage film 234b may have a surface that is concave in the middle portion thereof when viewed from the channel hole CHH. For example, the second charge storage film 234b may further protrude toward the channel hole CHH from the upper and lower portions than the middle portion thereof.

Figure 25C:
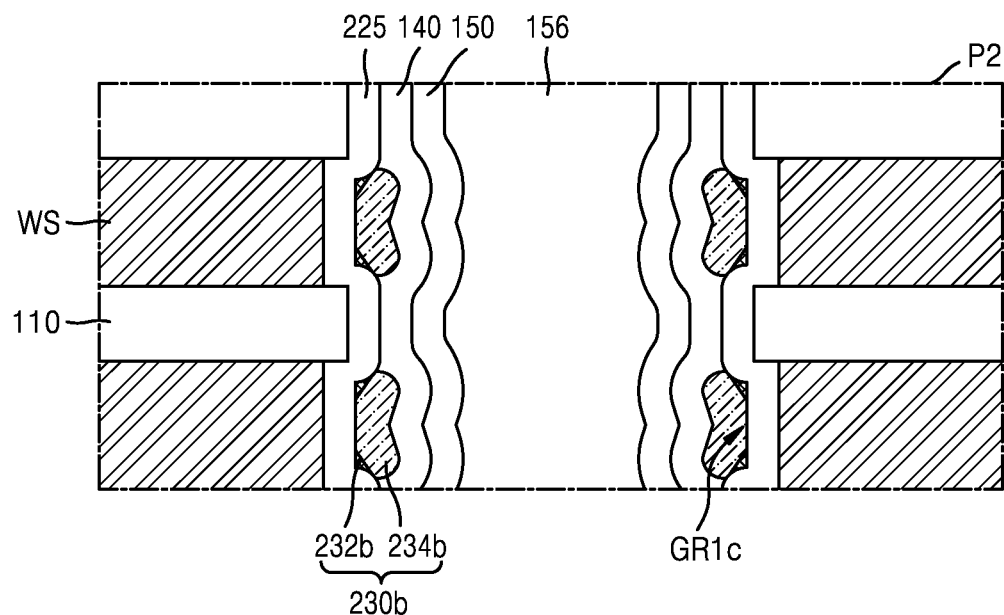

Referring to FIG. 25C, by performing the process described with reference to FIGS. 5N to 5P, the tunneling dielectric film 140 covering the charge storage film 230b and the blocking dielectric film 225, the channel film 150 covering the tunneling dielectric film 140 and the semiconductor pattern 120 of FIG. 21, and the buried insulating film 156 filling the channel hole CHH on the channel film 150 are sequentially formed in the channel hole CHH. Thus, the word line structures WS filling the space obtained by removing the sacrificial layers PL of FIG. 25B are formed, and thus an integrated circuit device 200b is formed.

Figure 26A:
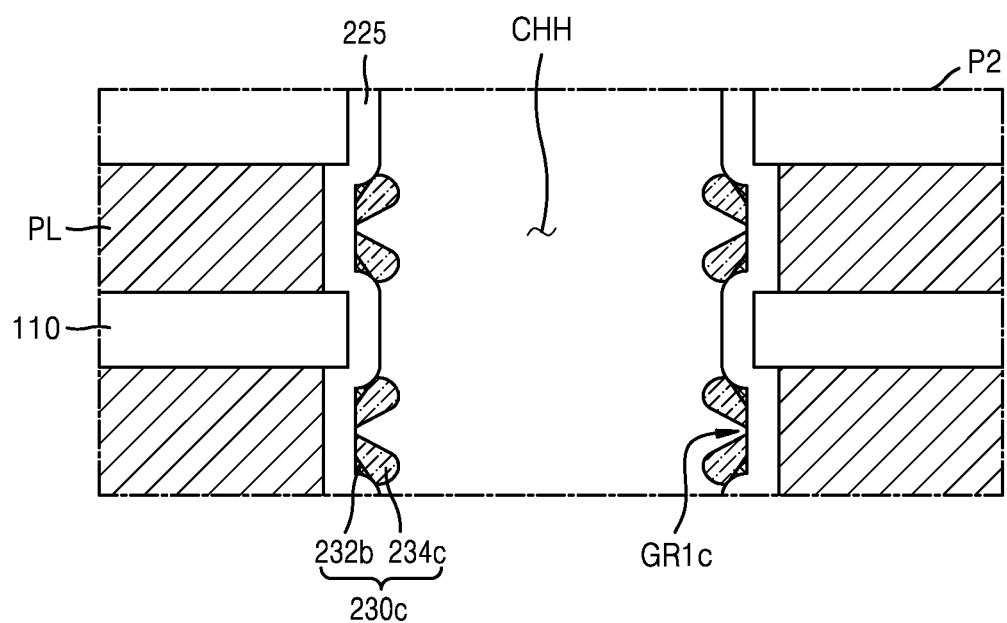

Referring to FIG. 26A, with respect to the resultant of FIG. 25A, at least two second charge storage films 234c spaced apart from each other are formed on at least two first charge storage films 232b, and thus a charge storage film 230c including the at least two first charge storage films 232b and the at least two second charge storage films 234c is formed. The at least two second charge storage films 234c are parts formed by the SEG process or the selective deposition process from at least two first charge storage films 232b spaced apart from each other on the blocking dielectric film 125 in the first groove GR1c, which may not be incorporated and may be spaced apart from each other. The at least two second charge storage films 234c may not completely fill the first groove GR1c.

Figure 26B:
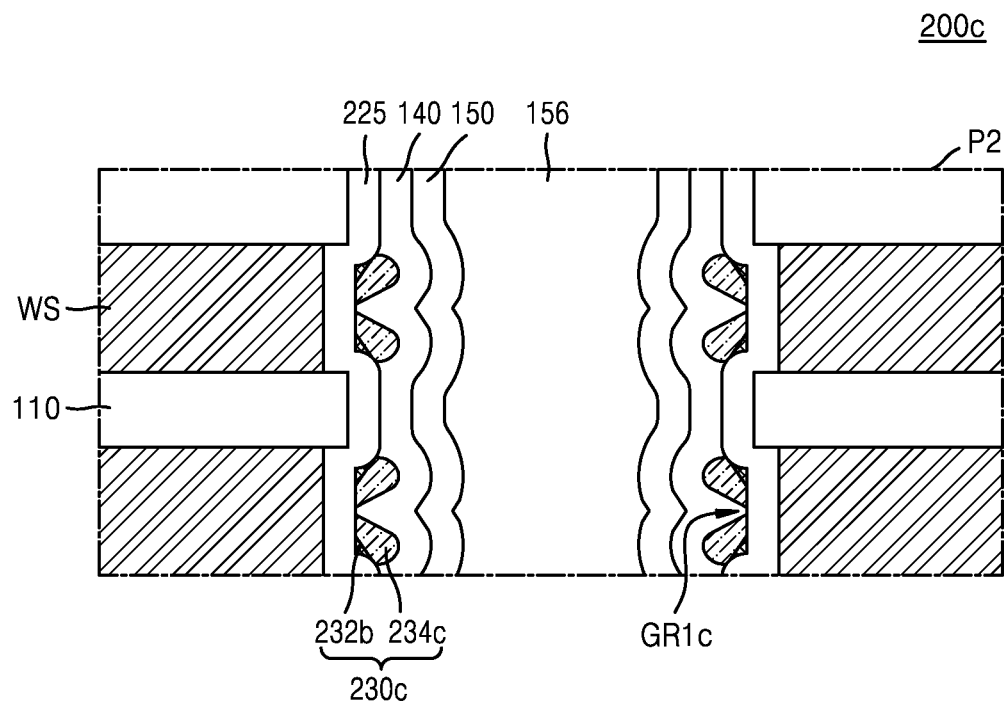

Referring to FIG. 26B, by performing the process described with reference to FIGS. 5N to 5P, the tunneling dielectric film 140 covering the charge storage film 230c and the blocking dielectric film 225, the channel film 150 covering the tunneling dielectric film 140 and the semiconductor pattern 120 of FIG. 21, and the buried insulating film 156 filling the channel hole CHH on the channel film 150 are sequentially formed in the channel hole CHH. Then, the word line structures WS filling the space obtained by removing the sacrificial layers PL of FIG. 26A are formed, and thus an integrated circuit device 200c is formed.

Figure 27A:
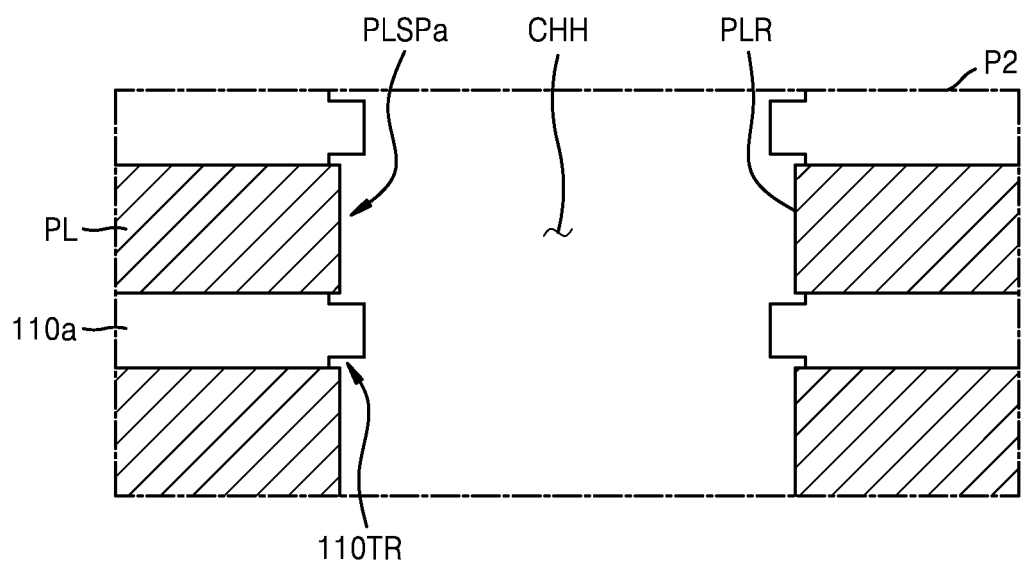

Referring to FIG. 27A, a plurality of insulating films 110a each having a trimmed portion 110TR obtained by removing a part of an end portion thereof facing the channel hole CHH through the trimming process are formed by performing a trimming process of removing a part adjacent to a surface of the insulating film 110 of FIG. 23B exposed in the channel hole CHH on the resultant of FIG. 23B. A height of the trimmed portion 110TR in the third direction (Z direction) may be less than a height of the other part of the sacrificial layers PLa in the third direction (Z direction).

A height of an indent space PLSPa defined by a bottom surface and an upper surface of each of the insulating films 110a and the recessed side wall PLR of each of the sacrificial layers PL in the third direction (Z direction) may be greater than a height of the indent spaces PLSP illustrated in FIG. 23B.

Figure 27B:
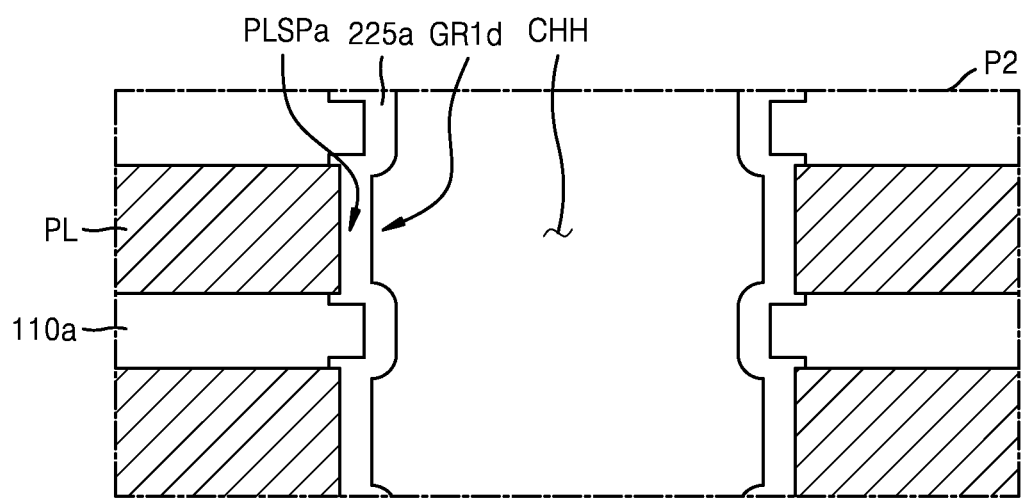

Referring to FIG. 27B, a blocking dielectric film 225a having a first groove GR1d and covering surfaces of the insulating films 110a and the sacrificial layers PL exposed in the channel hole CHH is formed.

Figure 27C:
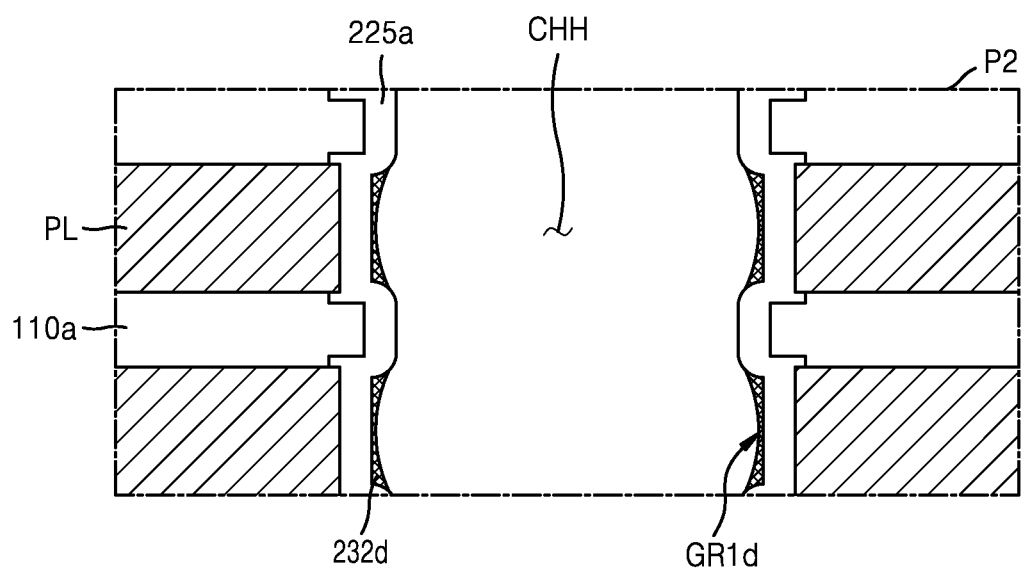

Referring to FIG. 27C, a first charge storage film 232d filling at least a part of the first groove GR1d is formed by performing a process similar to that illustrated in FIGS. 23D and 23E. A height of the first charge storage film 232d in the third direction (Z direction) may be greater than a height of the first charge storage film 232 illustrated in FIG. 23E.

Figure 27D:
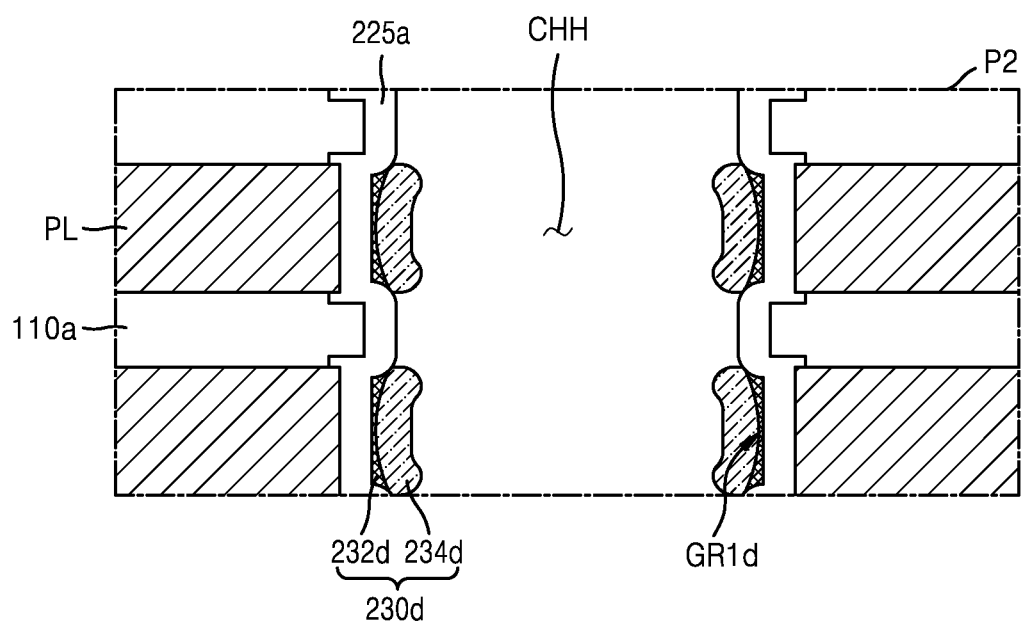

Referring to FIG. 27D, a second charge storage film 234d is formed on the first charge storage film 232d, and thus a charge storage film 230d including the first charge storage film 232d and the second charge storage film 234d is formed. A height of the second charge storage film 234d in the third direction (Z direction) may be greater than a height of the second charge storage film 234 illustrated in FIG. 23F in the third direction (Z direction).

The second charge storage film 234d may have a surface that is concave in the middle portion thereof when viewed from the channel hole CHH. For example, the second charge storage film 234d may further protrude toward the channel hole CHH from the upper and lower portions than the middle portion thereof.

Figure 27E:
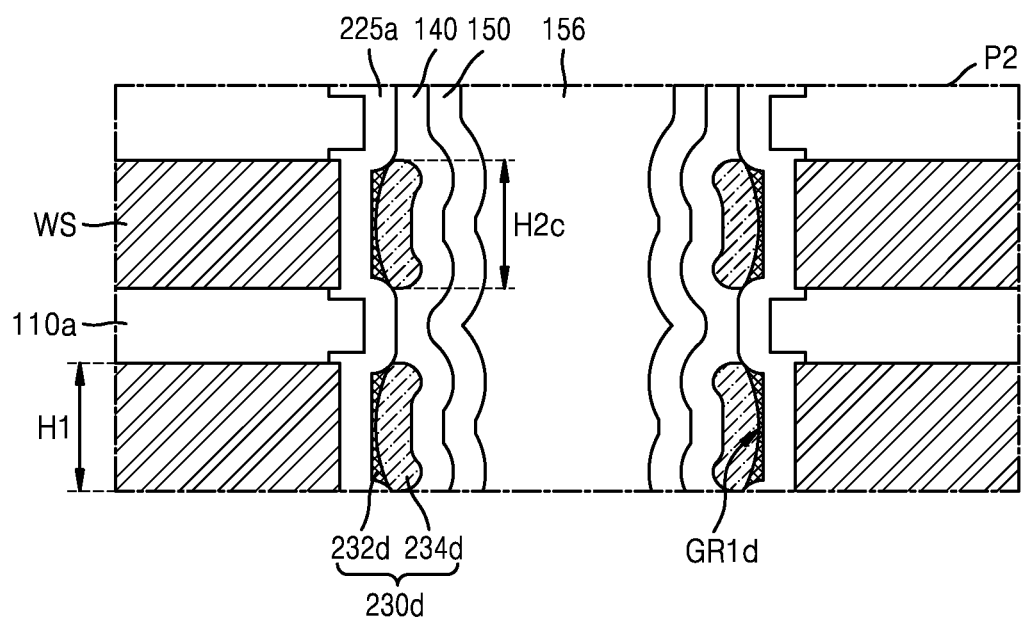

Referring to FIG. 27E, the tunneling dielectric film 140 covering the charge storage film 230d and the blocking dielectric film 225a, the channel film 150 covering the tunneling dielectric film 140 and the semiconductor pattern 120 of FIG. 21, and the buried insulating film 156 filling the channel hole CHH on the channel film 150 are sequentially formed in the channel hole CHH by performing the process described with reference to FIGS. 5N to 5P. Then, the word line structures WS filling the space obtained by removing the sacrificial layers PL of FIG. 27D are formed, and thus an integrated circuit device 200d is formed.

In some embodiments, a first height H1 of each of the word line structures WS in the third direction (Z direction) may be less than a second height H2c of the charge storage film 230d.

Figure 28A:
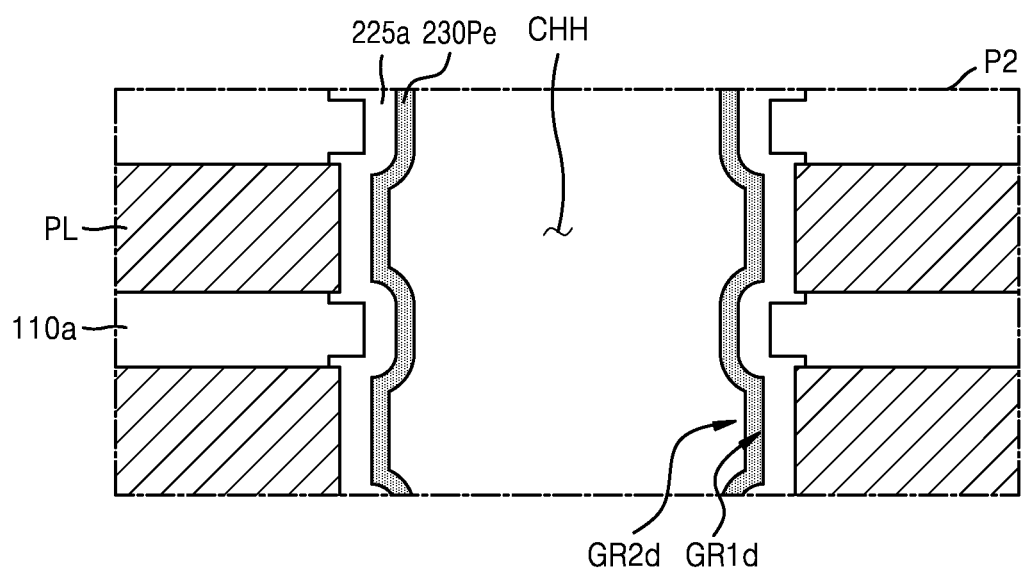

Referring to FIG. 28A, with respect to the resultant of FIG. 27B, a preliminary charge storage film 230Pe covering the blocking dielectric film 225a is formed in the channel hole CHH. The preliminary charge storage film 230Pe may cover the blocking dielectric film 225a, extend in the third direction (Z direction) with bent portions, and have a second groove GR2d corresponding the first groove GR1d. The preliminary charge storage film 230Pe may include, for example, a silicon nitride film.

Figure 28B:
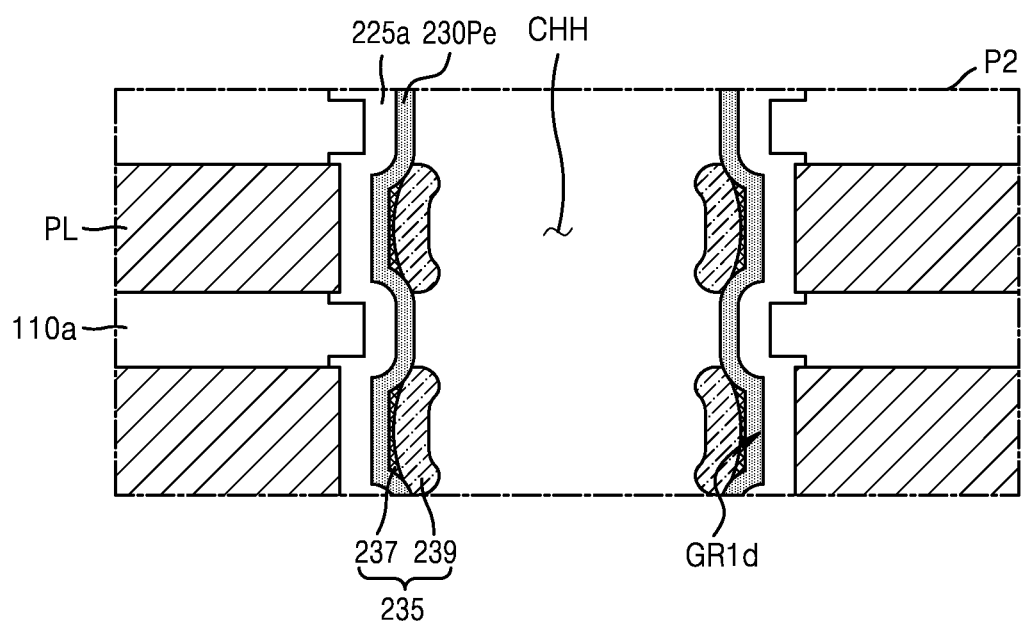

Referring to FIG. 28B, a mask pattern layer 235 including a first mask pattern 237 filling at least a part of the second groove GR2d and a second mask pattern 239 covering the first mask pattern 237 is formed by performing a process similar to that illustrated in FIGS. 27C and 27D.

Each of the first mask pattern 237 and the second mask pattern 239 may be formed by a method similar to the method of forming each of the first charge storage film 232d of FIG. 27C and the second charge storage film 234d of FIG. 27D. For example, after forming a preliminary mask pattern similar to the preliminary charge storage film 232P illustrated in FIG. 23D, the first mask pattern 237 may be formed by anisotropically etching the preliminary mask pattern, or the second mask pattern 239 may be formed by the SEG process using the first mask pattern 237 as a seed or the selective deposition process. In some embodiments, the first mask pattern 237 and the second mask pattern 239 may include the same material. In some embodiments, the first mask pattern 237 and the second mask pattern 239 may include materials different from each other. Each of the first mask pattern 237 and the second mask pattern 239 may include, for example, a silicon nitride film or impurity-doped polysilicon.

Figure 28C:
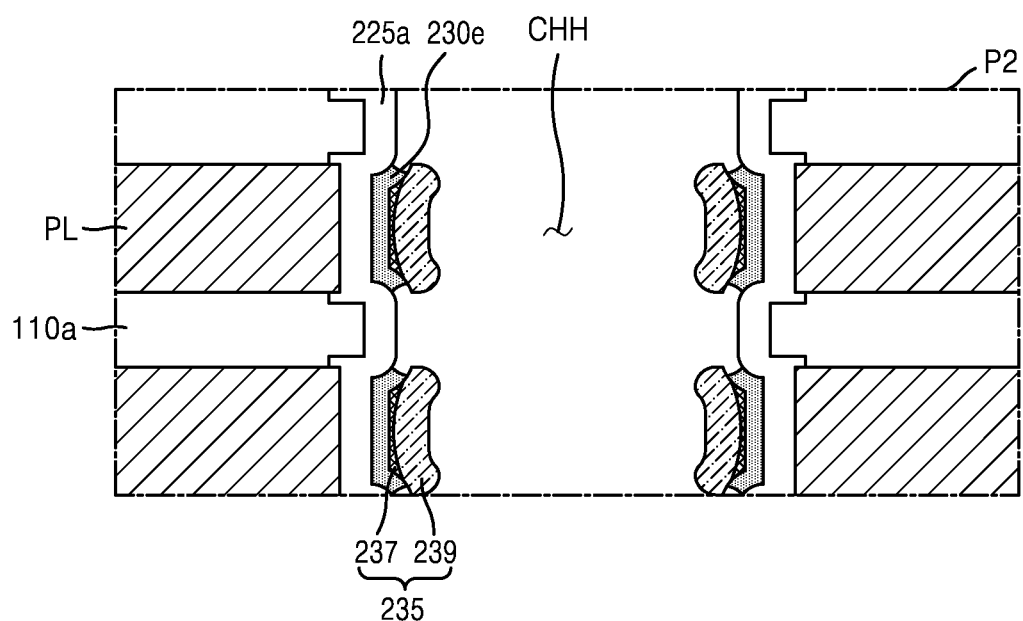
Figure 28D:
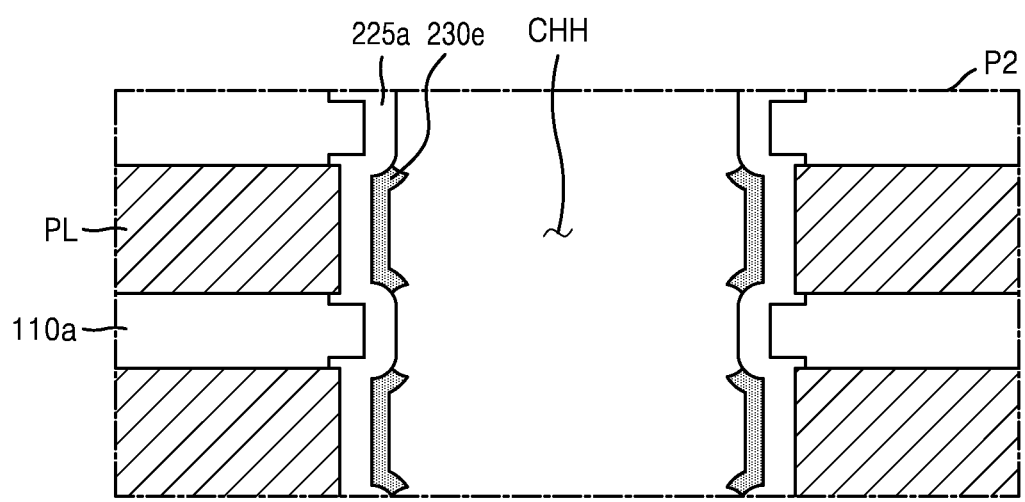

Referring to FIGS. 28C and 28D, a charge storage film 230e that is a part of the preliminary charge storage film 230Pe is formed by isotropically etching the preliminary charge storage film 230Pe of FIG. 28B by using the mask pattern layer 235 including the first mask pattern 237 and the second mask pattern 239 as an etch mask.

Then, the mask pattern layer 235 including the first mask pattern 237 and the second mask pattern 239 is removed.

Figure 28E:
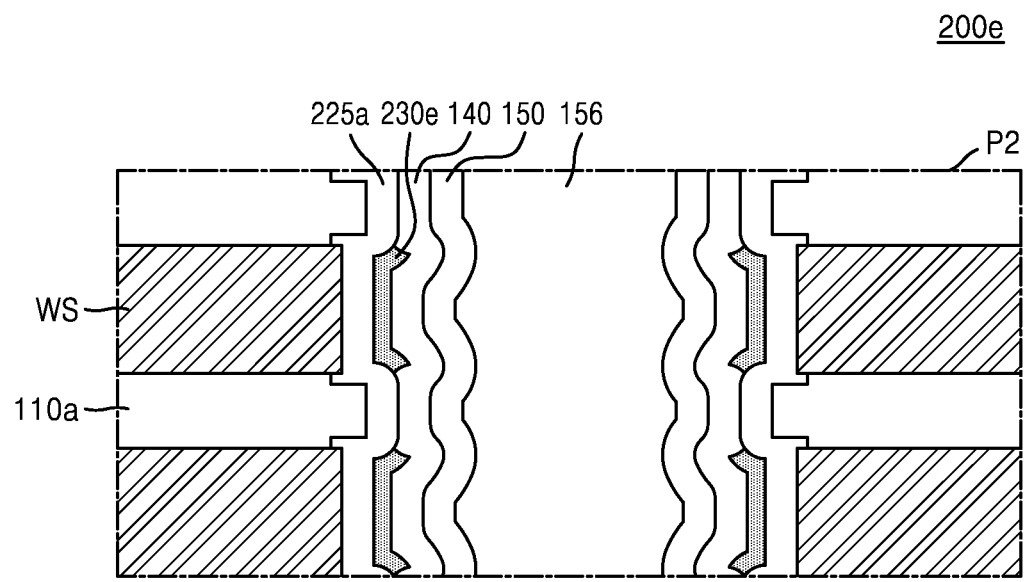

Referring to FIG. 28E, the tunneling dielectric film 140 covering the charge storage film 230e and the blocking dielectric film 225a, the channel film 150 covering the tunneling dielectric film 140 and the semiconductor pattern 120 of FIG. 21, and the buried insulating film 156 filling the channel hole CHH on the channel film 150 are sequentially formed in the channel hole CHH by performing the process described with reference to FIGS. 5N to 5P. Then, the word line structures WS filling the space obtained by removing the sacrificial layers PL of FIG. 28D are formed, thereby forming an integrated circuit device 200e.

In the integrated circuit devices 200, 200a, 200b, 200c, 200d, and 200e according to the present inventive concept, as the charge storage films 230, 230a, 230b, 230c, 230d, and 230e are formed in the channel hole CHH and the heights and/or thicknesses of the charge storage films 230, 230a, 230b, 230c, 230d, and 230e are variously implemented, a sufficient amount of charges may be stored in the memory cells and generation of interference between the adjacent memory cells may be reduced.

Figure 29:
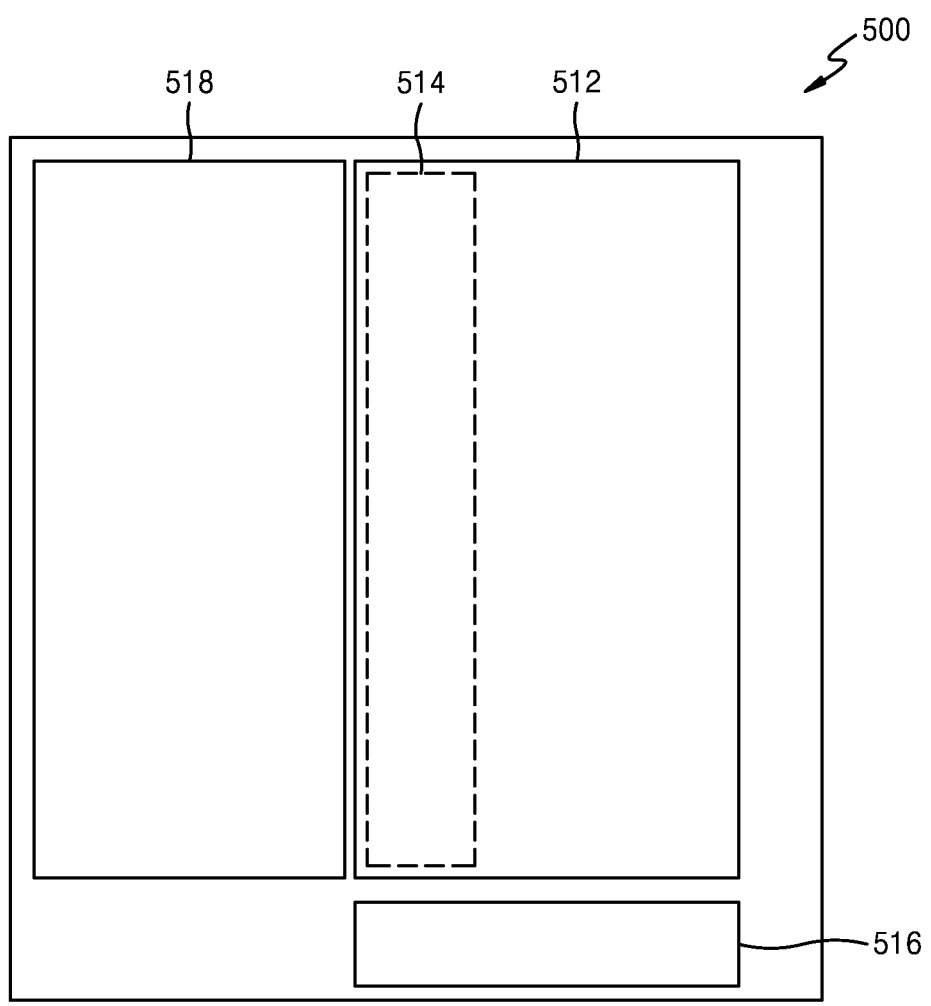
FIG. 29 is a plane layout diagram of an integrated circuit device according to some embodiments of the present inventive concept.

FIG. 29 is a plane layout diagram showing major areas of an integrated circuit device 500 according to some embodiments of the present inventive concept.

FIG. 29, the integrated circuit device 500 may include a memory cell array region 512, a first peripheral circuit region 514, a second peripheral circuit region 516, and a bonding pad region 518.

The memory cell array region 512 may include a plurality of memory cells arrays MCA having a configuration as described with reference to FIG. 1.

The first peripheral circuit region 514 and the second peripheral circuit region 516 may include a control unit for controlling data input to or data output from the memory cell array region 512. Peripheral circuits for driving the vertical memory cells included in the memory cell array region 512 may be disposed in the first peripheral circuit region 514 and the second peripheral circuit region 516.

As the first peripheral circuit region 514 is disposed to vertically overlap the memory cell array region 512, the size of a plane of a chip including the integrated circuit device 500 may be reduced.

In some embodiments, peripheral circuits disposed in the first peripheral circuit region 514 may be circuits capable of processing at high speed data input to or output from the memory cell array region 512. For example, the peripheral circuits disposed in the first peripheral circuit region 514 may include a page buffer, a latch circuit, a cache circuit, a column decoder, a sense amplifier, or a data in/out circuit.

The second peripheral circuit region 516 may be disposed in a region that does not overlap the memory cell array region 512 and the first peripheral circuit region 514 and may be at one side of the memory cell array region 512. The peripheral circuits formed in the second peripheral circuit region 516 may be, for example, a row decoder. In some embodiments, unlike the illustration of FIG. 29, at least a part of the second peripheral circuit region 516 may be disposed under the memory cell array region 512.

The bonding pad region 518 may be formed at the other side of the memory cell array region 512. The bonding pad region 518 may be a region where wirings connected to words lines of the respective vertical memory cells of the memory cell array region 512 are provided.

Figure 30A:
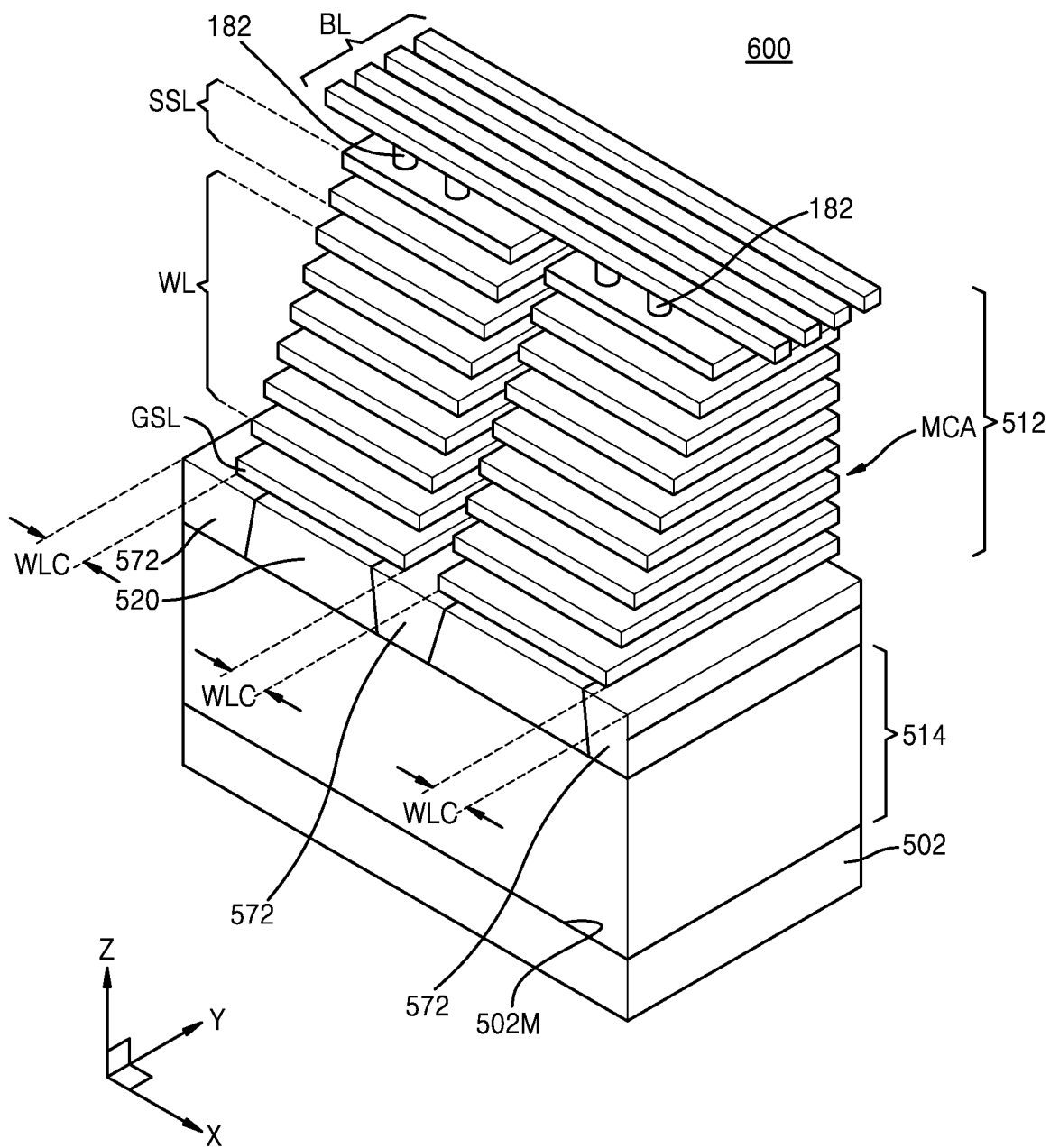
FIG. 30A is a schematic perspective view of an integrated circuit device according to some embodiments of the present inventive concept.
Figure 30B:
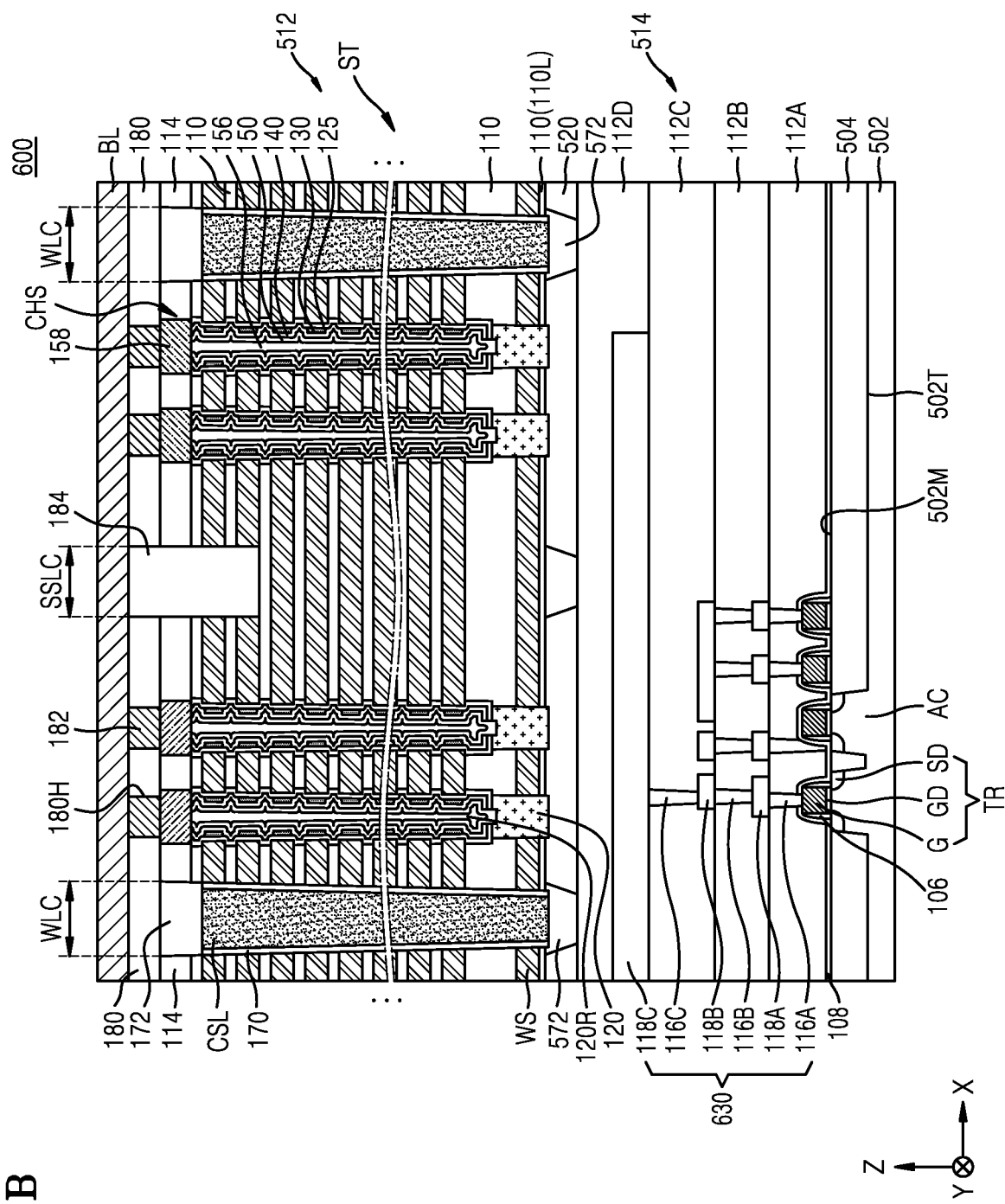
FIG. 30B is a schematic cross-sectional view of the integrated circuit device of FIG. 30A.

FIG. 30A is a schematic perspective view of an integrated circuit device 600 according to some embodiments of the present inventive concept. FIG. 30B is a schematic cross-sectional view of the integrated circuit device 600 of FIG. 30A. The integrated circuit device 600 of FIGS. 30A and 30B may have the same plane layout as that of the integrated circuit device 500 of FIG. 29. In FIGS. 30A and 30B, like reference numerals in FIGS. 1 to 4G denote like elements, and detailed descriptions thereof are omitted.

FIGS. 30A and 30B, the integrated circuit device 600 may include the first peripheral circuit region 514 formed on a first level of a substrate 502 and the memory cell array region 512 formed on a second level higher than the first level of the substrate 502. The term "level" used herein may denote a height in the third direction (Z direction) with respect to the substrate 502. The first level on the substrate 502 rather than the second level is closer to the substrate 502.

In some embodiments, the substrate 502 may have a main surface 502M extending in the first direction (X direction) and in the second direction (Y direction). A detailed description about the substrate 502 is substantially the same as that described about the substrate 102 with reference to FIG. 3.

The active area AC for peripheral circuits may be defined by an isolation layer 504 in the substrate 502. A plurality of transistors TR forming the first peripheral circuit region 514 may be formed in the active area AC of the substrate 502. Each of the transistors TR may include a gate G, a gate dielectric film GD, and a source/drain region SD. Both side walls of the gate G may be covered by an insulating spacer 106, and an etch stop layer 108 may be formed on the gate G and the insulating spacer 106. The etch stop layer 108 may include an insulation material such as a silicon nitride or a silicon oxynitride.

A plurality of interlayer insulating films 112A, 112B, 112C, and 112D may be sequentially stacked on the etch stop layer 108. The interlayer insulating films 112A, 112B, 112C, and 112D may include, for example, a silicon oxide, a silicon oxynitride, or a silicon oxynitride.

The first peripheral circuit region 514 may include a multilayer wiring structure 630 electrically connected to the transistors TR. The multilayer wiring structure 630 may be insulated by the interlayer insulating films 112A, 112B, 112C, and 112D.

The multilayer wiring structure 630 may include a first contact 116A, a first wiring layer 118A, a second contact 116B, a second wiring layer 118B, a third contact 116C, and a third wiring layer 118C, which are sequentially stacked on the substrate 502 and electrically connected to each other. In some embodiments, each of the first wiring layer 118A, the second wiring layer 118B, and the third wiring layer 118C may include, for example, metal, a conductive metal nitride, a metal silicide, or a combination thereof. For example, the first wiring layer 118A, the second wiring layer 118B, and the third wiring layer 118C may include a conductive material such as tungsten, molybdenum, titanium, cobalt, tantalum, nickel, tungsten silicide, titanium silicide, cobalt silicide, tantalum silicide, or nickel silicide.

In FIGS. 30A and 30B, although the multilayer wiring structure 630 is illustrated as one having three-layer wiring structure including the first wiring layer 118A, the second wiring layer 118B, and the third wiring layer 118C, the present inventive concept is not limited to the illustration of FIGS. 30A and 30B. For example, the multilayer wiring structure 630 may have a multilayer wiring structure of two layers or four layer or more according to a layout of the first peripheral circuit region 514 or a type and arrangement of the gate G.

A semiconductor layer 520 covering the interlayer insulating films 112A, 112B, 112C, and 112D is formed on the first peripheral circuit region 514. The memory cell array region 512 is formed on the semiconductor layer 520. The memory cell array region 512 have roughly the same configuration as that of the integrated circuit device 100 described with reference to FIGS. 1 to 4G or a memory cell array MCA region of the integrated circuit device 200 described with reference to FIGS. 21 and 22.

A plurality of common source regions 572 may be formed on the semiconductor layer 520. A detailed configuration of the common source regions 572 is roughly the same as that of the common source regions 160 described with reference to FIG. 3.

The common source regions 572 may be formed by doping impurities in the semiconductor layer 520. As illustrated in FIGS. 30A and 30B, the depth of the common source regions 572 may be substantially the same as the thickness of the semiconductor layer 520. Accordingly, the bottom surfaces of the common source regions 572 may be in contact with the top film of the interlayer insulating films 112A, 112B, 112C, and 112D forming the first peripheral circuit region 514.

In the integrated circuit device 600, the memory cell array region 512 and the first peripheral circuit region 514 may be electrically connected to each other by at least one connection plug (not shown) extending in the third direction (Z direction). The at least one connection plug may penetrate at least a part of the interlayer insulating films 112A, 112B, 112C, and 112D forming the first peripheral circuit region 514 and the semiconductor layer 520. Wiring structures formed in the memory cell array region 512 and wiring structures formed in the first peripheral circuit region 514 may be electrically connected to each other by the at least one connection plug.

The integrated circuit device 600 illustrated in FIGS. 30A and 30B has a multilayer device structure in which a first level semiconductor device and a second level semiconductor device having functions different from each other are stacked to vertically overlap each other and being on different levels. Accordingly, in the memory cell array region 512, the number of layers of the multilayer wiring structure formed above a plurality of common source lines CSL and the channel structures CHS may be reduced. Accordingly, the density of wiring patterns forming the multilayer wiring structure in the memory cell array region 512 may not increase excessively, and the manufacturing process of an integrated circuit device may be simplified. Furthermore, by reducing the number of stacked metal wiring layers of the multilayer wiring structure, physical stress due to the metal wirings may be reduced, and thus warpage of a substrate may be reduced.

Figure 31:
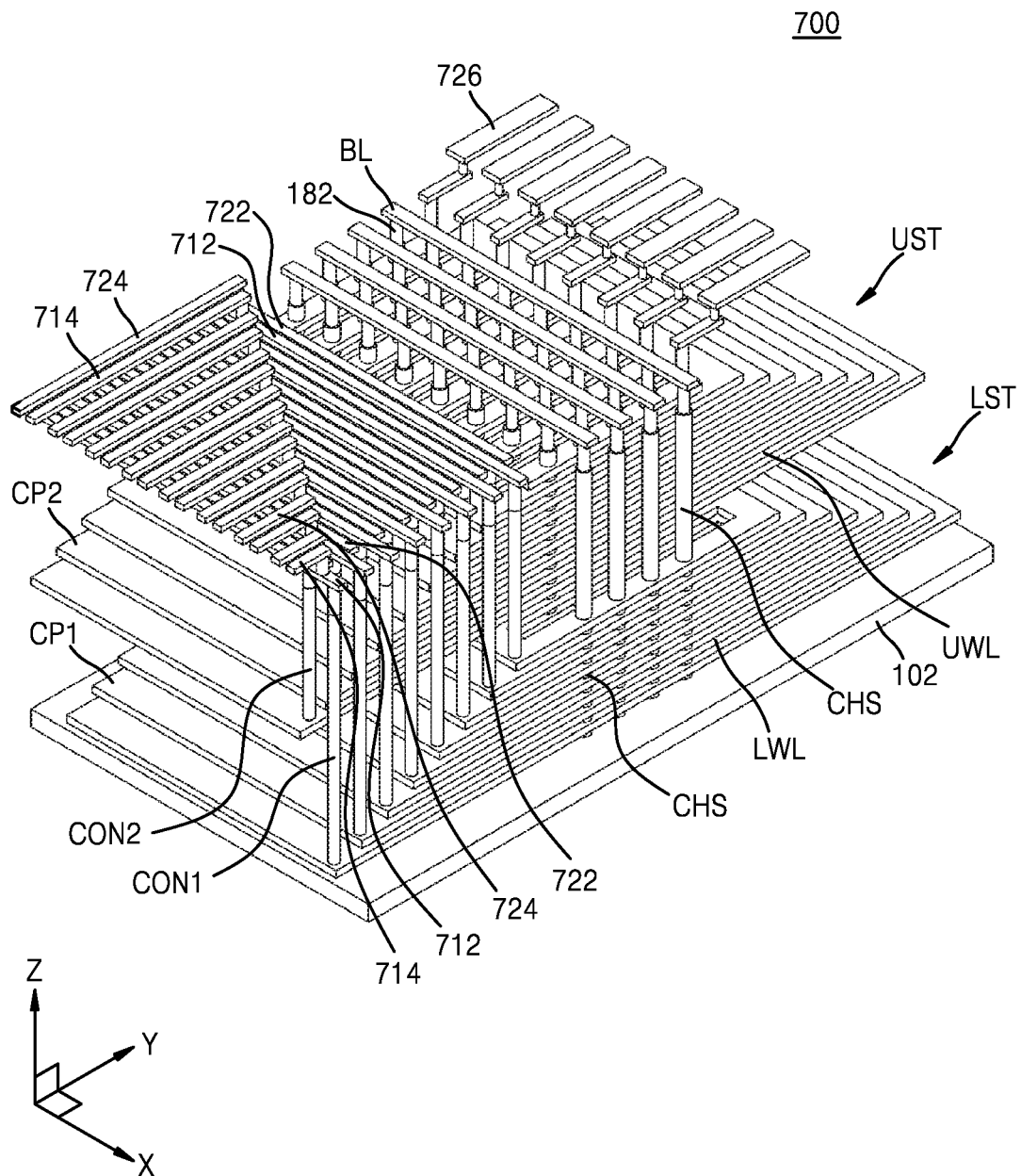
FIG. 31 is a schematic perspective view of an integrated circuit device according to some embodiments of the present inventive concept.

FIG. 31 is a schematic perspective view of an integrated circuit device 700 according to some embodiments of the present inventive concept. In FIG. 31, like reference numerals as in FIGS. 1 to 30B denote like elements, and detailed descriptions thereof are omitted.

Referring to FIG. 31, the integrated circuit device 700 may include the substrate 102, a lower stack LST including a plurality of lower word lines LWL stacked on the substrate 102 overlapping with each other in a vertical direction, an upper stack UST including a plurality of upper word lines UWL stacked on the lower stack LST overlapping with each other in the vertical direction.

The channel structures CHS may extend on the substrate 102 to penetrate the lower stack LST and the upper stack UST in the vertical direction. The channel structures CHS may be connected to the bit lines BL via the bit line contact pads 182. Each of the lower stack LST and the upper stack UST may have any one stack structure selected from among the stack structures ST illustrated in FIGS. 3 and 21. Each of the channel structures CHS may include any one channel structure selected from among the channel structures CHS illustrated in FIGS. 2, 3, and 21.

The width in the Y direction of each of the lower word lines LWL and each of the upper word lines UWL may decrease as it is located farther from the substrate 102. Accordingly, each of the lower stack LST and the upper stack UST may have a pyramid shape. Edge portions of each of the lower word lines LWL in the Y direction may be used as a lower contact pad CP1, and edge portions of each of the upper word lines UWL in the Y direction may be used as an upper contact pad CP2. Although FIG. 31 illustrates that both edge portions in the Y direction in the lower stack LST and the upper stack UST have a step structure, the present inventive concept is not limited thereto, and a direction in which the step structure is formed may be variously selected.

The lower word lines LWL may be electrically connected to a word line drive circuit (not shown) via a plurality of lower contacts CON1 in contact with the lower contact pad CP1 and a plurality of wirings 712 and 714 connected to the lower contacts CON1. The upper word lines UWL may electrically connected to the word line drive circuit (not shown) via a plurality of upper contacts CON2 in contact with the upper contact pad CP2 and a plurality of wirings 722 and 724 connected to the upper contacts CON2. Among the upper word lines UWL, at least one of the upper word lines UWL used as the string selection line SSL may be connected to a selection line drive circuit (not shown) via a plurality of wirings 726.

In the integrated circuit device 700, the lower stack LST and the upper stack UST overlapping with each other in the vertical direction are provided, and thus a degree of integration may be improved (e.g., may increase).

While the inventive concept has been particularly shown and described with reference to some embodiments thereof, it will be understood that various changes in form and details may be made therein without departing from the spirit and scope of the following claims.

What is claimed is:

1. An integrated circuit device comprising:
   a plurality of word line structures extending on a substrate in a horizontal direction that is parallel to a main surface of the substrate and overlapping with each other in a vertical direction that is perpendicular to the main surface of the substrate;
   a plurality of insulating films stacked alternately with the plurality of word line structures in the vertical direction and extending in the horizontal direction, wherein sides of the plurality of word line structures and sides of the plurality of insulating films define a side of a channel hole that extends through the plurality of word line structures and the plurality of insulating films;
   a blocking dielectric film extending on the side of the channel hole; and
   a plurality of charge storage films spaced apart from each other on the blocking dielectric film in the channel hole, and on the sides of the plurality of word line structures, respectively, each of the plurality of charge storage films comprising a first charge storage film and a second charge storage film sequentially stacked on a respective one of the sides of the plurality of word line structures,
   wherein a width of the second charge storage film in the horizontal direction is greater than a width of the first charge storage film in the horizontal direction,
   wherein the second charge storage film comprises a first surface facing the blocking dielectric film and a second surface opposite the first surface, and
   wherein the second surface of the second charge storage film comprises a recess in a middle portion thereof in the vertical direction.

2. The integrated circuit device of claim 1, wherein the side of each of the plurality of insulating films protrudes toward the blocking dielectric film beyond the side of each of the plurality of word line structures.

3. The integrated circuit device of claim 2, further comprising:
   a tunneling dielectric film on the blocking dielectric film and the plurality of charge storage films in the channel hole; and
   a channel film on the tunneling dielectric film,
   wherein a surface of the blocking dielectric film facing the channel film comprises a plurality of grooves respectively corresponding to the plurality of word line structures, and at least a part of each of the plurality of charge storage films is on the plurality of grooves of the blocking dielectric film.

4. The integrated circuit device of claim 1, wherein a height of the second charge storage film in the vertical direction is greater than a height of the first charge storage film in the vertical direction.

5. The integrated circuit device of claim 1, wherein a height of each of the plurality of charge storage films in the vertical direction is greater than a height of each of the plurality of word line structures in the vertical direction.

6. An integrated circuit device comprising:
   a plurality of word line structures extending on a substrate in a horizontal direction that is parallel to a main surface of the substrate and overlapping with each other in a vertical direction that is perpendicular to the main surface;
   a plurality of insulating films stacked alternately with the plurality of word line structures in the vertical direction and extending in the horizontal direction, wherein sides of the plurality of word line structures and sides of the plurality of insulating films define a side of a channel hole that extends through the plurality of word line structures and the plurality of insulating films;
   a channel film extending in the vertical direction in the channel hole;
   a blocking dielectric film in the channel hole and extending on the sides of the plurality of word line structures and the sides of the plurality of insulating films in the channel hole, the blocking dielectric film comprising a surface facing the channel film, and the surface comprising a plurality of grooves on the sides of the plurality of word line structures, respectively; and
   a plurality of charge storage films spaced apart from each other in the vertical direction, wherein each of the plurality of charge storage films comprises a first portion in a respective one of the plurality of grooves of the blocking dielectric film and a second portion protruding out of the respective one of the plurality of grooves of the blocking dielectric film.

7. The integrated circuit device of claim 6, wherein a surface of each of the plurality of charge storage films facing the channel film has a concave shape in a middle portion thereof.

8. The integrated circuit device of claim 7, wherein each of the plurality of charge storage films comprises:
   a first charge storage film in the respective one of the plurality of grooves; and
   a second charge storage film on the first charge storage film.

9. The integrated circuit device of claim 8, wherein a surface of the first charge storage film facing the channel film has a concave shape in a middle portion thereof.

10. The integrated circuit device of claim 8, wherein a surface of the first charge storage film facing the channel film has a flat shape.

11. The integrated circuit device of claim 8, wherein a surface of the second charge storage film facing the channel film has a concave shape in a middle portion thereof.

12. The integrated circuit device of claim 8, wherein a height of the second charge storage film in the vertical direction is greater than a height of the first charge storage film in the vertical direction.

13. An integrated circuit device comprising:
   a plurality of word line structures extending on a substrate in a horizontal direction that is parallel to a main surface of the substrate and overlapping with each other in a vertical direction that is perpendicular to the main surface;

a plurality of insulating films stacked alternately with the plurality of word line structures in the vertical direction and extending in the horizontal direction, wherein sides of the plurality of word line structures and sides of the plurality of insulating films define a side of a channel hole that extends through the plurality of word line structures and the plurality of insulating films;

a channel film extending in the vertical direction in the channel hole;

a blocking dielectric film extending on the sides of the plurality of word line structures and the sides of the plurality of insulating films in the channel hole;

at least one charge storage film on the blocking dielectric film in the channel hole; and a tunneling dielectric film extending on the blocking dielectric film and the at least one charge storage film in the channel hole, and the channel film extending on the tunneling dielectric film, wherein the side of each of the plurality of insulating films facing the channel film protrudes toward the channel film beyond the side of each of the plurality of word line structures, a surface of the blocking dielectric film facing the channel film comprises a plurality of grooves on the sides of the plurality of word line structures, respectively, and the at least one charge storage film comprises a first portion in one of the plurality of grooves of the blocking dielectric film and a second portion outside the one of the plurality of grooves of the blocking dielectric film.

14. The integrated circuit device of claim 13, wherein the at least one charge storage film comprises:
a first charge storage film in the one of the plurality of grooves; and
a second charge storage film on the first charge storage film.

15. The integrated circuit device of claim 14, wherein the first charge storage film comprises a recess in a middle portion thereof recessed relative to an upper portion and a lower portion of the first charge storage film.

16. The integrated circuit device of claim 14, wherein a side of the first charge storage film facing the channel film has a flat surface.

17. The integrated circuit device of claim 14, wherein the second charge storage film comprises a recess in a middle portion thereof recessed relative to an upper portion and a lower portion of the second charge storage film.

18. The integrated circuit device of claim 14, wherein the first charge storage film comprises at least two first charge storage films spaced apart from each other.

19. The integrated circuit device of claim 18, wherein the second charge storage film comprises at least two second charge storage films respectively on the at least two first charge storage films.

20. The integrated circuit device of claim 14, wherein an entirety of the first charge storage film is in the one of the plurality of grooves.

* * * * *